United States Patent
Matsuda

(10) Patent No.: US 9,952,390 B2
(45) Date of Patent: Apr. 24, 2018

(54) OPTICAL ELEMENT, OPTICAL MODULE, AND OPTICAL TRANSMISSION SYSTEM

(71) Applicant: FUJITSU LIMITED, Kawasaki-shi, Kanagawa (JP)

(72) Inventor: Manabu Matsuda, Atsugi (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/462,055

(22) Filed: Mar. 17, 2017

(65) Prior Publication Data
US 2017/0293085 A1  Oct. 12, 2017

(30) Foreign Application Priority Data
Apr. 7, 2016  (JP) .................. 2016-077515

(51) Int. Cl.
*G02B 6/34* (2006.01)
*G02B 6/42* (2006.01)
*G02B 5/18* (2006.01)

(52) U.S. Cl.
CPC ............ *G02B 6/34* (2013.01); *G02B 5/1819* (2013.01); *G02B 5/1861* (2013.01); *G02B 6/4214* (2013.01)

(58) Field of Classification Search
CPC ...... G02B 6/34; G02B 6/4214; G02B 5/1819; G02B 5/1861
See application file for complete search history.

(56) References Cited

U.S. PATENT DOCUMENTS

| 5,657,407 A * | 8/1997 | Li ................... G02B 6/124 372/102 |
| 2009/0092159 A1 | 4/2009 | Kato |
| 2011/0051772 A1 | 3/2011 | Fukuda |
| 2011/0090931 A1* | 4/2011 | Murata ................. B82Y 20/00 372/50.11 |
| 2013/0321900 A1* | 12/2013 | Vallius ............... H01S 5/02248 359/328 |

FOREIGN PATENT DOCUMENTS

| JP | 2004-241627 | 8/2004 |
| JP | 2009-059729 | 3/2009 |
| JP | 2011-049317 | 3/2011 |

OTHER PUBLICATIONS

Dug-Bong Kim et al., "Fabrication of Sidelobe-Suppressed InP—InGaAsP Vertical Coupler Optical Filter Using Pair Grating Structure", IEEE Photonics Technology Letters, vol. 10, No. 11, pp. 1593-1595 (3 pages), Nov. 1998.

\* cited by examiner

*Primary Examiner* — Ryan Lepisto
(74) *Attorney, Agent, or Firm* — Fujitsu Patent Center

(57) ABSTRACT

An optical element includes a distributed Bragg reflector, wherein the distributed Bragg reflector includes a first-order diffraction grating of a first-order period disposed in a central region, and second-order diffraction gratings of a second-order period having a coupling coefficient smaller than a coupling coefficient of the first-order diffraction grating and disposed in both end regions between which the central region is located.

10 Claims, 42 Drawing Sheets

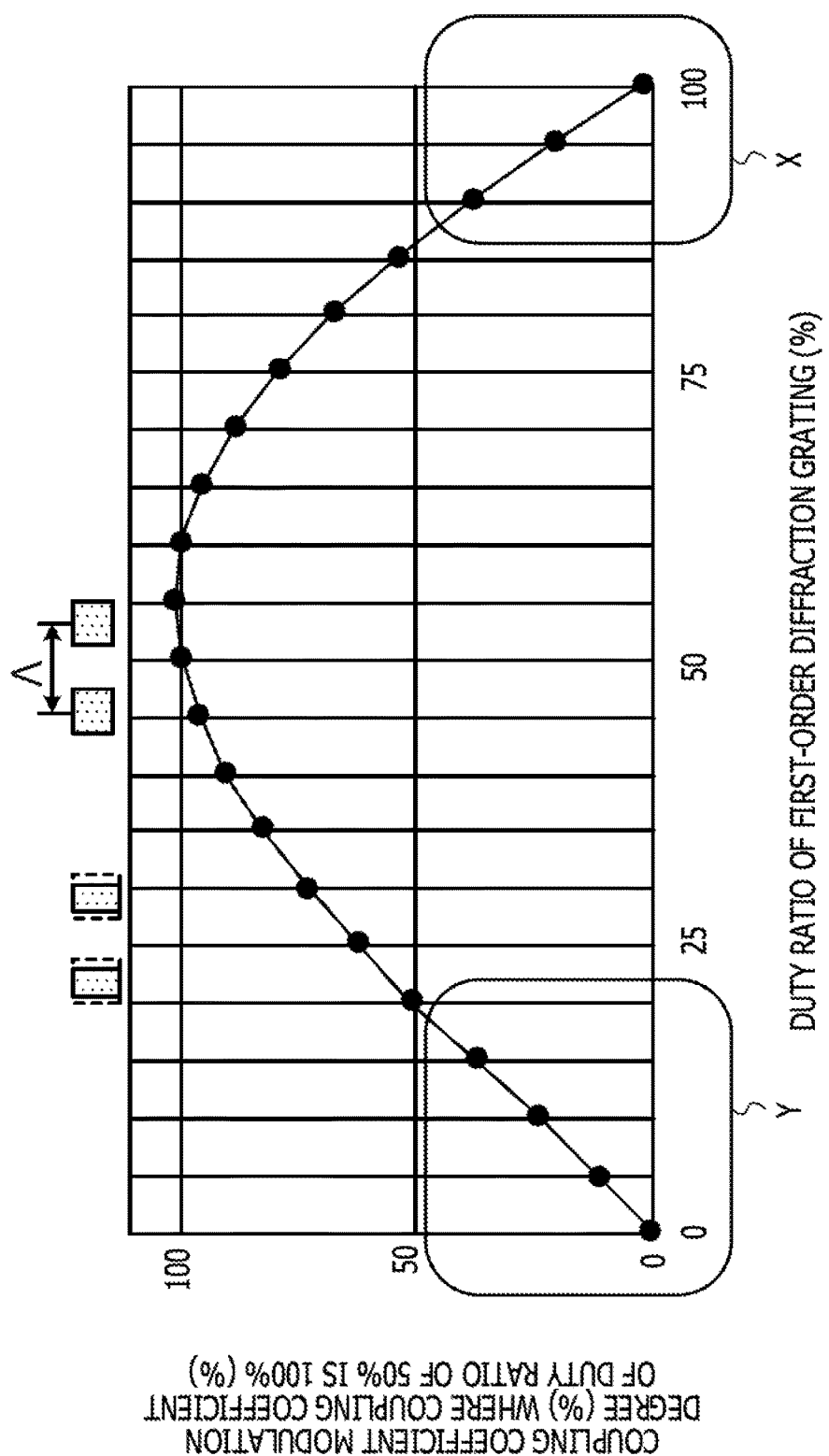

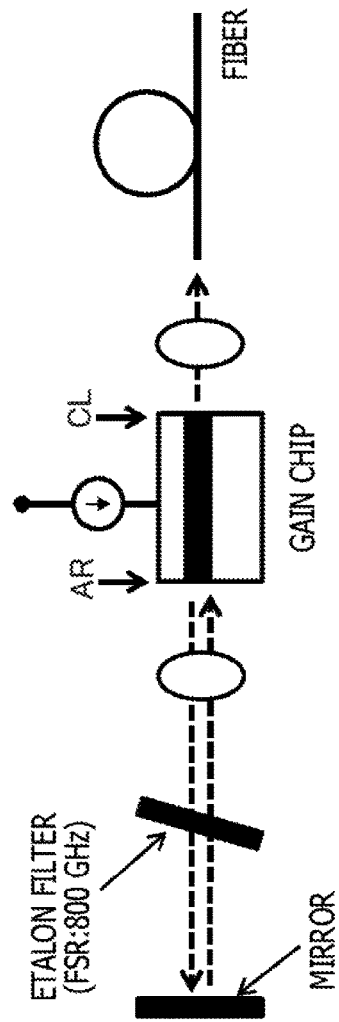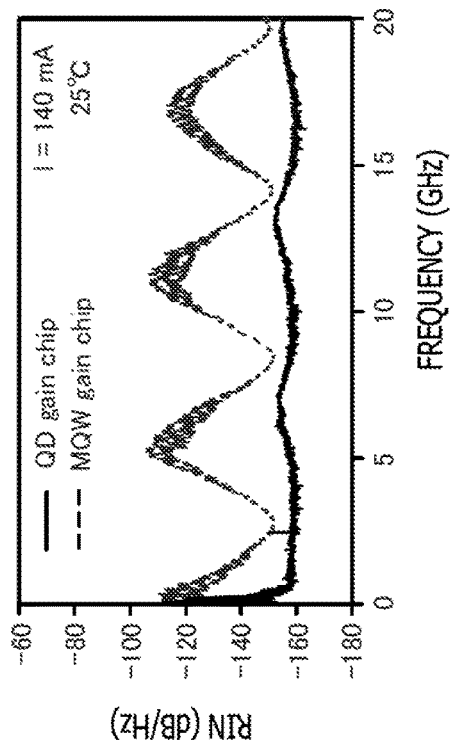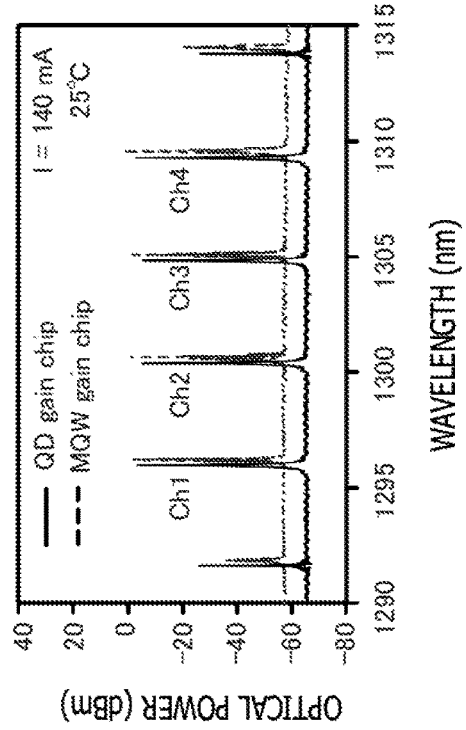
FIG. 13A
FIG. 13B
FIG. 13C

OPTICAL ELEMENT, OPTICAL MODULE, AND OPTICAL TRANSMISSION SYSTEM

CROSS-REFERENCE TO RELATED APPLICATION

This application is based upon and claims the benefit of priority of the prior Japanese Patent Application No. 2016-077515, filed on Apr. 7, 2016, the entire contents of which are incorporated herein by reference.

FIELD

The embodiment discussed herein is related to an optical element, an optical module, and an optical transmission system.

BACKGROUND

Among conventional semiconductor light emitting elements capable of tuning a laser oscillation wavelength, there is, for example, a semiconductor light emitting element in which a laser cavity is formed of a reflection edge and an optical reflector including, for example, a chirped diffraction grating and electrodes.

Moreover, among semiconductor lasers, there is, for example, a semiconductor laser which includes a front DFB region and a back DFB region or a DBR region and which includes low-reflectivity film on both edges.

Furthermore, among semiconductor laser devices, there is, for example, a semiconductor laser device which includes a wavelength monitoring region and a semiconductor laser region having a gain region, a DBR region, and an amplifying region and which includes an anti-reflection film on an output edge of the semiconductor laser region.

For example, among optical modules used in an optical transmission system, there is an optical module including a wavelength tunable laser, a multi-wavelength light source, and the like.

In order for such an optical module to increase a side mode suppression ratio of an oscillation mode and achieve the stability of the oscillation mode, the optical element may be equipped with a distributed Bragg reflector (DBR mirror) in a band pass filter form instead of an edge reflector mirror. The DBR mirror has reflectivity which is flat and definite in a used region and which decreases sharply outside the used region.

The DBR mirror in the band pass filter form described above can achieve a filter form to some extent by using a diffraction grating which has a fixed coupling coefficient and a first-order periodic structure where the period is chirped (gradually varied).

However, even though the period of the diffraction grating is simply chirped, a region with a reflectivity of about 30% has several percent of ripples, so that a gain difference between a selected mode and a side mode may not be obtained in mode selection.

As a method of removing the unnecessary ripples, it is conceivable to use a diffraction grating in which: the DBR region is divided into segments; the diffraction grating period is varied substantially linearly across these segments; and the coupling coefficient gradually decreases from the maximum value to zero in directions toward both ends of the DBR region.

A substantially flat reflection characteristic in which ripples are theoretically suppressed is thereby obtained.

In this case, a conceivable method for reducing the coupling coefficient to zero is varying the duty ratio of a diffraction grating of a first-order period from 50% to 100% or from 50% to 0%.

However, when the duty ratio of the diffraction grating of the first-order period is varied from 50% to 100% or from 50% to 0% to reduce the coupling coefficient to zero, the width in the diffraction grating (width of the ridge of the diffraction grating) is gradually reduced or increased.

Accordingly, as the coupling coefficient becomes closer to zero, the diffraction grating becomes more difficult to form by etching, or more likely to be deformed or disappear.

This causes variation in equivalent index, and the reflection characteristic is deviated from the designed characteristic.

The following are reference documents.
[Document 1] Japanese Laid-open Patent Publication No. 2009-59729,
[Document 2] Japanese Laid-open Patent Publication No.2004-241627,
[Document 3] Japanese Laid-open Patent Publication No.2011-49317 and
[Document 4] Dug-Bong Kim et al., "Fabrication of Side-lobe-Suppressed InP—InGaAsP Vertical Coupler Optical Filter Using Pair Grating Structure", IEEE PHOTONICS TECHNOLOGY LETTERS, VOL. 10, NO. 11, pp. 1593-1595, NOV. 1998.

SUMMARY

According to an aspect of the invention, an optical element includes: a distributed Bragg reflector, wherein the distributed Bragg reflector includes a first-order diffraction grating of a first-order period disposed in a central region, and second-order diffraction gratings of a second-order period having a coupling coefficient smaller than a coupling coefficient of the first-order diffraction grating and disposed in both end regions between which the central region is located.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram illustrating relationships between the coupling coefficient and the duty ratio of the first-order diffraction grating forming the distributed Bragg reflector included in the optical element of the embodiment;

FIG. 13A is a schematic diagram illustrating a configuration of a multiple wavelength light source in which a gain chip and an etalon are combined, FIG. 13B is a diagram illustrating relationships between a wavelength and optical power of a quantum dot gain chip and a quantum well gain chip, and FIG. 13C is a diagram illustrating relationships between frequency and relative intensity noise (RIN) of the quantum dot gain chip and the quantum well gain chip;

DESCRIPTION OF EMBODIMENT

Hereinafter, an optical element, an optical module, and an optical transmission system in an embodiment of the present disclosure are described below with reference to FIGS. 1 to 42.

The optical module in the embodiment is used in, for example, the optical transmission system and includes, for example, a wavelength tunable laser, a multi-wavelength light source, or the like.

Moreover, the optical element of the embodiment includes a distributed Bragg reflector.

Specifically, in the embodiment, in the aforementioned optical element included in the optical module, there is installed, instead of an edge reflection mirror, a band pass filter form distributed Bragg reflector having reflectivity which is flat and definite in a used wavelength band and which sharply decreases outside the used wavelength band, to increase a side mode suppression ratio of an oscillation mode and secure stability in the oscillation mode.

Note that, the distributed Bragg reflector is also referred to as DBR or DBR mirror. Moreover, in the case where the optical element is made of a semiconductor material, the optical element is also referred to as semiconductor element, optical semiconductor element, or optical semiconductor device.

Figure 1:
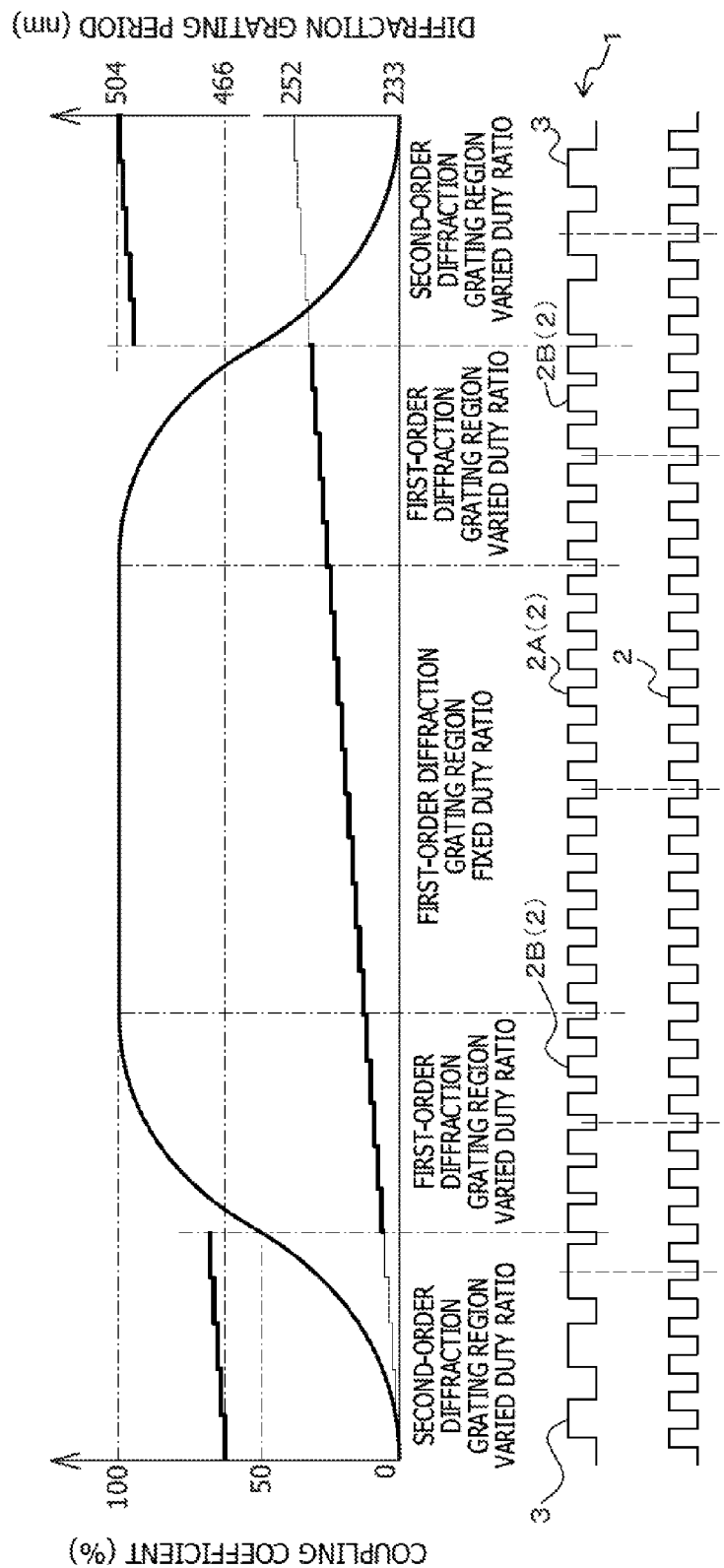
FIG. 1 is a diagram for explaining a configuration of a distributed Bragg reflector included in an optical element of an embodiment.

In the embodiment, as illustrated in FIG. 1, the distributed Bragg reflector 1 includes a first-order diffraction grating 2 of a first-order period disposed in a central region, and second-order diffraction gratings 3 of a second-order period having a coupling coefficient smaller than a coupling coefficient of the first-order diffraction grating and disposed in both end regions between which the central region is located. In other words, the optical element of the embodiment is an element with diffraction gratings.

Moreover, in the first-order diffraction grating 2 and the second-order diffraction gratings 3, it is assumed that the periods are varied to become longer or to become shorter in a light propagation direction. Note that the period is also referred to as diffraction grating period.

In this case, in the first-order diffraction grating 2 and the second-order diffraction gratings 3, the periods may be varied continuously or stepwise. Note that FIG. 1 depicts an example in which the period is varied stepwise.

As described above, in the embodiment, the period is varied in the light propagation direction in a region provided with the distributed Bragg reflector 1. Moreover, the coupling coefficient in the diffraction gratings in both end regions is smaller than the coupling coefficient in the diffraction grating in the central region, and the second-order diffraction gratings 3 of the second-order period are used as the diffraction gratings in these regions where the coupling coefficient is smaller.

Specifically, the periods of the diffraction gratings are chirped to achieve the band pass filter form distributed Bragg reflector 1 having reflectivity which is flat and definite in the used wavelength band and which sharply decreases outside the used wavelength band.

Moreover, in order to remove unnecessary ripples, the DBR region is divided into, for example, 46 segments, the diffraction grating period in the segments is varied substantially linearly, and the coupling coefficient is gently decreased from the maximum value (for example, about 250 cm$^{-1}$) to zero in directions toward both ends.

For example, when the reflectivity of about 30% in a wavelength band from about 1520 nm to about 1570 nm in the C-band is desired, it is preferable to use an embedded diffraction grating to obtain large coupling coefficient of about 250 cm$^{-1}$.

In this case, the diffraction grating has a large thickness of about 100 nm and has a period about 240 nm. Accordingly, the width of the ridge of the diffraction grating is about 120 nm at a point of the peak value of the coupling coefficient which is about 250 cm$^{-1}$, and is gradually increased or decreased from 120 nm.

However, as the coupling coefficient becomes closer to zero, that is, when the width of the ridge of the diffraction grating is increased (see the region denoted by the reference sign X in FIG. 4), an opening becomes smaller and problems in etching occur. Meanwhile, when the width of the ridge of the diffraction grating is decreased (see the region denoted by the reference sign Y in FIG. 4), there may be manufacturing troubles such as deformation and disappearance of the diffraction grating in embedding growth after the etching.

Moreover, the decrease or increase of the width of the ridge of the diffraction grating causes gradual variation of the equivalent index, and the reflection characteristic deviates from the designed characteristic.

In view of this, the second-order diffraction gratings 3 are used as the diffraction gratings in the regions where the coupling coefficient is small.

In the embodiment, the second-order diffraction gratings 3 of the second-order period are used as the diffraction gratings in the regions where the coupling coefficient is set equal to or lower than about 50% of the maximum value of the coupling coefficient in the first-order diffraction grating 2. In other words, the second-order diffraction gratings 3 have the coupling coefficient equal to or lower than about 50% of the maximum value of the coupling coefficient in the first-order diffraction grating 2. Note that the value of the coupling coefficient in the first-order diffraction grating 2 with the duty ratio of 50% is assumed to be 100% and is assumed to be the maximum value of the coupling coefficient in the first-order diffraction grating 2.

Due to this design, it is possible to facilitate formation of the diffraction gratings included in the distributed Bragg reflector 1, and obtain the reflection characteristic as designed.

Particularly, in the case where the first-order diffraction grating 2 is formed in the region where the coupling coefficient is to be set equal to or lower than about 50% of the maximum value of the coupling coefficient in the first-order diffraction grating 2, the etching of the diffraction grating is difficult or the deformation, disappearance, and the like of the diffraction grating occurs. Meanwhile, in the case where the second-order diffraction grating 3 is formed in this region, it is possible to facilitate formation of the diffraction grating and obtain the reflection characteristic as designed.

As described above, the diffraction grating which is easy to manufacture is applied depending on the value of the coupling coefficient of the diffraction grating, and the diffraction grating to be applied is switched from one diffraction grating to another.

For example, when a large coupling coefficient is desired in the case where the period of the first-order diffraction grating is about 200 nm to about 240 nm, the height (depth) of the diffraction grating is set to about 100 nm or more. For example, in the diffraction grating having a shape with a duty ratio of about 5%, the ridge has an aspect ratio of 10:1, that is, the size of about 100 nm in height and 10 nm in width.

It is very difficult to form a first-order diffraction grating with such fine design by using etching. Moreover, in the case of fabricating an embedded diffraction grating, it is difficult to fabricate the embedded diffraction grating while suppressing deformation, disappearance, and the like in embedding re-growth.

In view of this, the second-order diffraction gratings 3 are used as the diffraction gratings in the regions where the coupling coefficient is small as described above, and the formation of the diffraction gratings is facilitated.

In this case, the diffraction grating 2 of the first-order period is a diffraction grating having first-order diffraction characteristics, and the diffraction gratings 3 of the second-order period are diffraction grating having second-order diffraction characteristics. Moreover, the diffraction gratings 3 of the second-order period are diffraction gratings having a period twice as long as the period of the diffraction grating 2 of the first-order period.

Note that the diffraction grating of the first-order period, that is, the diffraction grating with the first-order diffraction characteristics is also referred to as first-order diffraction grating, and the diffraction grating of the second-order period, that is the diffraction grating with the second-order diffraction characteristics is also referred to as second-order diffraction grating.

Figure 2:
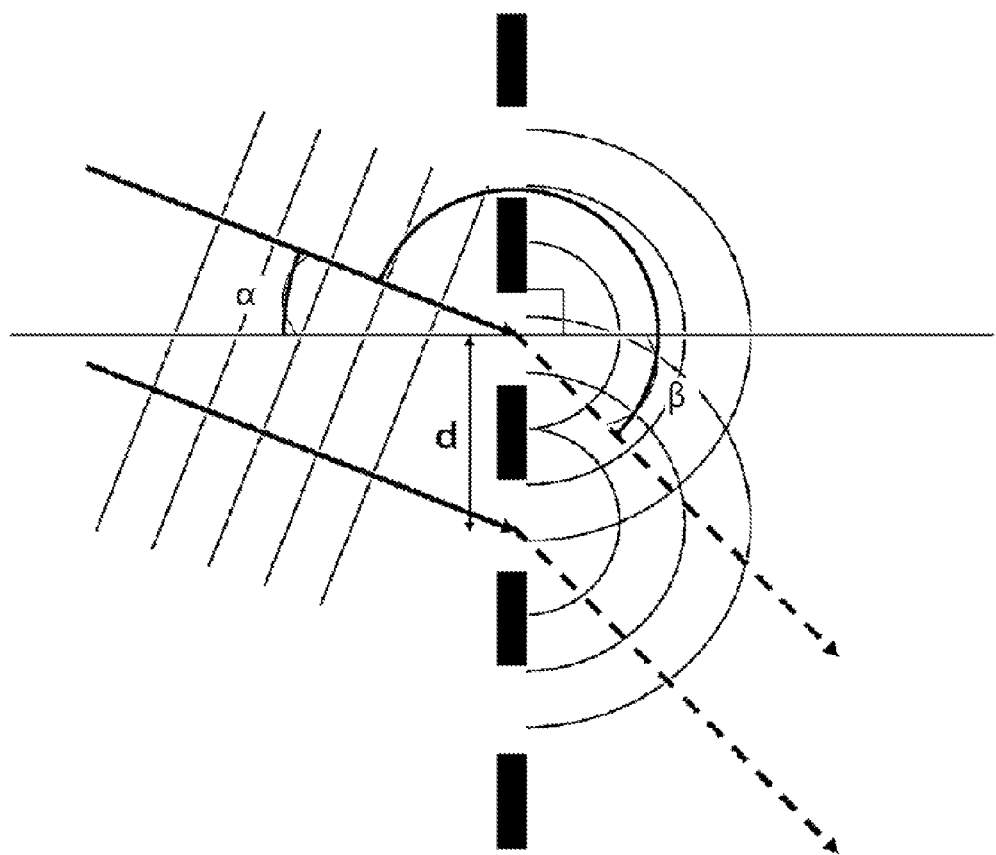
FIG. 2 is a diagram for explaining diffraction by a first-order diffraction grating and second-order diffraction gratings forming the distributed Bragg reflector included in the optical element of the embodiment.

When the grating period is denoted by d, the wavelength is denoted by $\lambda$, the incidence angle is denoted by $\alpha$, and the emergence angle is denoted by $\beta$ as illustrated in FIG. 2, generally, $d \sin \alpha - d \sin \beta = n\lambda$ is satisfied by using an integer n. In this case, n is the diffraction order number and $n=0, \pm 1, \pm 2$.

In a DFB laser or a DBR waveguide, when the diffraction grating period is denoted by $\Lambda$ and the equivalent index of the waveguide is denoted by $n_{eq}$, $\Lambda \sin \alpha - \Lambda \sin \beta = n\lambda/n_{eq}$.

Figure 3A:
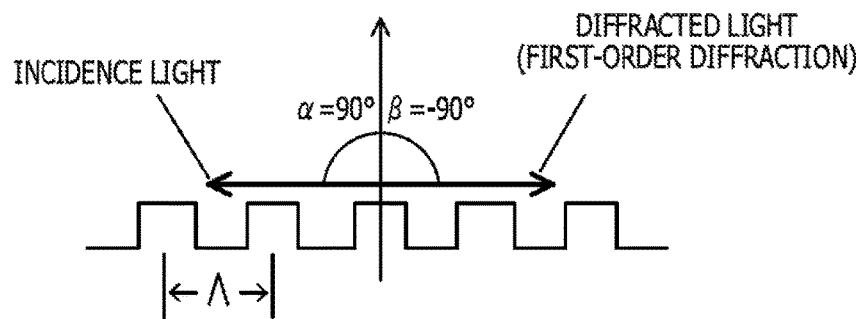
FIGS. 3A to 3C are diagrams for explaining the diffraction by the first-order diffraction grating and the second-order diffraction gratings forming the distributed Bragg reflector included in the optical element of the embodiment.

As illustrated in FIG. 3A, in the diffraction grating of the first-order period, the diffraction order number n is 1, the angle $\alpha$ is 90°, and the angle $\beta$ is −90°. Hence, $\Lambda \times 1 - \Lambda \times (-1) = 2\Lambda = 1 \times \lambda/n_{eq}$.

Accordingly, there is a relationship of $\lambda = 2n_{eq}\Lambda$, that is, $\Lambda = \lambda/2n_{eq}$.

For example, when $\lambda = 1550$ nm and $n_{eq} = 3.2$, the period of the first-order diffraction grating is $\Lambda = 242$ nm.

Figure 3B:
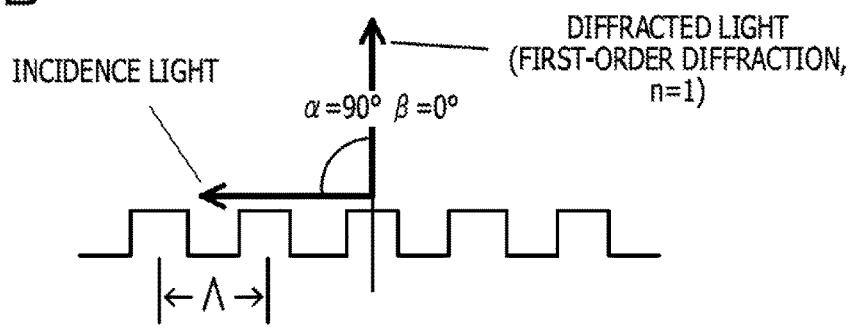

Meanwhile, as illustrated in FIG. 3B, in the diffraction grating of the second-order period, the diffraction order number n of light diffracted i an up-down direction of the waveguide is 1, the angle $\alpha$ is 90°, and the angle $\beta$ is 0°. Hence, $\Lambda \times 1 - \Lambda \times 0 = \Lambda = 1 \times \lambda/n_{eq}$.

Accordingly, there is a relationship of $\lambda = n_{eq}\Lambda$, that is, $\Lambda = \lambda/n_{eq}$.

Figure 3C:
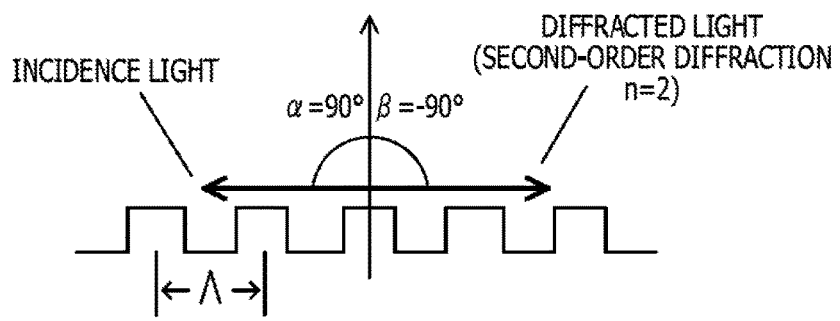

Similarly, as illustrated in FIG. 3C, the diffraction order number n of light diffracted in a direction directly opposite to the incidence light along the waveguide is 2, the angle $\alpha$ is 90°, and the angle $\beta$ is −90°. Hence, $\Lambda \times 1 - \Lambda \times (-1) = 2\Lambda = 2 \times \lambda/n_{eq}$.

Accordingly, also in this case, there is a relationship of $\lambda = n_{eq}\Lambda$, that is, $\Lambda = \lambda/n_{eq}$.

For example, when $\lambda = 1550$ nm and $n_{eq} = 3.2$, the period of the second-order diffraction grating is $\Lambda = 484$ nm which is twice the period of the first-order diffraction grating.

In view of the principles described above, when the second-order diffraction gratings 3 with the period twice as long as that of the first-order diffraction grating 2 are disposed in both end regions between which the first-order diffraction grating 2 disposed in the central region is located as in the embodiment, light of a wavelength diffracted in the directly-opposite direction by the first-order diffraction grating 2 having a certain period is similarly diffracted in the directly-opposite direction by the second-order diffraction gratings 3 having a period twice as long as the certain period, although at different diffraction intensity.

Accordingly, when the second-order diffraction gratings 3 are used as in the embodiment, the periods of the diffraction gratings are varied substantially linearly to become longer or to become shorter in the light propagation direction, as in the case of using only the first-order diffraction grating 2.

Moreover, in the embodiment, as illustrated in FIG. 1, the coupling coefficient takes its maximum value in the diffractive grating provided in the central region, and decreases in the directions toward both ends to reach zero in the diffraction gratings provided at both ends.

Specifically, the first-order diffraction grating 2 is designed such that the coupling coefficient decreases in directions from the center toward both ends of the central region, and the second-order diffraction gratings 3 are designed such that the coupling coefficient decreases in directions away from the central region, in both end regions.

More specifically, the first-order diffraction grating 2 is designed such that the coupling coefficient decreases from its maximum value to 50% of the maximum value in the directions from the center toward both ends of the central region, and the second-order diffraction gratings 3 are designed such that the coupling coefficient decreases from 50% of the maximum value of the coupling coefficient in the first-order diffraction grating 2 to zero, in the directions away from the central region, in both end regions.

Moreover, in the embodiment, in order to facilitate fabrication of the first-order diffraction grating 2 and the second-order diffraction gratings 3 in which the relationship of the coupling coefficient are as described above while suppressing the cost, these diffraction gratings are configured to have the same depth (height) with the duty ratio being varied. In other words, the coupling coefficient is modulated by varying the duty ratio, that is, the width of the diffraction grating.

In the embodiment, the first-order diffraction grating 2 thus includes a first diffraction grating 2A of a first-order period which is disposed in a center portion of the central region and which is formed to have a duty ratio at which the coupling coefficient takes the maximum value, and second diffraction gratings 2B of a first-order period which are disposed in both end portions of the central region and in which the duty ratio is varied such that the coupling coefficient decreases in directions from the first diffraction grating 2A toward the second-order diffraction gratings 3.

In this case, the portion of the central region in which the first diffraction grating 2A is disposed is a coupling coefficient fixed region in which the coupling coefficient is fixed at the maximum value, and the portions of the central region in which the second diffraction gratings 2B are provided are coupling coefficient varied regions in which the coupling coefficient is varied.

Specifically, the first-order diffraction grating 2 is a diffraction grating of a first-order period in which the duty ratio is varied from about 50% to about 85% such that the coupling coefficient decreases from the maximum value to 50% of the maximum value, in the directions from the center toward both ends of the central region (see FIG. 4).

Specifically, the first-order diffraction grating 2 includes the first diffraction grating 2A of the first-order period which is provided in the center portion of the central region and which is formed to have a duty ratio of about 50% at which the coupling coefficient takes the maximum value, and the second diffraction gratings 2B of the first-order period which is provided in both end portions of the central region and in which the duty ratio is varied from about 50% to about 85% such that the coupling coefficient decreases, in the directions from the first diffraction grating 2A toward the second-order diffraction gratings 3.

Note that the first-order diffraction grating 2 is not limited to this configuration and may be a diffraction grating of a first-order period in which the duty ratio is varied from about 50% to about 20% such that the coupling coefficient decreases from the maximum value to 50% of the maximum value, in the directions from the center toward both ends of the central region (see FIG. 4).

Accordingly, in the first-order diffraction grating 2, the duty ratio only requests to be within a range of about 20% to 85% (see FIG. 4). Specifically, in the first-order diffraction grating 2, the width of a portion with high refractive index only requests to be within a range of about 20% to about 85% of the diffraction grating period.

However, the first-order diffraction grating 2 is preferably the diffraction grating of a first-order period in which the duty ratio is varied from about 50% to about 85% such that the coupling coefficient decreases from the maximum value to 50% of the maximum value, in the directions from the center toward both ends of the central region (see FIG. 4).

This is due to the following reasons.

In the embodiment, the first-order diffraction grating 2 is connected to the second-order diffraction gratings 3. Accordingly, it is preferable that the values of equivalent index (average refractive index of light) respectively in the first-order diffraction grating 2 and the second-order diffraction gratings 3 are substantially the same.

This is because, when there is a large difference in the equivalent index at a connection point, the connection point becomes a reflection point and causes disturbance in flatness of reflection spectrum of the DBR.

Note that, in the regions where the first-order diffraction grating 2 and the second-order diffraction gratings 3 are disposed, the variation in the value of the equivalent index between segments where the duty ratio is gradually varied is not great enough to disturb the flatness of the reflection spectrum of the DBR.

Moreover, as described later, the second-order diffraction gratings 3 are preferably used in regions where the duty ratio is greater than 50% (specifically, regions where the duty ratio is from about 75% to about 50%; see FIG. 5). Furthermore, the duty ratio of the second-order diffraction gratings 3 at points where the value of the coupling coefficient is 50% of the maximum value of the coupling coefficient in the first-order diffraction grating 2 is about 75%.

Accordingly, the duty ratio of the first-order diffraction grating 2 at points where the diffraction grating structure is switched (points where the first-order diffraction grating 2 and the second-order diffraction gratings 3 are connected), that is, the duty ratio of the first-order diffraction grating 2 at the points connected to the second-order diffraction gratings 3 is also preferably, about 75%.

Thus, as described above, the first-order diffraction grating 2 is the diffraction grating of the first-order period in which the duty ratio is varied from about 50% to about 85% in the directions from the center toward both ends of the central region.

The variation in the equivalent index at each connection point is thereby suppressed to minimum, and the flatness of the reflection spectrum of the DBR is not disturbed.

Moreover, in the embodiment, the second-order diffraction gratings 3 are each a diffraction grating of a second-order period in which the duty ratio is varied such that the coupling coefficient decreases in the direction away from the first-order diffraction grating 2.

In this case, both end regions are the coupling coefficient varied regions in which the coupling coefficient is varied.

Figure 5:
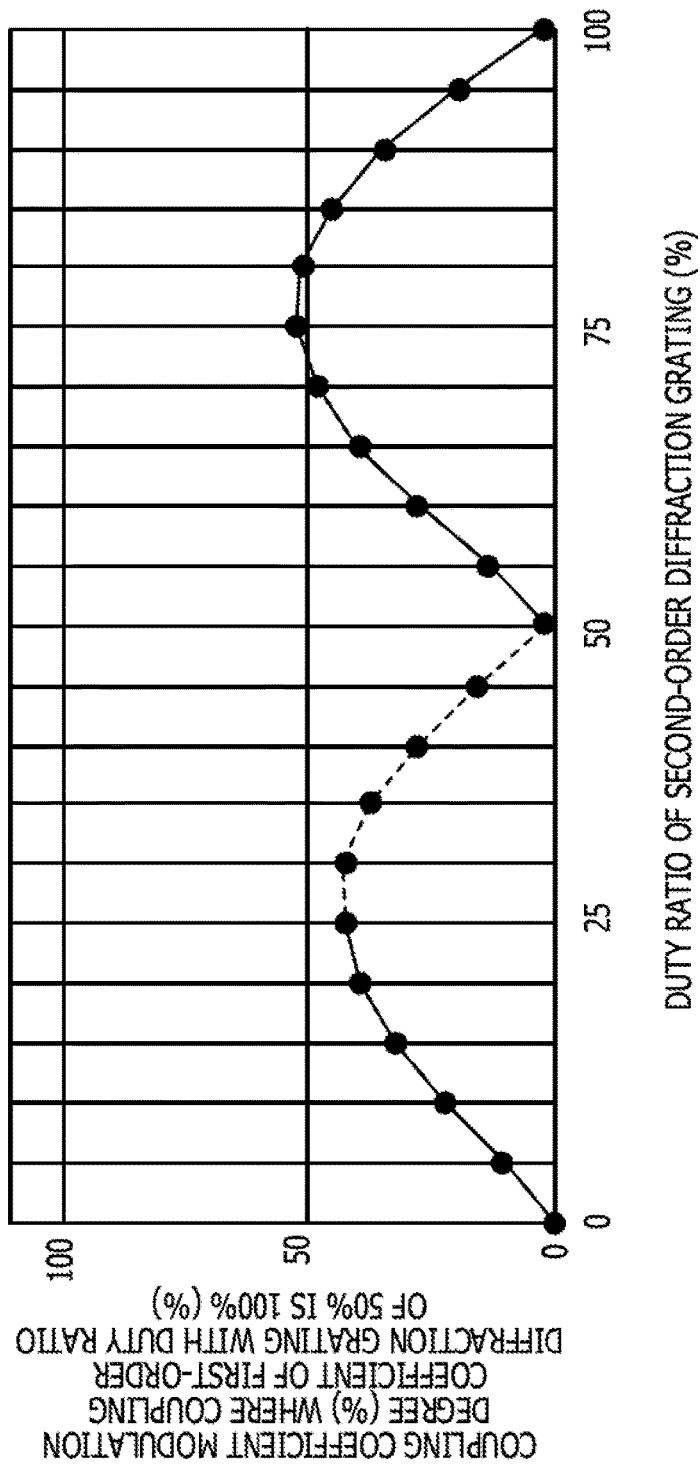
FIG. 5 is a diagram illustrating relationships between the duty ratio and the coupling coefficient κ, relative to the first-order diffraction grating, of the second-order diffraction gratings forming the distributed Bragg reflector included in the optical element of the embodiment.

Specifically, the second-order diffraction gratings 3 are each a diffraction grating of a second-order period in which the duty ratio is varied from about 75% to about 50% such that the coupling coefficient decreases from 50% of the maximum value of the coupling coefficient in the first-order diffraction grating 2 to zero, in the direction away from the first-order diffraction grating 2 (see FIG. 5).

Note that the second-order diffraction gratings 3 are not limited to this configuration may each be a diffraction grating of a second-order period in which the duty ratio is varied from about 25% to about 50% such that the coupling coefficient decreases from 50% of the maximum value of the coupling coefficient in the first-order diffraction grating 2 to zero, in the direction away from the first-order diffraction grating 2 (see FIG. 5).

Accordingly, in the second-order diffraction gratings 3, the duty ratio only requests to be within a range of about 25% to 75%. Specifically, in the second-order diffraction gratings 3, the width of a portion with high refractive index only requests to be is within a range of about 25% to about 75% of the diffraction grating period.

Note that, in the second-order diffraction gratings 3, the value of the coupling coefficient is zero at points where the duty ratio is 50%, and is about 50% of the maximum value of the coupling coefficient in the first-order diffraction grating at points where the duty ratio is 25% and 75%.

However, the second-order diffraction gratings 3 are each preferably the diffraction grating of the second-order period in which the duty ratio is varied from about 75% to about 50% such that the coupling coefficient decreases from 50% of the maximum value of the coupling coefficient in the first-order diffraction grating 2 to zero, in the direction away from the first-order diffraction grating 2 (see FIG. 5).

This is due to the following reasons.

A Fourier component corresponding to a first-order period of a diffraction grating of a second-order period which diffracts light of a certain wavelength is considered.

Note that, in each of FIGS. 6A to 6D, the shape of a second-order diffraction grating in which the widths of ridges of the diffraction grating vary is reproduced not by performing simple addition but by multiplying a certain coefficient to each of components and adding up the resultant components.

Figure 6B:
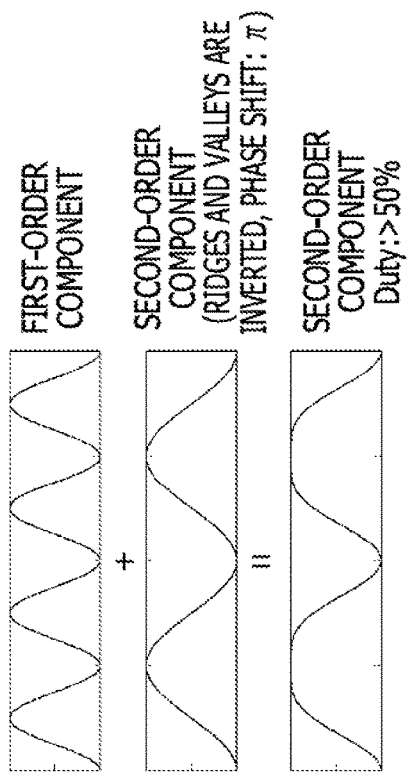
FIGS. 6A to 6D are diagrams for explaining the duty ratio of the second-order diffraction gratings forming the distributed Bragg reflector included in the optical element of the embodiment.
Figure 6D:
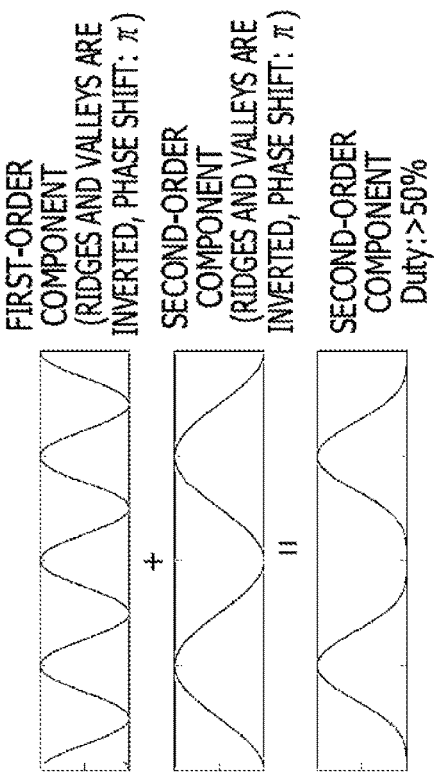
Figure 6A:
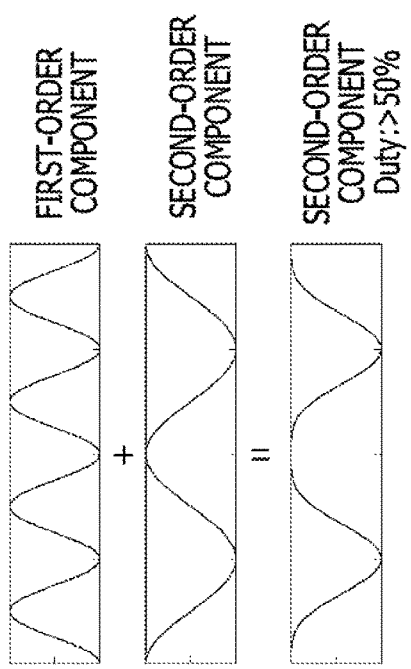

First, in a diffraction grating of a second-order period in which the duty ratio is greater than 50% (the width of the ridge is large), when any of valley portions of a first-order component matches a valley portion of the second-order components as illustrated in FIGS. 6A and 6B, a component having the same phase relationship as that in the case where there is a first-order diffraction grating in that place exists as a component (first-order component) of the second-order diffraction grating which diffracts the incidence light in the directly-opposite direction, regardless of presence or absence of phase shift of a second-order component (component diffracting the light in the up-down direction).

Accordingly, when a first-order diffraction grating is connected to the end of this second-order diffraction grating, no phase shift occurs between the second-order diffraction grating and the first-order diffraction grating.

Hence, it is possible suppress disturbance of the flatness of the reflection spectrum of the DBR. Moreover, for example, when patterning is performed by using electron beam exposure, it is possible to perform exposure of the portion of the second-order diffraction grating simply by omitting formation of every other exposure pattern of the first-order diffraction grating.

Figure 6C:
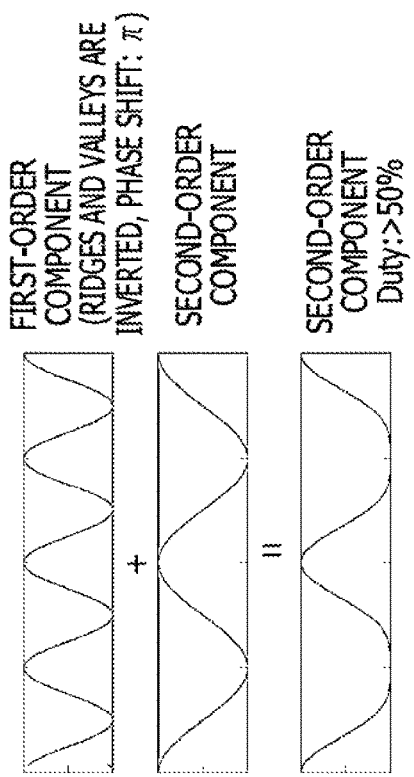

Meanwhile, in a diffraction grating of a second-order period in which the duty ratio is smaller than 50% (the width of the ridge is small), the shape of the second-order diffraction grating in which the duty ratio is smaller than 50% is not obtained unless any of peak portions of a first-order component matches a peak portion of a second-order component as illustrated in FIGS. 6C and 6D.

In this case, a component having a phase relationship phase-shifted by $\pi$ from the case where there is a first-order diffraction grating in that place exists as a component (first-order component) of the second-order diffraction grating which diffracts the incidence light in the directly-opposite direction, regardless of presence or absence of phase shift of a second-order component (component diffracting the light in the up-down direction).

Accordingly, when a first-order diffraction grating is connected to the end of this second-order diffraction grating, a phase shift of π radiant occurs between the second-order diffraction grating and the first-order diffraction grating.

Hence, the flatness of the reflection spectrum of the DBR is disturbed. Moreover, in the case of using this structure (duty ratio <50%), the structure have to be formed while being shifted in a waveguide direction by half the period of the first-order diffraction grating so as to remove the phase shift, and work increases, for example, when pattering is performed by using electron beam exposure.

Accordingly, as described above, the second-order diffraction gratings 3 are each the diffraction grating of the second-order period in which the duty ratio is varied from about 75% to about 50% in the direction away from the first-order diffraction grating 2.

Since this suppresses the phase shift to minimum, the flatness of the reflection spectrum of the DBR is not disturbed.

Moreover, in the embodiment, the second-order diffraction gratings 3 are preferably disposed such that the center point of the second-order diffraction grating 3 matches the center point of a diffraction grating interval in the imaginary diffraction grating 2 of the first-order period that is assumed to be formed over the entire region of the distributed Bragg reflector 1 (see the diffraction grating 2 on the lower side in FIG. 1) (see dotted lines in FIG. 1).

Specifically, in the second-order diffraction gratings 3, it is preferable that the center point of each of portions where the refractive index is high matches the center point of the corresponding interval in the imaginary diffraction grating 2 of the first-order period that is assumed to be expanded to the aforementioned portion of the second-order diffraction grating.

More specifically, in the region of each second-order diffraction grating 3, it is preferable that the center of each ridge in the diffraction grating 3 of the second-order period matches the center of the corresponding groove in the imaginary diffraction grating 2 of the first-order period that is assumed to be expanded to the region of the second-order diffraction grating 3 at the consecutive phase.

This may suppress the occurrence of the phase shift at the connection point of the diffraction gratings with different structures in the respective regions and avoid decrease in the flatness of the reflection characteristic.

Note that, although the first-order diffraction grating 2 includes the second diffraction gratings 2B of the first-order period in which the duty ratio is varied such that the coupling coefficient decreases in the directions from the first diffraction grating 2A toward the second-order diffraction gratings 3, the first-order diffraction grating 2 is not limited to this design.

Figure 7:
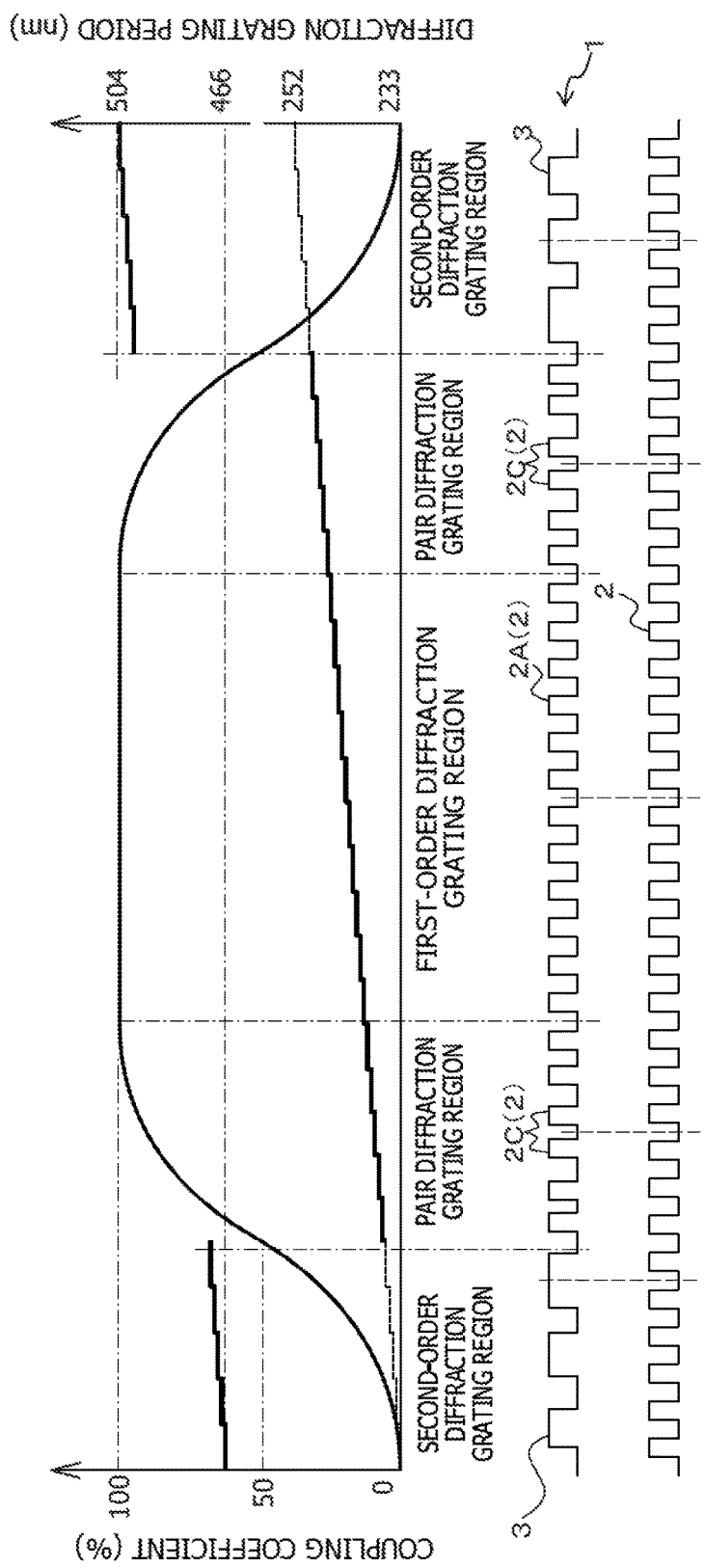
FIG. 7 is a diagram for explaining another configuration of the distributed Bragg reflector included in the optical element of the embodiment.
Figure 8:
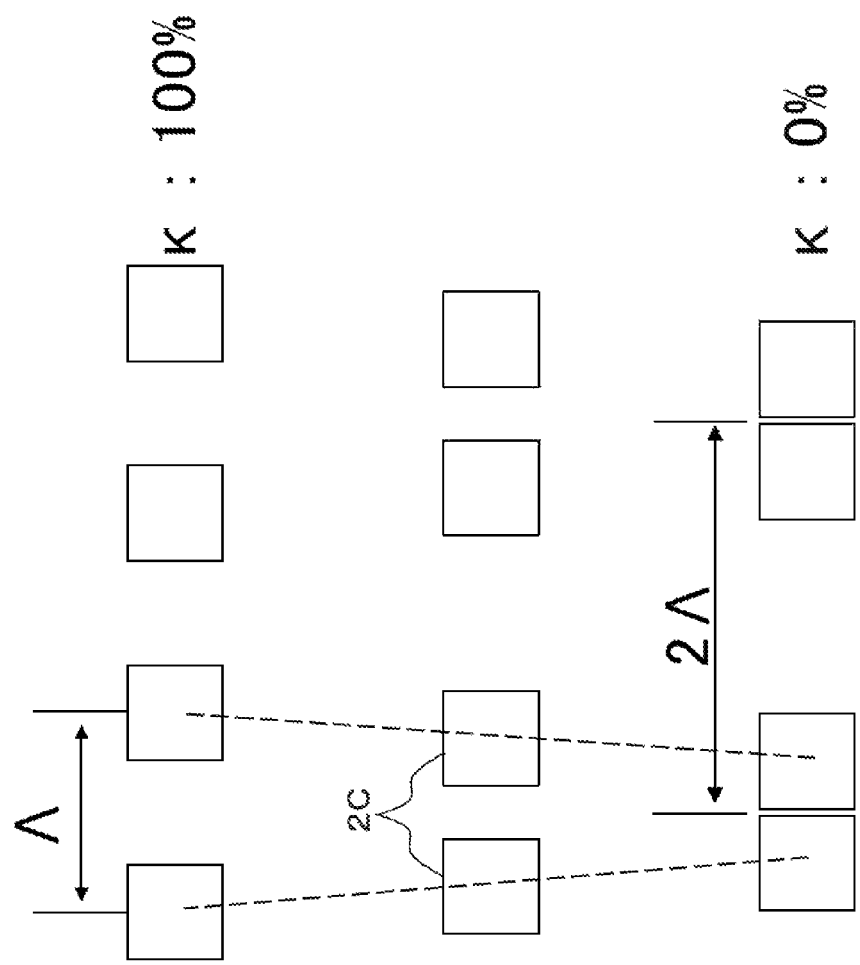
FIG. 8 is a diagram for explaining pair diffraction gratings forming the distributed Bragg reflector included in the optical element of the embodiment.

For example, as illustrated in FIG. 7, the first-order diffraction grating 2 may include the first diffraction grating 2A of the first-order period which is disposed in the center portion of the central region and which is formed to have a duty ratio at which the coupling coefficient takes the maximum value, and pair diffraction gratings 2C (see FIG. 8) which are disposed in both end portions of the central region and which each are a diffraction grating of the first-order period including ridges, every adjacent two of which are paired, the distances from the ridges in each pair to the center of the pair being varied such that the coupling coefficient decreases in the directions from the first diffraction grating 2A toward the second-order diffraction gratings 3.

Note that the pair diffraction gratings 2C are diffraction gratings in which the magnitude relationship of an interval between two adjacent diffraction gratings opposed to each other is varied alternately.

For example, the first diffraction grating 2A of the first-order period is used in the region in which the coupling coefficient is to be set to 100%, and the duty ratio is fixed to obtain the fixed coupling coefficient.

Meanwhile, the pair diffraction gratings 2C are used in the region in which the coupling coefficient is to be set less than 100% and greater than 50%, to modulate the coupling coefficient. Specifically, when the distances from the two ridges of the diffraction gratings of the first-order period in each pair to the center of the pair are similarly decreased, the first-order component of the Fourier coefficient in refractive index variation of the diffraction gratings is varied (decreased) and the coupling coefficient is also decreased. Accordingly, this structure is applied to modulate the coupling coefficient.

Note that the design is not limited to this and the following design may be applied. For example, in a region where the coupling coefficient is to be set to 100% or less and equal to or greater than 80%, the first diffraction grating 2A of the first-order period is used while varying the duty ratio to modulate the coupling coefficient and, in regions where the coupling coefficient is to be set less than 80% and greater than 50%, the pair diffraction gratings 2C are used to modulate the coupling coefficient.

In this case, if the pair diffraction gratings 2C are used in a region where the coupling coefficient is to be set equal to or less than 50%, the ridges of the pair diffraction gratings 2C are located too close to each other and the interval is small. As a result, favorable etching becomes difficult and fabrication of the diffraction grating thereby becomes difficult. Thus, the pair diffraction gratings 2C are used in the regions where the coupling coefficient is to be set less than 100% and greater than 50% (or less than 80% and greater than 50%).

Figure 9:
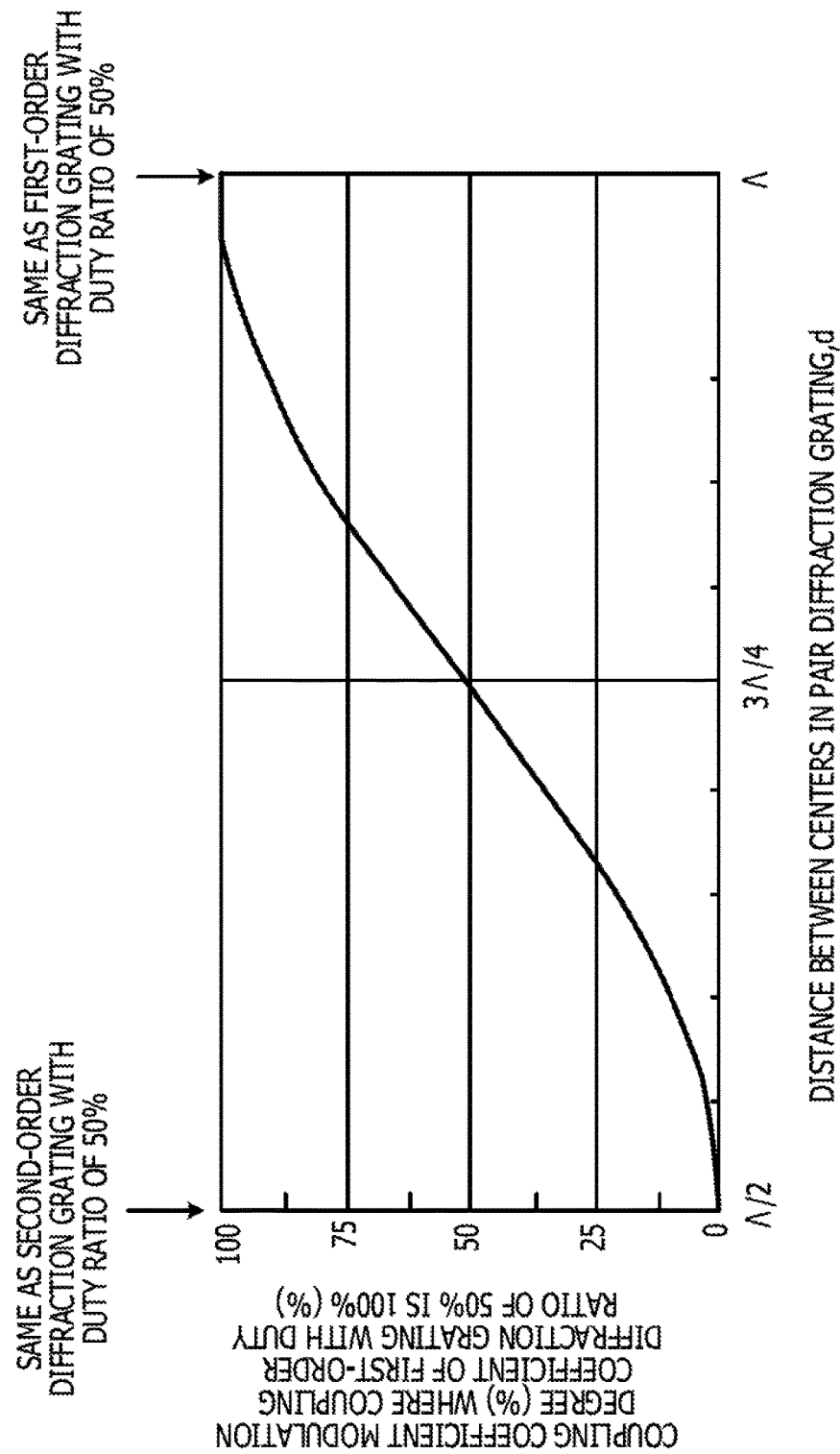
FIG. 9 is a diagram illustrating relationships between a distance d between the centers and the coupling coefficient κ, relative to the first-order diffraction grating, of the pair diffraction gratings forming the distributed Bragg reflector included in the optical element of the embodiment.

In this case, the distance d between the centers of paired ridges in the pair diffraction gratings 2C is varied within a range of $3\Lambda/4$ to $\Lambda$ (see FIG. 9).

Note that the value of the coupling coefficient in the pair diffraction gratings 2C is the same as the maximum value ($\kappa=100\%$) of the coupling coefficient in the first-order diffraction grating when the distance d between the centers is $\Lambda$, and is the same as 50% of the maximum value of the coupling coefficient in the first-order diffraction grating when the distance d between the centers is $3\Lambda/4$. Moreover, the coupling coefficient in the pair diffraction gratings 2C in the case where the distance d between the centers is $3\Lambda/4$ is equivalent to the coupling coefficient in the second-order diffraction grating with the duty ratio of 25% and 75%. Note that the coupling coefficient in the pair diffraction gratings 2C in the case where the distance d between the centers is $\Lambda/2$ is equivalent to the coupling coefficient in the second-order diffraction grating with the duty ratio of 50%.

Meanwhile, the second-order diffraction gratings 3 of the second-order period are used while varying the duty ratio to modulate the coupling coefficient, in the regions where the coupling coefficient is to be set equal to or less than 50% (that is, 50% to 0%).

Note that the value of the coupling coefficient in the second-order diffraction gratings 3 is zero when the duty ratio is 50%, and is about 50% of the maximum value of the coupling coefficient in the first-order diffraction grating when the duty ratio is 25% and 75%.

In this case, the pair diffraction gratings 2C are preferably disposed such that a center point of an interval of each pair matches the center point of the corresponding diffraction grating interval in the diffraction grating of the imaginary first-order period that is assumed to be formed over the entire region of the distributed Bragg reflector 1 (see the diffraction grating 2 on the lower side in FIG. 7) (see dotted lines in FIG. 7).

Specifically, in the pair diffraction gratings 2C, it is preferable that the center point of each of portions of small intervals among the alternately varied intervals matches the center point of the corresponding interval in the imaginary diffraction grating of the first-order period that is assumed to be expanded to the aforementioned small interval portion of the pair diffraction grating.

More specifically, in the pair diffraction grating regions, it is preferable that the center of each groove in the pair diffraction gratings matches the center of the corresponding groove in the imaginary diffraction grating of the first-order period that is assumed to be expanded to the pair diffraction grating regions at the consecutive phase.

This may suppress the occurrence of the phase shift at the connection point of the diffraction gratings with different structures in the respective regions and avoid decrease in the flatness of the reflection characteristic.

Note that, Dug-Bong Kim et al., "Fabrication of Sidelobe-Suppressed InP—InGaAsP Vertical Coupler Optical Filter Using Pair Grating Structure", IEEE PHOTONICS TECHNOLOGY LETTERS, VOL. 10, NO. 11, pp. 1593-1595, NOV. 1998 describes a structure using the pair diffraction grating and, in this document, the variation of the coupling coefficient is achieved entirely by the pair diffraction grating.

Moreover, the diffraction grating in this document is a rough (long period) diffraction grating whose period is in the order of ten-odd μm, and have a thickness of 60 nm which is small relative to the size of the period. Accordingly, no major problems occur in etching of a region in which the intervals are made small to set the coupling coefficient as small as desired, which is the subject of the present disclosure.

Furthermore, in this document, in the pair diffraction grating, instead of bringing both ridges of diffraction gratings in each pair close to each other toward the center of the pair, one ridge in the pair is brought close to the other ridge. In this method, phase shift gradually increases in the first-order component of the Fourier coefficient.

Moreover, this phase shift causes the coupling coefficient to actually decrease at a greater degree than that in calculation, but the effect of the phase shift in the device of this document is minor.

Meanwhile, in the embodiment, the presence of the phase shift disturbs the flatness of the reflection characteristic. Accordingly, as described above, the structure regarding the phase relationship of the pair diffraction gratings based on the first-order diffraction grating is different from that of the document.

By the way, the embodiment is configured as described above due to the following reasons.

Figure 10:
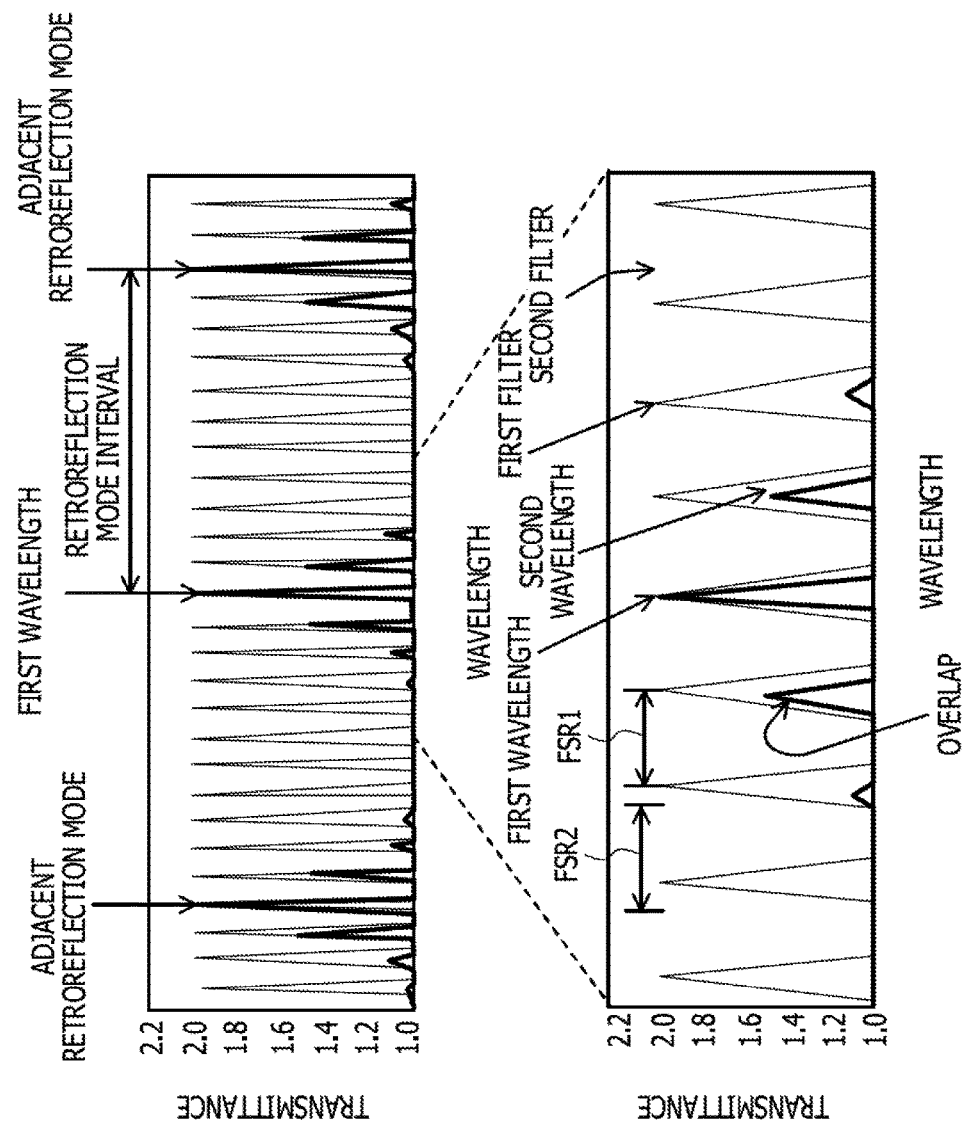
FIG. 10 is a diagram illustrating the wavelength characteristics of a wavelength tunable laser.
Figure 11:
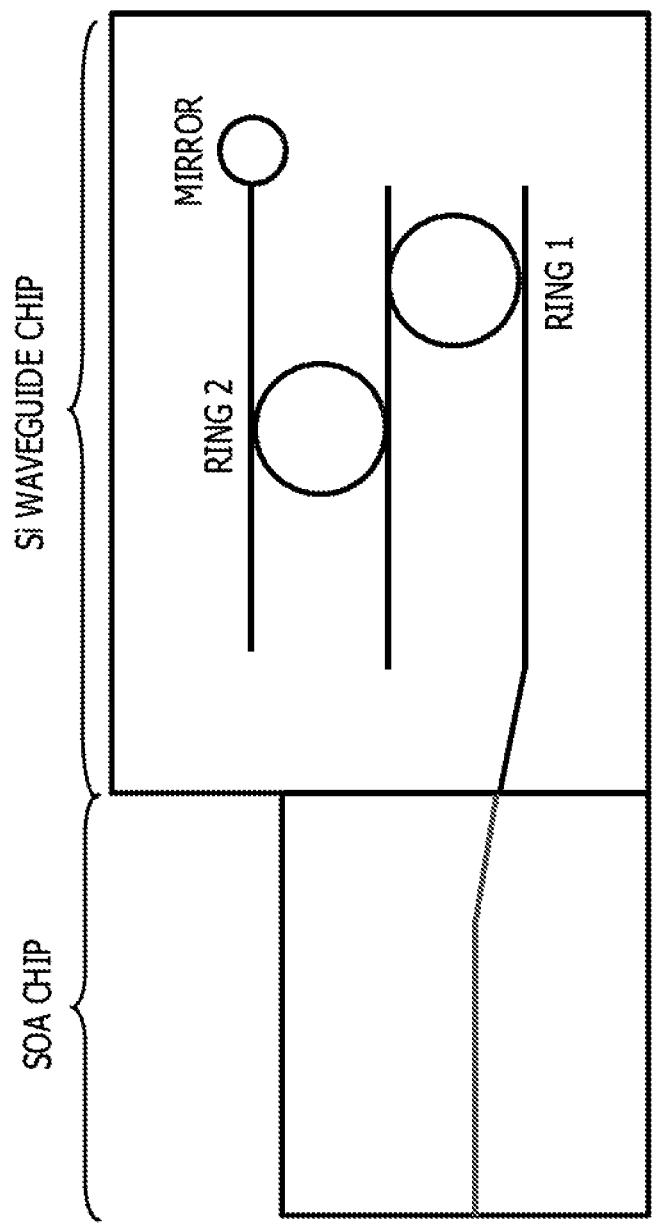
FIG. 11 is a schematic plan diagram illustrating a configuration of a wavelength tunable laser in which Si waveguide filters and a gain element are hybrid-packaged.

As an example of a wavelength tunable laser which is capable of tuning the wavelength within a wide wavelength range and which is used for digital coherent communication being a long-distance high-capacity optical transmission system whose market size is increasing in recent years, there is a wavelength tunable laser using a vernier filter capable of selecting an arbitrary wavelength in a wide wavelength range by combining two filters of first and second wavelength filters having periodic wavelength selection characteristics (see FIG. 10).

Note that, for example, a first ring resonator and a second ring resonator are used as the first filter and the second filter.

Moreover, the resonance wavelength interval of the first ring resonator is denoted by FSR1, and the resonance wavelength interval of the second ring resonator is denoted by FSR2.

A retroreflection mode interval may be specified as |FSR1×FSR2/(FSR1−FSR2)|, by using FSR1 and FSR2.

Moreover, one wavelength at which the resonance wavelengths of the first ring resonator and the second ring resonator match is referred to as first wavelength or main wavelength.

Furthermore, wavelengths other than the one wavelength at which the resonance wavelengths of the first ring resonator and the second ring resonator match are referred to as retroreflection mode wavelengths. In other words, wavelengths other than the main wavelength out of the wavelengths at which the resonance wavelengths of the first ring resonator and the second ring resonator match are referred to as retroreflection mode wavelengths.

Moreover, a wavelength which is closest to the one wavelength among the multiple wavelengths other than the one wavelength at which the resonance wavelengths of the first ring resonator and the second ring resonator match is referred to as adjacent retroreflection mode wavelength or simply adjacent retroreflection mode. In other words, the wavelength other than the main wavelength and closest to the main wavelength out of the wavelengths at which the resonance wavelengths of the first ring resonator and the second ring resonator match is referred to as adjacent retroreflection mode wavelength or simply adjacent retroreflection mode.

Furthermore, the resonance wavelength of each ring resonator that is adjacent to the main wavelength at which the resonance wavelengths of the two ring resonators match and that is located away from the main wavelength by one period is referred to as second wavelength or side mode.

By finely changing the periods of the first and second wavelength filters in such a vernier filter, it is possible to achieve laser oscillation only at a wavelength at which selected wavelengths of the two wavelength filters overlap each other.

In the vernier filter, the filter characteristics are determined by the periods of the first and second wavelength filters and the sharpness (finesse) of the filters. Accordingly, appropriately adjusting these parameters enables a wavelength tuning operation in a wide wavelength range.

As a specific example of the wavelength tunable laser using the vernier filter, there is a wavelength tunable laser in which two ring resonator filters and a gain element (semiconductor optical amplifier: SOA) are hybrid-packaged, the ring resonator filters disposed on a Si waveguide as wavelength filters, the gain element having a reflectivity of about 30% on an output side and having an anti-reflection structure on the side coupled to the filters (see FIG. 11).

In this wavelength tunable laser using the ring resonators on the Si waveguide, the size of each ring resonator may be reduced to have a radius of about several μm to ten-odd μm. Accordingly, the wavelength tunable laser is suitable for size reduction and is a favorable laser structure.

Figure 12:
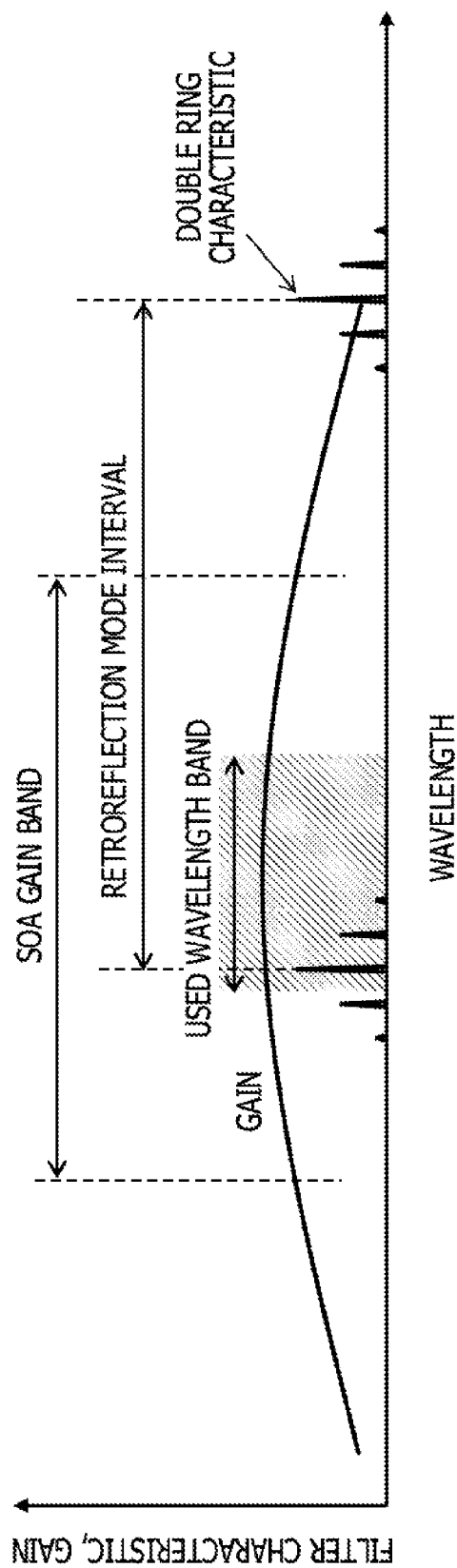
FIG. 12 is a diagram illustrating a retroreflection mode interval, an SOA gain characteristic (SOA gain band), and a used wavelength band in the wavelength tunable laser.

As described above, in the wavelength tunable laser provided with no reflector having the wavelength dependency such as the DBR reflector, the retroreflection mode interval is set wider than an SOA gain band to utilize the SOA gain band to selectively cause laser oscillation at a target wavelength included in the used wavelength band (see FIG. 12).

Moreover, in another example, in order to respond to a recent increase in the capacity of the long-distance high-capacity optical transmission system, for example, the size (form factor) of optical modules is reduced from CFP to CFP2, and to CFP4 so that more optical modules may be mounted on an Ethernet optical transmission apparatus.

In a current optical module for 100 gigabit Ethernet, wavelength multiplexing (LAN-WDM) of four wavelengths is used, and separate laser elements as many as the number of wavelengths, a monolithically-integrated laser array, or the like is used as a laser light source to be mounted in one optical module.

Meanwhile, in order to meet requests for size reduction of the module and reduction of power consumption, there is a demand for achieving a multi-wavelength light source which simultaneously oscillates multiple wavelengths.

The multi-wavelength light source is formed by combining a quantum dot SOA with lower noise than a quantum well SOA and an etalon having a free spectral range (FSR) of a wavelength interval of the LAN-WDM (see FIGS. 13A to 13C).

Also in this case, the quantum dot SOA which is the gain element (gain chip) has the reflectivity of about 30% on the output end side and has the anti-reflection structure on the side coupled to the etalon filter.

Incidentally, in the aforementioned wavelength tunable laser using the ring resonators on the Si waveguide, an interval at which the retroreflection modes (wavelengths at which the selected wavelengths of the two wavelength filters overlap each other again on the longer wavelength side and the shorter wavelength side of the selected wavelengths) appear is set to be wide (see FIG. 12) so that the adjacent retroreflection mode is less affected by the gain of the semiconductor optical amplifier (SOA) and the oscillation is suppressed.

However, in this case, the side mode suppression ratio of the oscillation mode is sometimes insufficient (see FIGS. 14A and 14B) and problems regarding the stability of the oscillation mode may occur.

Figure 14B:
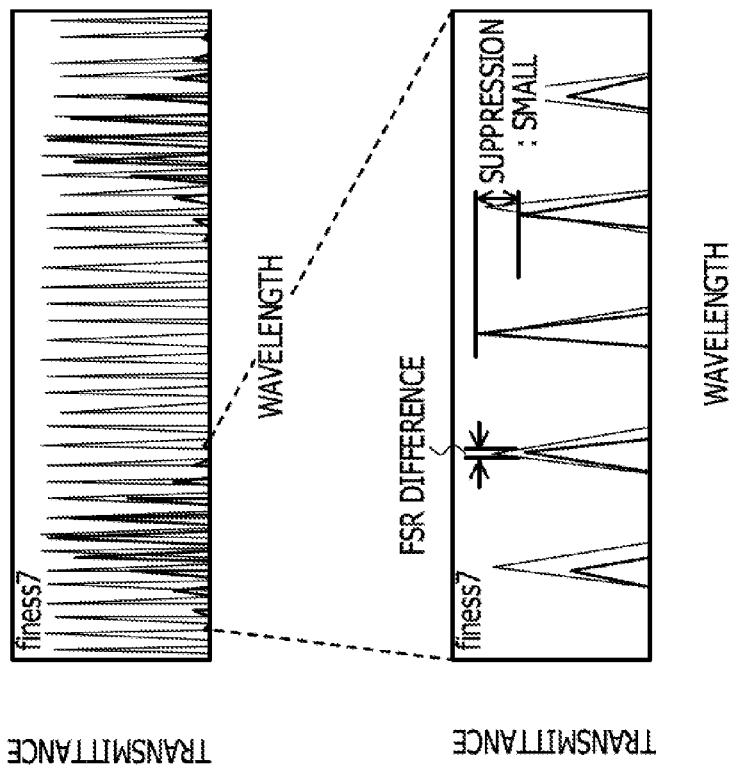
FIGS. 14A and 14B are diagrams for explaining relationships among spectrum, finesse, and the retroreflection mode interval of a wavelength filter in the wavelength tunable laser.
Figure 14A:
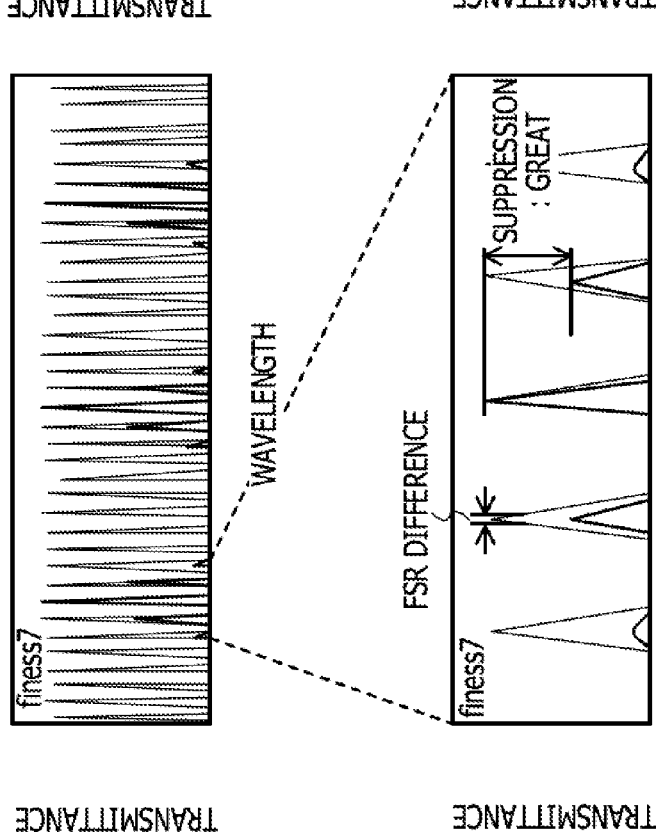
Figure 15:
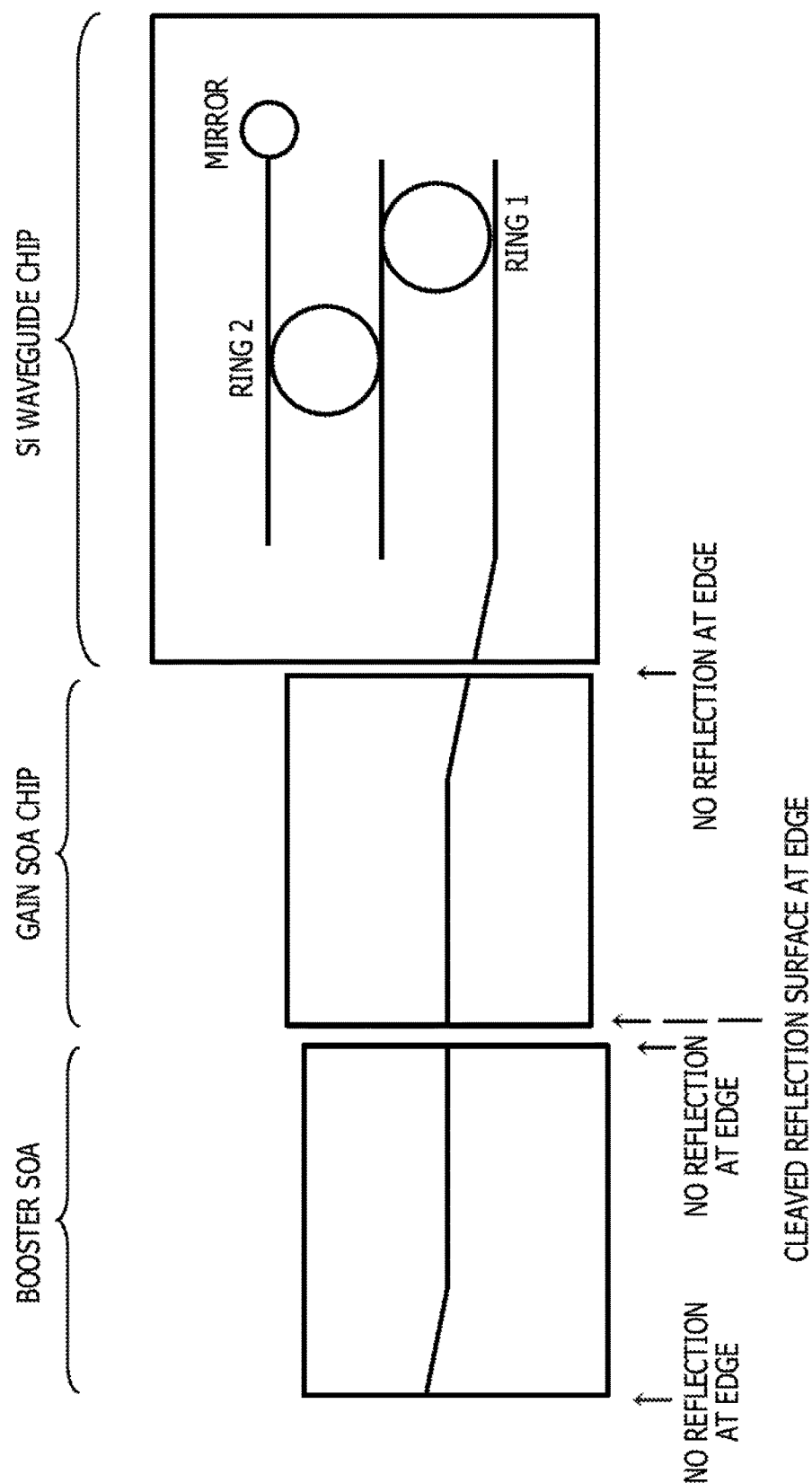
FIG. 15 is a schematic plan diagram illustrating a configuration of a wavelength tunable laser in which Si waveguide filters, a gain element, and a booster are hybrid-packaged.

Note that FIG. 14A depicts a case where the retroreflection mode interval is small, that is, the difference between FSR1 and FSR2 is great, and depicts that the suppression is great in this case. FIG. 14B depicts a case where the retroreflection mode interval is great, that is, the difference between FSR1 and FSR2 is small, and depicts that the suppression is small in this case.

Moreover, when the laser is operated to increase optical power to a practical level (for example +13 dBm), two-photon absorption occurs due to excessive optical intensity in the Si waveguide and the oscillation mode becomes unstable. Accordingly, there is a method in which the optical intensity of the SOA on the laser side is suppressed to a moderate level and the outputted light is amplified by using another SOA (referred to as SOA booster) to obtain desired optical power (see FIG. 15).

However, in this case, the number of portions where parts are aligned for optical coupling increases, and an increase of manufacturing cost due to increased man hours and decreased yield becomes a problem.

Meanwhile, in the multi-wavelength light source, it is impossible to completely extract only the desired four wavelengths. Light of oscillating wavelength, although having low optical intensity, exists on the longer and shorter wavelength sides and complete removal thereof is impossible (see FIGS. 13A to 13C).

As described above, all of the aforementioned cases have a problem that, since a cleaved surface of the semiconductor laser type gain element is used as a reflection surface on the output end side and the reflectivity of the cleaved surface does not have wavelength dependency, the wavelength selectability is limited.

Moreover, a waveguide type filter structure which has definite reflectivity of about 30% in a desired wavelength range and which may be monolithically-integrated or hybrid-integrated with the gain element has not been achieved.

Figure 16:
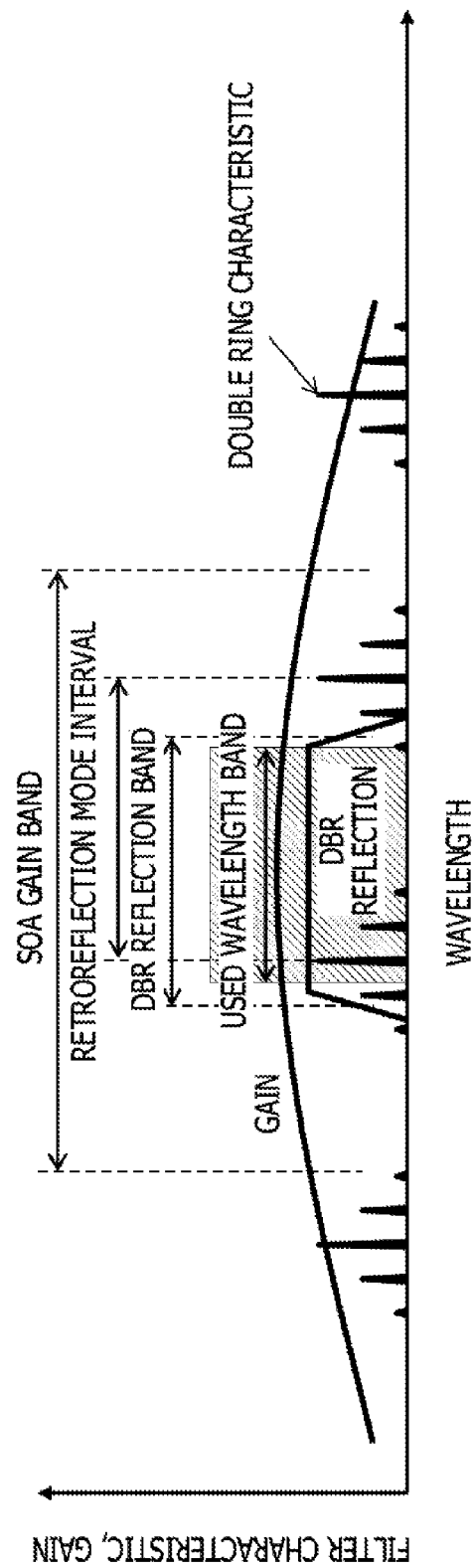
FIG. 16 is a diagram illustrating the retroreflection mode interval, a reflection characteristic of a DBR (DBR reflection band), the SOA gain characteristic (SOA gain band), and the used wavelength in the wavelength tunable laser.
Figure 17:
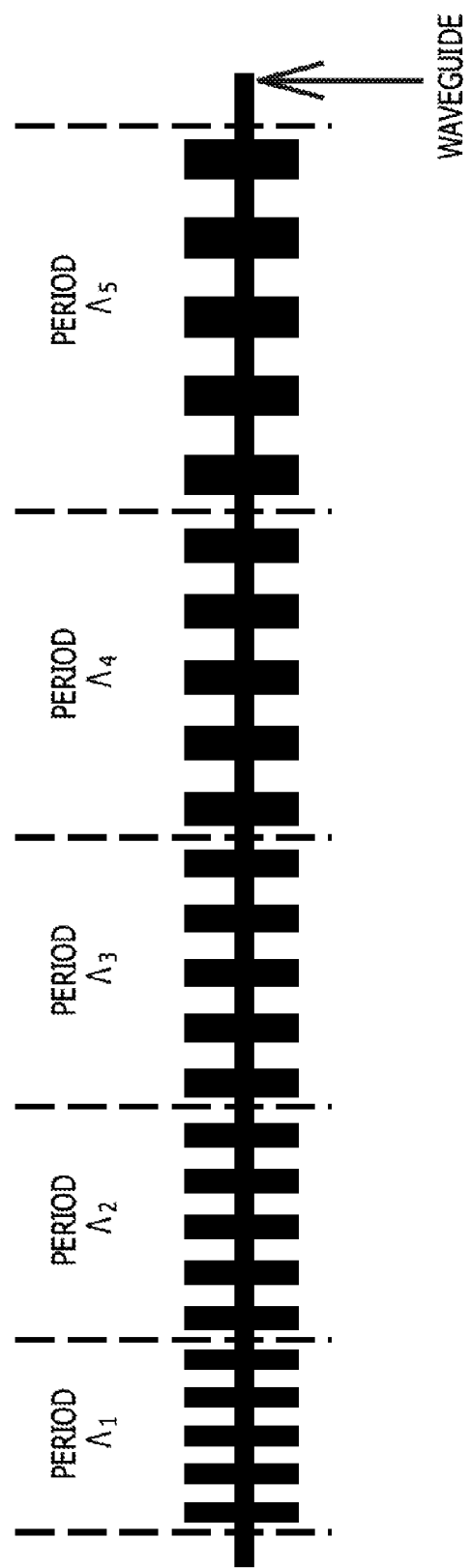
FIG. 17 is a schematic diagram illustrating a DBR mirror in which the period of the diffraction grating is chirped.
Figure 18A:
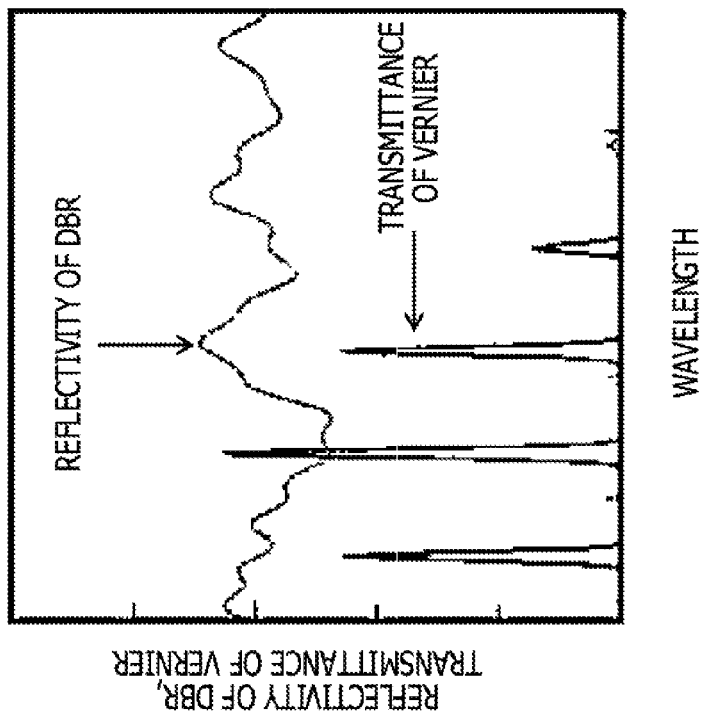
FIGS. 18A and 18B are diagrams for explaining problems of the DBR mirror in which the period of the diffraction grating is chirped.
Figure 18B:
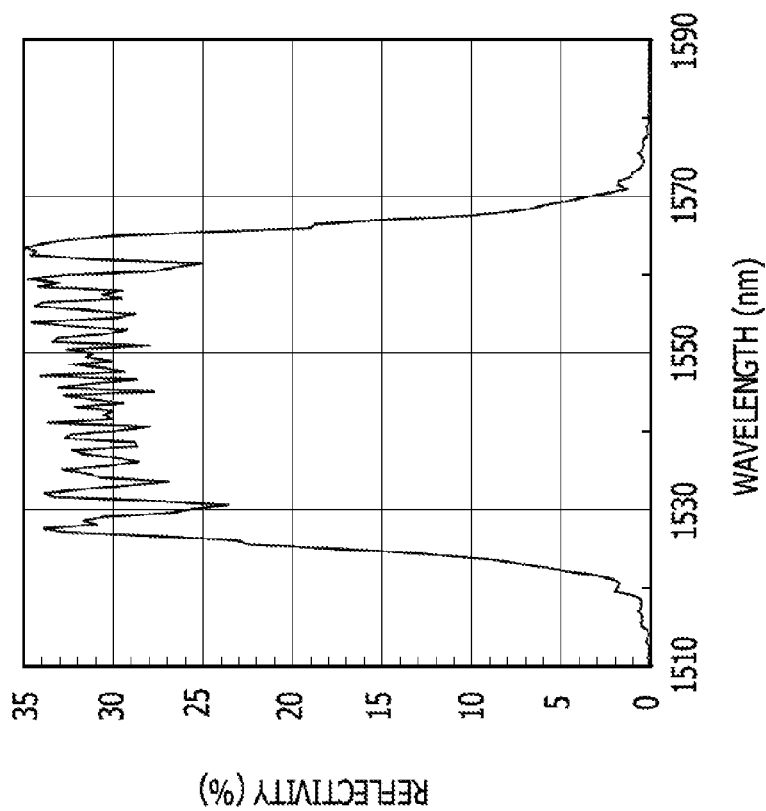

In view of this, the following design is conceivable: an edge reflection mirror on the output side of the SOA which functions as one of two reflection mirrors forming a resonator and whose reflectivity has no wavelength dependency is substituted by a band pass filter form waveguide type DBR mirror having reflectivity which is flat and definite in a wavelength band used as a wavelength tunable region and which sharply decreases outside the wavelength band, and the retroreflection mode interval is set substantially equal to the wavelength band (used wavelength band) used as the wavelength tunable region (see FIG. 16).

In this case, the reflection band of the DBR mirror only requests to be set equal to or larger than the used wavelength band of the wavelength tunable laser. Only the resonance wavelengths matching at the target wavelength to be the oscillation wavelength of the laser thereby enter the reflection band of the DBR mirror and are reflected by the DBR mirror. Accordingly, laser oscillation selectively occurs at the target wavelength.

In this case, the retroreflection mode interval only requests to be set larger than the reflection band of the DBR mirror, and the retroreflection mode interval may be set smaller than the SOA gain band. The ring oscillators may be thereby set to have low finesse. Accordingly, it is possible to reduce the optical intensity inside the waveguide including a silicon waveguide core, suppress two-photon absorption, and suppress change in the equivalent index of the waveguide. As a result, stable laser oscillation is obtained when the laser is operated at high output.

Moreover, the following design is conceivable: an edge reflection mirror on the output side of the quantum dot SOA which functions as one of two reflection mirrors forming the resonator is substituted by the band pass filter form waveguide type DBR mirror having reflectivity which is flat and definite in a wavelength band used as a multi-wavelength oscillation region and which sharply decreases outside the wavelength band.

Using the band pass filter form DBR mirror in the wavelength tunable laser and the multi-wavelength light source as described above may solve one of the problems which are an insufficient side mode suppression ratio of the oscillation mode due to design requirements of the ring-type filters (see FIGS. 14A and 14B).

Furthermore, since the gain SOA on the laser side, the DBR, and the booster SOA may be monolithically-integrated on the semiconductor, it is possible to simultaneously solve the problem of the two-photon absorption and the problem of the increase in manufacturing cost due to the increased man-hours of alignment for optical coupling and the decreased yield.

In the band pass filter form DBR mirror as described above, the filter shape may be achieved to some extent by using a diffraction grating (see FIG. 17) which has such a first-order period that the period of the diffracting grating is chirped (gradually varied) and which has a fixed coupling coefficient. However, simply chirping the period of the diffraction grating causes ripple of several percent in a region where the reflectivity is about 30% and, in mode selection, a sufficient gain difference between the selected mode and the side mode may not be obtained in some cases (see FIGS. 18A and 18B).

Figure 19B:
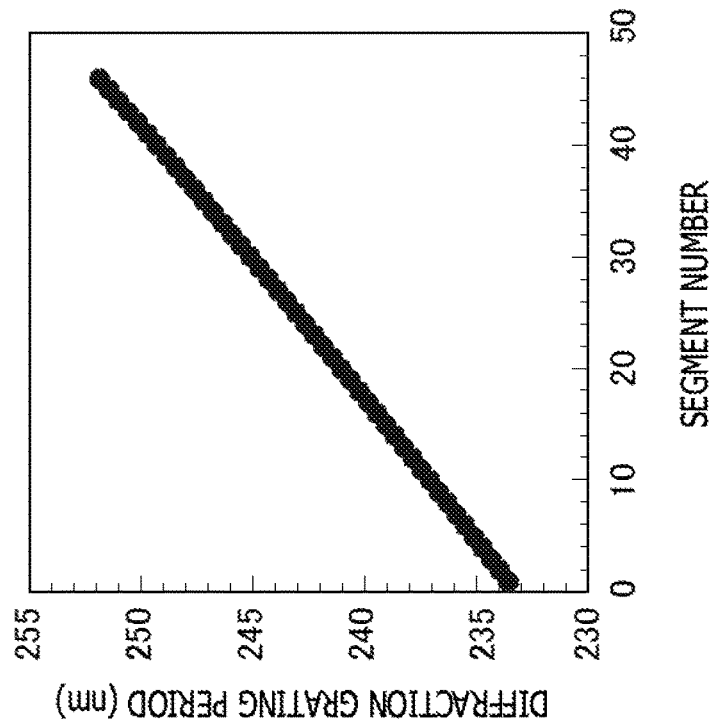
FIGS. 19A and 19B are diagrams for explaining a method of solving the problems of the DBR mirror in which the period of the diffraction grating is chirped.
Figure 19A:
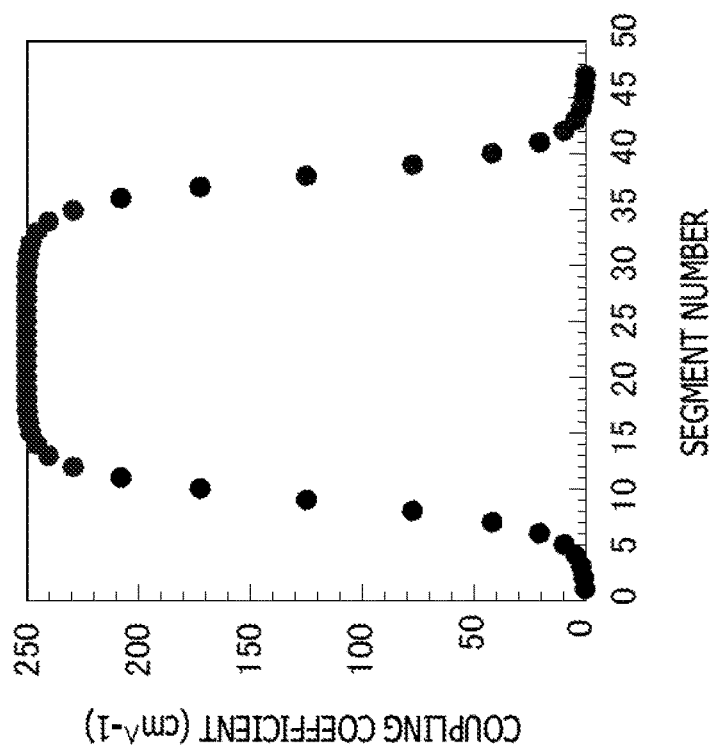

As a method of removing the unnecessary ripple, the following method is conceivable: as illustrated in FIGS. 19A and 19B, for example, the DBR region is divided into 46 segments, and there is used a diffraction grating in which the diffraction grating period in the segments is varied substantially linearly and whose coupling coefficient is gently decreased from the maximum value of about 250 $cm^{-1}$ to zero in the directions toward both ends.

In theory, a substantially flat reflection characteristic (see FIG. 20) with the ripple being suppressed is thereby obtained.

As one of methods of decreasing the coupling coefficient to zero, the coupling coefficient may be modulated by gradually increasing or decreasing the width of the ridge of the diffraction grating of the first-order period (see FIG. 4).

As the diffraction grating used herein, an embedded diffraction grating is used to obtain a large coupling coefficient of about, for example, 250 $cm^{-1}$. This diffraction grating has a large thickness of about 100 nm and has a period of about 240 nm. Accordingly, the width of the ridge of the diffraction grating is about 120 nm at a point of the peak value of the coupling coefficient which is about 250 $cm^{-1}$, and is gradually increased or decreased from 120 nm.

However, as the coupling coefficient becomes closer to zero, that is, when the width of the ridge of the diffraction grating is increased (see the region denoted by the reference sign X in FIG. 4), an opening becomes smaller and problems in etching occur. Meanwhile, when the width of the ridge of the diffraction grating is decreased (see the region denoted by the reference sign Y in FIG. 4), there may be manufacturing troubles such as deformation and disappearance of the diffraction grating in embedding growth after the etching.

Moreover, the decrease or increase of the width of the ridge of the diffraction grating causes gradual variation of the equivalent index, and the reflection characteristic deviates from the designed characteristic.

In view of this, the diffraction gratings forming the distributed Bragg reflector 1 are configured as described above to be easily formed and have the designed reflection characteristic.

The DBR mirror having the definite reflectivity and having the desired filter characteristic of flat and fixed reflectivity may be thereby achieved.

As a result, a wavelength tunable laser light source which has a wide wavelength tunable band and which operates stably at high output may be achieved. Moreover, a multi-wavelength light source which stably and efficiently oscillates only at desired wavelengths may be achieved.

More detailed description is given below by using specific examples.

First, an optical element and an optical module in a first specific example are described with reference to FIGS. 21A to 27.

Figure 21A:
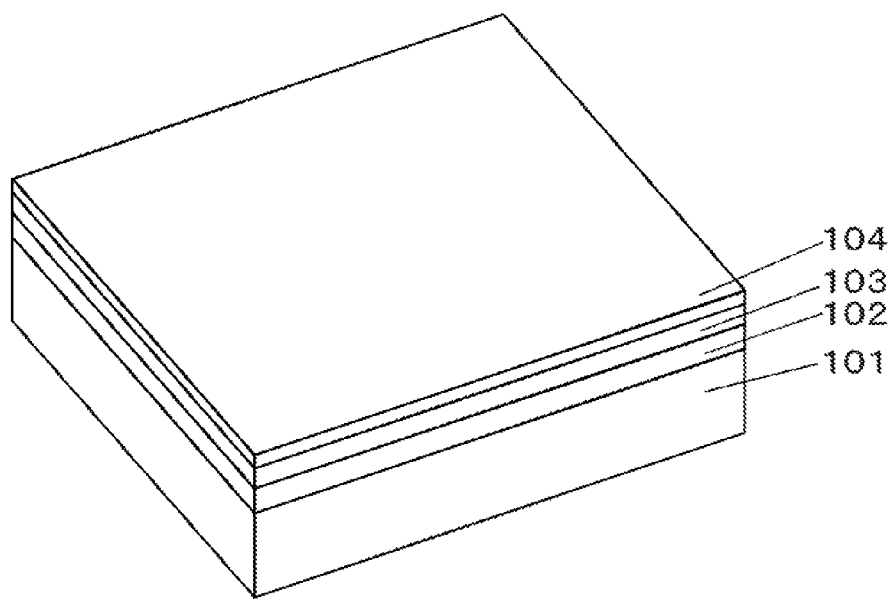
FIGS. 21A and 21B are schematic perspective diagrams for explaining a method of manufacturing an optical element in a first specific example of the embodiment.

As illustrated in FIG. 21A, first, a quantum well active layer 102 and a p-type doped InP cladding layer 103 having a thickness of about 150 nm are sequentially crystal-grown on a surface of an n-type doped InP substrate 101 by using, for example, metalorganic vapor phase epitaxy method (MOVPE method). Then, a $SiO_2$ film 104 is deposited to a thickness of about 400 nm by using a normal chemical vapor deposition method (CVD method).

In this case, the quantum well active layer 102 includes undoped GaInAsP quantum well layers having a thickness of about 5.1 nm and a compressive strain amount of about 1.0%, and undoped GaInAsP barrier layers having a composition wavelength of about 1.20 μm and a thickness of about 10 nm. The number of layers of the quantum well is six, and the emission wavelength of the quantum well is about 1550 nm.

Moreover, the quantum well layers and the barrier layers are sandwiched by undoped GaInAsP—SCH layers having a wavelength of about 1.15 μm and a thickness of about 50 nm.

Figure 21B:
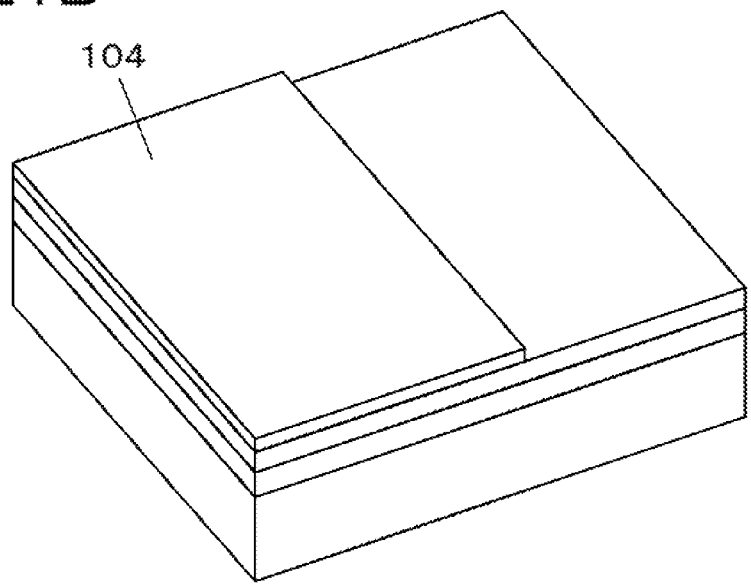

Next, the $SiO_2$ film 104 is processed to cover only a portion to be formed into an active region of a semiconductor optical amplifier, by using photolithography, and an etching mask is formed as illustrated in FIG. 21B.

Figure 22A:
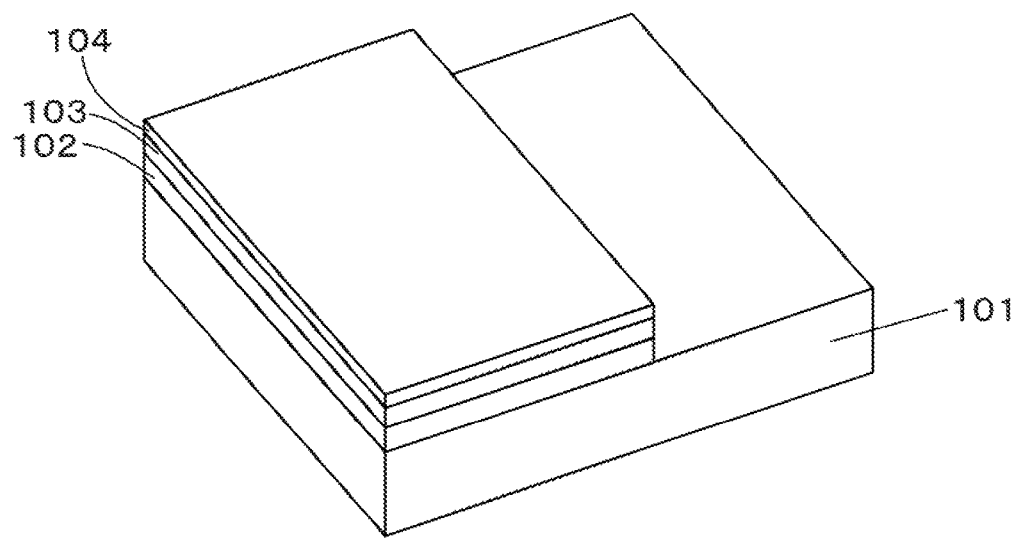
FIGS. 22A and 22B are schematic perspective diagrams for explaining the method of manufacturing the optical element in the first specific example of the embodiment.

Thereafter, the semiconductor surface is etched to the surface of the InP substrate 101 by etching as illustrated in FIG. 22A.

Figure 22B:
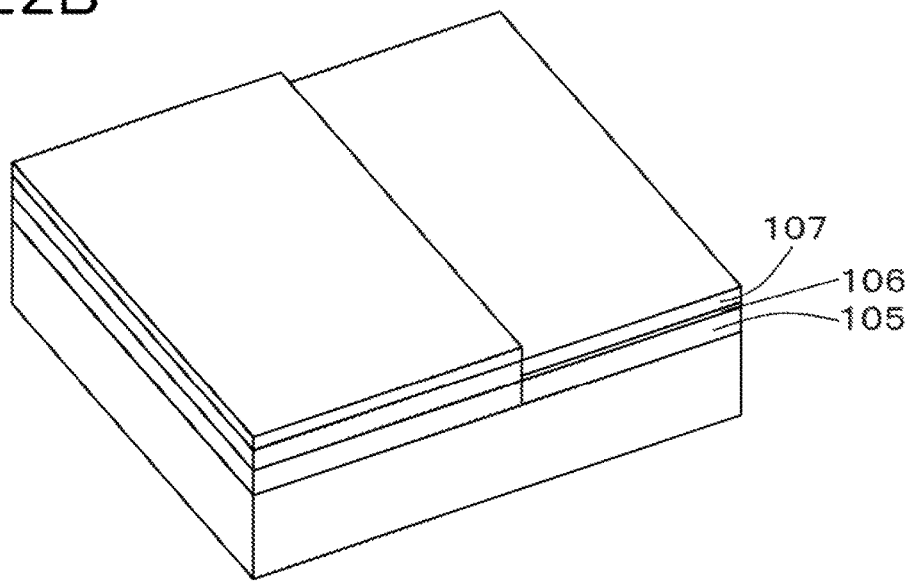

Then, as illustrated in FIG. 22B, an undoped GaInAsP layer 105 having a composition wavelength of about 1.26 μm and a thickness of about 200 nm, an undoped InP layer 106 having a thickness of about 30 nm, and an undoped GaInAsP layer 107 having a composition wavelength of about 1.26 μm and a thickness of about 100 nm are sequentially grown by, for example, the MOVPE method.

In this case, no layers 105, 106, 107 are grown on the $SiO_2$ mask 104 due to the selective growth effect, and the layers 105, 106, 107 are grown only on the portion where the $SiO_2$ film 104 is removed by etching.

Figure 23A:
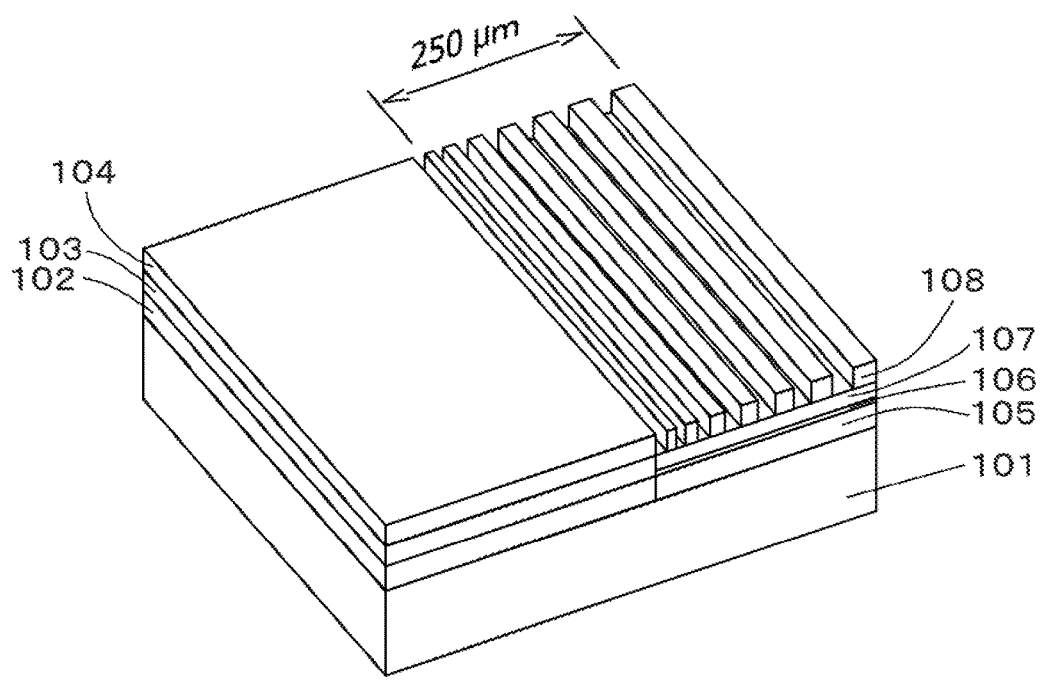
FIGS. 23A and 23B are schematic perspective diagrams for explaining the method of manufacturing the optical element in the first specific example of the embodiment.

Next, the $SiO_2$ mask 104 is peeled off, then an electron beam resist (ZEP520A manufactured by ZEON corporation) is applied onto the surface, and a diffraction grating formation mask (resist mask; electron beam resist mask) 108 is formed as illustrated in FIG. 23A by an electron beam exposure method.

In the diffraction grating formation mask 108, the length of the region of the distributed reflector (DBR mirror) is about 250 μm.

Moreover, the diffraction grating region is divided into 46 segments, and the length, the diffraction grating structure such as first order or second order, the duty ratio of the diffraction grating, the coupling coefficient, and the period in each of the segments are varied as depicted in the following table.

TABLE 1

| SEGMENT NUMBER | SEGMENT LENGTH (μm) | DIFFRACTION GRATING STRUCTURE TYPE | DUTY RATIO, ETC. | COUPLING COEFFICIENT (cm −1) | DIFFRACTION GRATING PERIOD (nm) |
|---|---|---|---|---|---|
| 1 | 4.671 | SECOND-ORDER DIFFRACTION GRATING | DUTY RATIO 50.1% | 0.4 | 467.113 |
| 2 | 4.679 | SECOND-ORDER DIFFRACTION GRATING | DUTY RATIO 50.2% | 0.9 | 467.880 |
| 3 | 4.686 | SECOND-ORDER DIFFRACTION GRATING | DUTY RATIO 50.3% | 2.0 | 468.648 |

TABLE 1-continued

| SEGMENT NUMBER | SEGMENT LENGTH (μm) | DIFFRACTION GRATING STRUCTURE TYPE | DUTY RATIO, ETC. | COUPLING COEFFICIENT (cm$^{-1}$) | DIFFRACTION GRATING PERIOD (nm) |
|---|---|---|---|---|---|
| 4 | 4.694 | SECOND-ORDER DIFFRACTION GRATING | DUTY RATIO 50.7% | 4.5 | 469.419 |
| 5 | 4.702 | SECOND-ORDER DIFFRACTION GRATING | DUTY RATIO 51.6% | 9.8 | 470.191 |
| 6 | 4.710 | SECOND-ORDER DIFFRACTION GRATING | DUTY RATIO 53.5% | 20.8 | 470.966 |
| 7 | 4.717 | SECOND-ORDER DIFFRACTION GRATING | DUTY RATIO 57% | 42.0 | 471.742 |
| 8 | 4.725 | SECOND-ORDER DIFFRACTION GRATING | DUTY RATIO 61.9% | 77.5 | 472.520 |
| 9 | 4.733 | SECOND-ORDER DIFFRACTION GRATING | DUTY RATIO 73.9% | 125.0 | 473.300 |
| 10 | 4.741 | FIRST-ORDER DIFFRACTION GRATING | DUTY RATIO 78.6% | 172.5 | 237.041 |
| 11 | 4.749 | FIRST-ORDER DIFFRACTION GRATING | DUTY RATIO 72.4% | 208.0 | 237.433 |
| 12 | 4.757 | FIRST-ORDER DIFFRACTION GRATING | DUTY RATIO 66.4% | 229.2 | 237.826 |
| 13 | 4.764 | FIRST-ORDER DIFFRACTION GRATING | DUTY RATIO 60.1% | 240.2 | 238.220 |
| 14 | 4.772 | FIRST-ORDER DIFFRACTION GRATING | DUTY RATIO 55.5% | 245.5 | 238.615 |
| 15 | 4.780 | FIRST-ORDER DIFFRACTION GRATING | DUTY RATIO 52.9% | 248.0 | 239.010 |
| 16 | 4.788 | FIRST-ORDER DIFFRACTION GRATING | DUTY RATIO 51.6% | 249.1 | 239.407 |
| 17 | 4.796 | FIRST-ORDER DIFFRACTION GRATING | DUTY RATIO 51% | 249.6 | 239.805 |
| 18 | 4.804 | FIRST-ORDER DIFFRACTION GRATING | DUTY RATIO 50.7% | 249.8 | 240.204 |
| 19 | 4.812 | FIRST-ORDER DIFFRACTION GRATING | DUTY RATIO 50.6% | 249.9 | 240.604 |
| 20 | 4.820 | FIRST-ORDER DIFFRACTION GRATING | DUTY RATIO 50.5% | 250.0 | 241.005 |
| 21 | 4.836 | FIRST-ORDER DIFFRACTION GRATING | DUTY RATIO 50.5% | 250.0 | 241.406 |
| 22 | 4.836 | FIRST-ORDER DIFFRACTION GRATING | DUTY RATIO 50.5% | 250.0 | 241.809 |
| 23 | 4.844 | FIRST-ORDER DIFFRACTION GRATING | DUTY RATIO 50.5% | 250.0 | 242.213 |
| 24 | 4.852 | FIRST-ORDER DIFFRACTION GRATING | DUTY RATIO 50.5% | 250.0 | 242.618 |
| 25 | 4.860 | FIRST-ORDER DIFFRACTION GRATING | DUTY RATIO 50.5% | 250.0 | 243.024 |
| 26 | 4.869 | FIRST-ORDER DIFFRACTION GRATING | DUTY RATIO 50.5% | 250.0 | 243.431 |
| 27 | 4.877 | FIRST-ORDER DIFFRACTION GRATING | DUTY RATIO 50.6% | 249.9 | 243.839 |
| 28 | 4.885 | FIRST-ORDER DIFFRACTION GRATING | DUTY RATIO 50.7% | 249.8 | 244.248 |
| 29 | 4.893 | FIRST-ORDER DIFFRACTION GRATING | DUTY RATIO 51% | 249.6 | 244.658 |
| 30 | 4.901 | FIRST-ORDER DIFFRACTION GRATING | DUTY RATIO 51.6% | 249.1 | 245.069 |
| 31 | 4.910 | FIRST-ORDER DIFFRACTION GRATING | DUTY RATIO 52.9% | 248.0 | 245.481 |
| 32 | 4.918 | FIRST-ORDER DIFFRACTION GRATING | DUTY RATIO 55.5% | 245.5 | 245.894 |
| 33 | 4.926 | FIRST-ORDER DIFFRACTION GRATING | DUTY RATIO 60.1% | 240.2 | 246.308 |
| 34 | 4.934 | FIRST-ORDER DIFFRACTION GRATING | DUTY RATIO 66.4% | 229.2 | 246.723 |
| 35 | 4.943 | FIRST-ORDER DIFFRACTION GRATING | DUTY RATIO 72.4% | 208.0 | 247.140 |
| 36 | 4.951 | FIRST-ORDER DIFFRACTION GRATING | DUTY RATIO 78.6% | 172.5 | 247.557 |
| 37 | 4.960 | SECOND-ORDER DIFFRACTION GRATING | DUTY RATIO 73.9% | 125.0 | 495.950 |
| 38 | 4.968 | SECOND-ORDER DIFFRACTION GRATING | DUTY RATIO 61.9% | 77.5 | 496.789 |
| 39 | 4.976 | SECOND-ORDER DIFFRACTION GRATING | DUTY RATIO 57% | 42.0 | 497.630 |
| 40 | 4.985 | SECOND-ORDER DIFFRACTION GRATING | DUTY RATIO 53.5% | 20.8 | 498.473 |
| 41 | 4.993 | SECOND-ORDER DIFFRACTION GRATING | DUTY RATIO 51.6% | 9.8 | 499.319 |
| 42 | 5.002 | SECOND-ORDER DIFFRACTION GRATING | DUTY RATIO 50.7% | 4.5 | 500.166 |
| 43 | 5.010 | SECOND-ORDER DIFFRACTION GRATING | DUTY RATIO 50.3% | 2.0 | 501.016 |
| 44 | 5.019 | SECOND-ORDER DIFFRACTION GRATING | DUTY RATIO 50.2% | 0.9 | 501.867 |
| 45 | 5.027 | SECOND-ORDER DIFFRACTION GRATING | DUTY RATIO 50.1% | 0.4 | 502.721 |
| 46 | 5.036 | SECOND-ORDER DIFFRACTION GRATING | DUTY RATIO 50% | 0.2 | 503.577 |

Figure 23B:
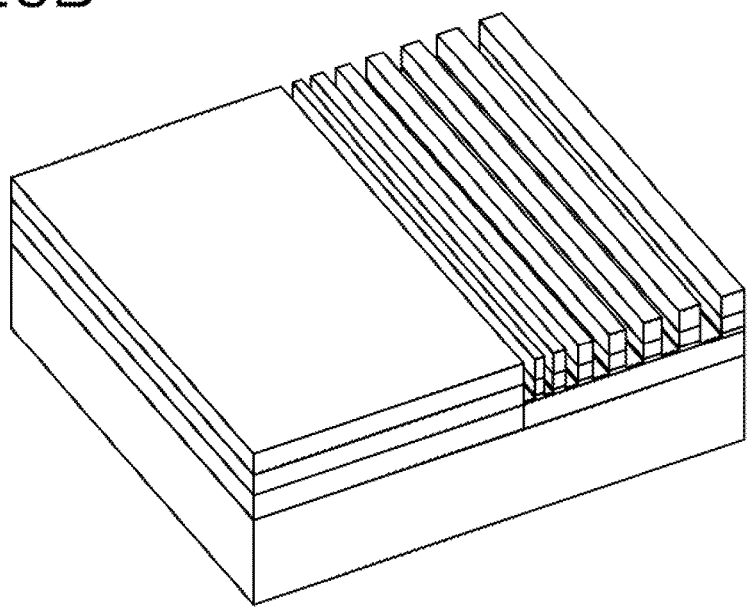

For example, reactive ion etching with an ethane-hydrogen mixed gas is performed while using the diffraction grating formation mask 108, such that the GaInAsP layer 107 is penetrated and the InP layer 106 is etched to the middle thereof to a depth of about 15 nm as illustrated in FIG. 23B, and a diffraction grating pattern is thus transferred.

Figure 24A:
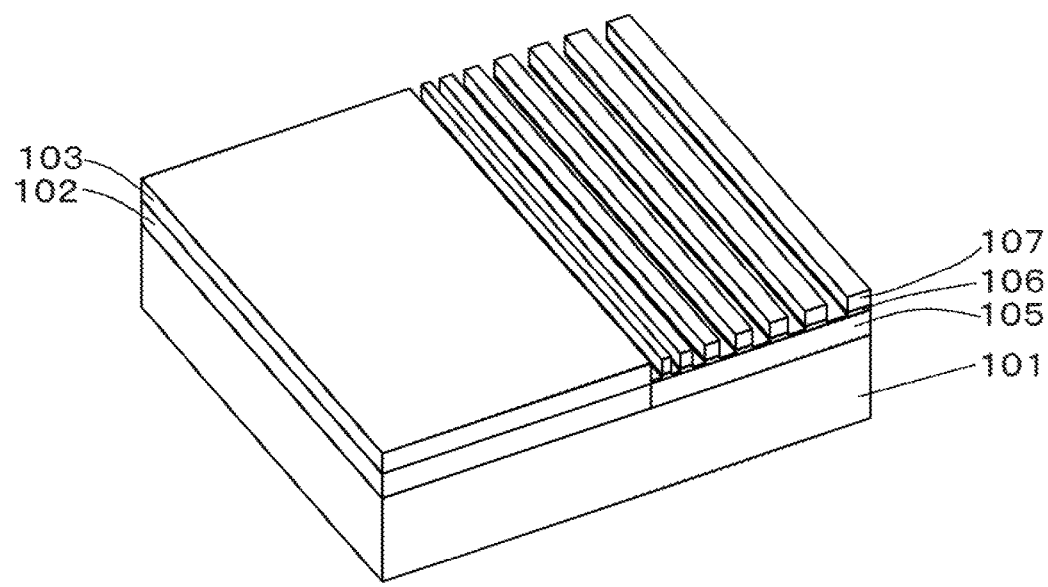
FIGS. 24A and 24B are schematic perspective diagrams for explaining the method of manufacturing the optical element in the first specific example of the embodiment.
Figure 24B:
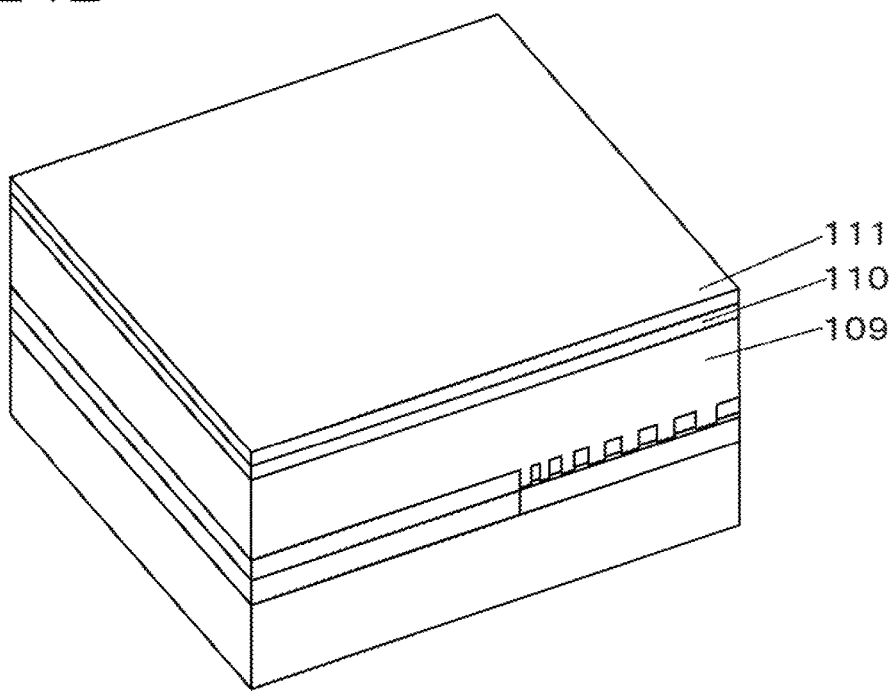

Next, as illustrated in FIG. 24A, the electron beam resist mask 108 is peeled off, then, as illustrated in FIG. 24B, a p-type InP cladding layer 109 doped with Zn and having a thickness of about 2.0 μm and a p-type GaInAs contact layer 110 doped with Zn and having a thickness of about 300 nm are sequentially stacked on the entire surface of the semiconductor crystal wafer by using, for example, the MOVPE method again, and a SiO$_2$ film 111 is deposited to a thickness of about 400 nm by using the normal chemical vapor deposition method (CVD method).

The upper limit of the coupling coefficient (at the duty ratio of 50% in the first-order diffraction grating) in this structure is about 250 cm$^{-1}$.

Figure 20:
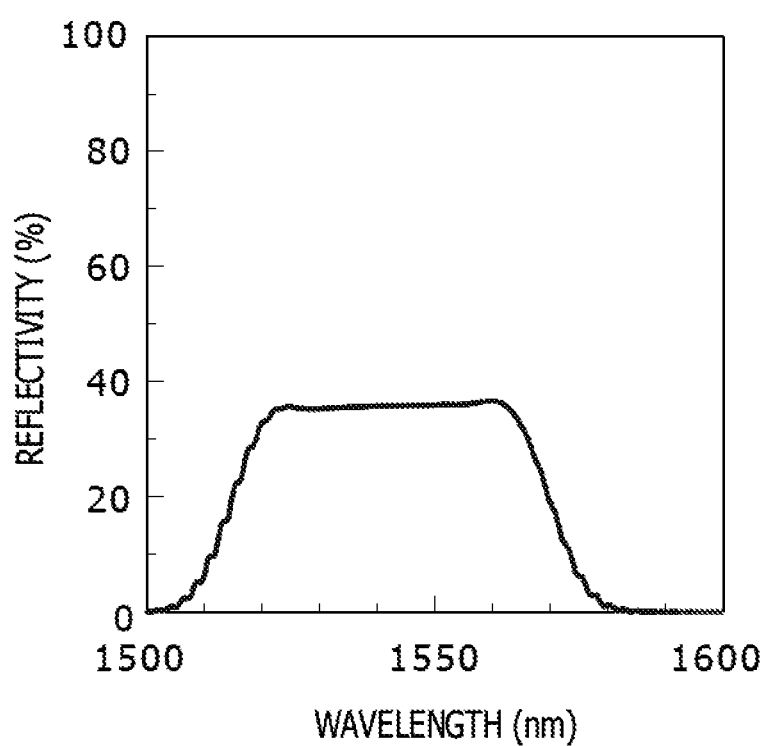
FIG. 20 is a diagram illustrating a reflection characteristic obtained when the method of solving the problems is applied to the DBR mirror in which the period of the diffraction grating is chirped.

Moreover, the reflection spectrum of this DBR is the reflection spectrum illustrated in FIG. 20.

Figure 25A:
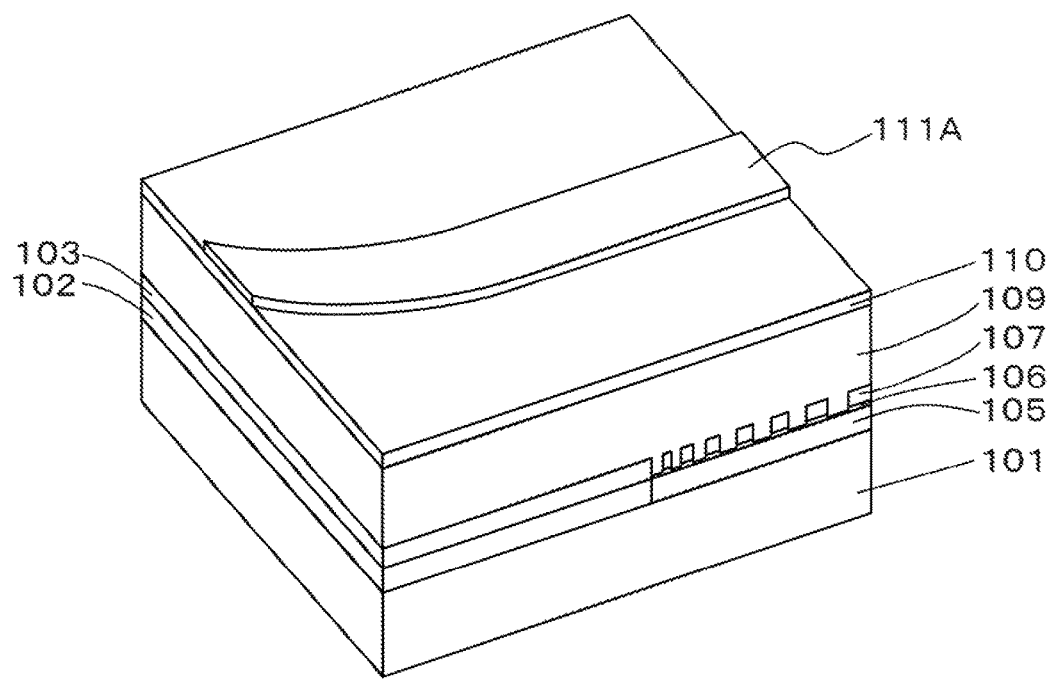
FIGS. 25A and 25B are schematic perspective diagrams for explaining the method of manufacturing the optical element in the first specific example of the embodiment.

Next, as illustrated in FIG. 25A, a waveguide etching mask 111A is formed by, for example, photolithography.

In this case, the width of the mask 111A is set such that the waveguide eventually has a width of about 1.5 μm.

Moreover, the mask 111A is formed such that a portion of the waveguide on the SOA side is gradually curved toward an output edge and eventually tilted by 7° with respect to the normal direction of the edge.

Figure 25B:
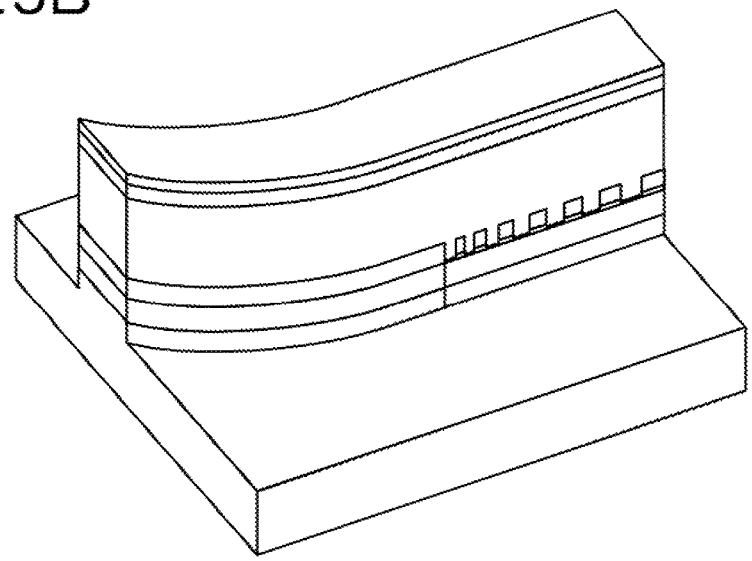

Thereafter, as illustrated in FIG. 25B, the semiconductor surface is etched by using, for example, a dry etching method and processed into a mesa stripe shape such that the InP substrate 101 is etched to a depth of about 0.7 μm.

Figure 26A:
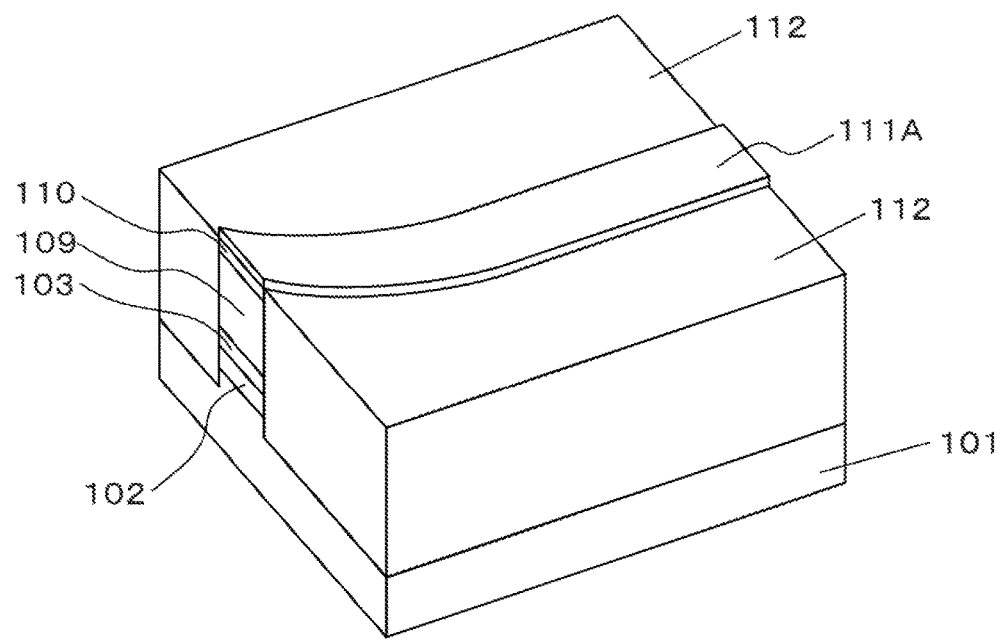
FIGS. 26A and 26B are schematic perspective diagrams for explaining the method of manufacturing the optical element in the first specific example of the embodiment.

As illustrated in FIG. 26A, a current blocking layer 112 made of Fe-doped semi-insulating InP is grown on both sides of the mesa stripe by using, for example, the MOVPE method.

Figure 26B:
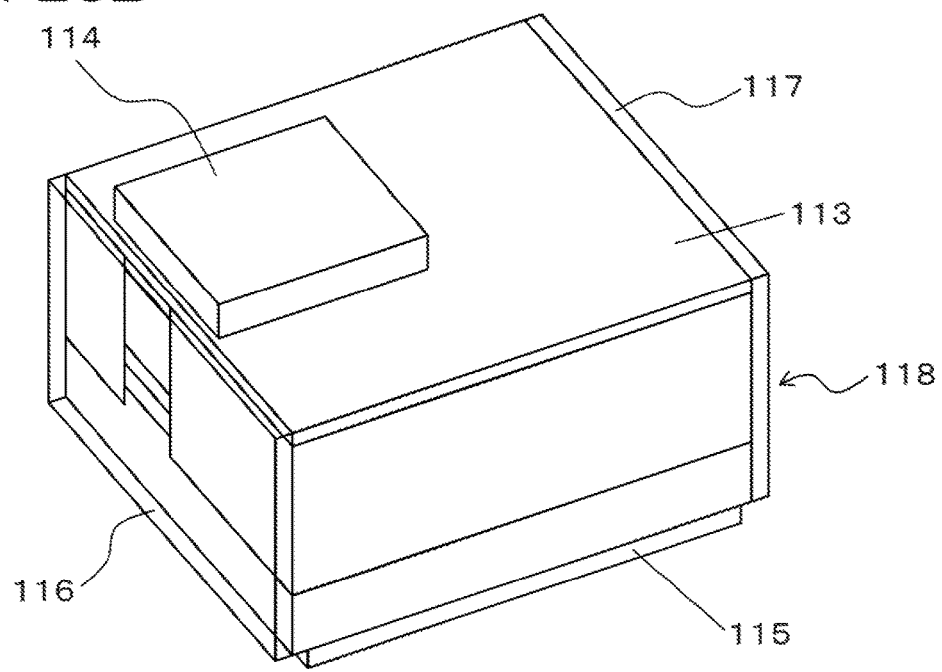

Thereafter, the etching mask 111A is removed with, for example, hydrofluoric acid and then, as illustrated in FIG. 26B, a passivation film 113 made of SiN is formed.

Next, the SiN layer 113 is removed by using normal photolithography and etching such that a window is opened in the SiN layer 113 only in a portion to be the semiconductor optical amplifier, and then a p-side electrode 114 and an n-side electrode 115 of the semiconductor optical amplifier are formed.

Next, anti-reflection coatings 116, 117 are formed on both edges of the element, and the gain SOA element (optical element) 118 integrated with the DBR is thereby finished.

Figure 27:
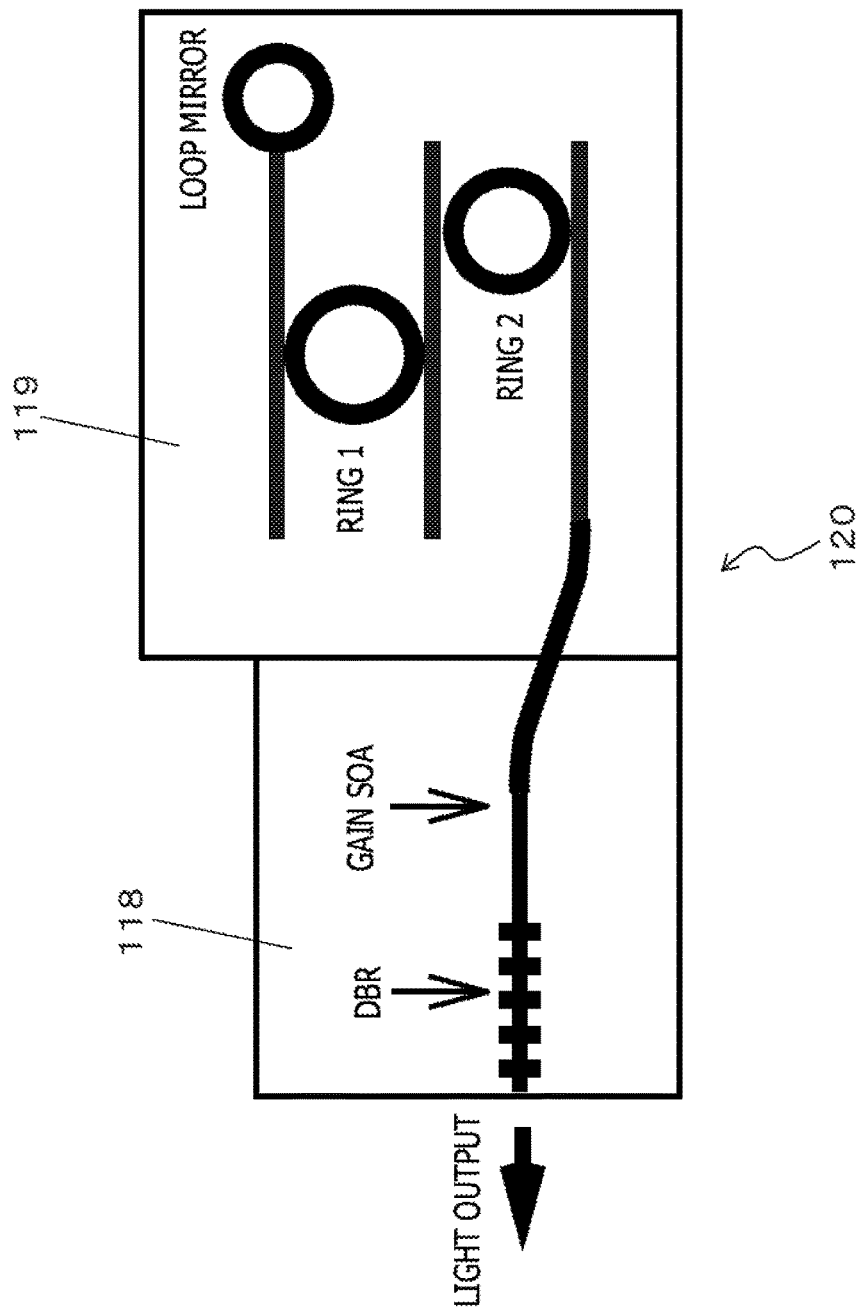
FIG. 27 is a schematic diagram for explaining a configuration of an optical module in the first specific example of the embodiment.

Moreover, as illustrated in FIG. 27, the element 118 and a wavelength filtering element 119 having two ring resonators (ring 1 and ring 2) and a loop mirror which are formed on a silicon substrate may be combined to obtain a wavelength tunable laser light source (optical module) 120.

By using the wavelength tunable laser light source 120, it is possible to obtain laser oscillation light having characteristics including the optical power of about 13 dBm and the spectrum line width of about 100 kHz, in the wavelength tunable band from about 1520 nm to about 1570 nm in the C band.

Next, an optical element and an optical module in a second specific example are described with reference to FIGS. 28A to 34.

Figure 28A:
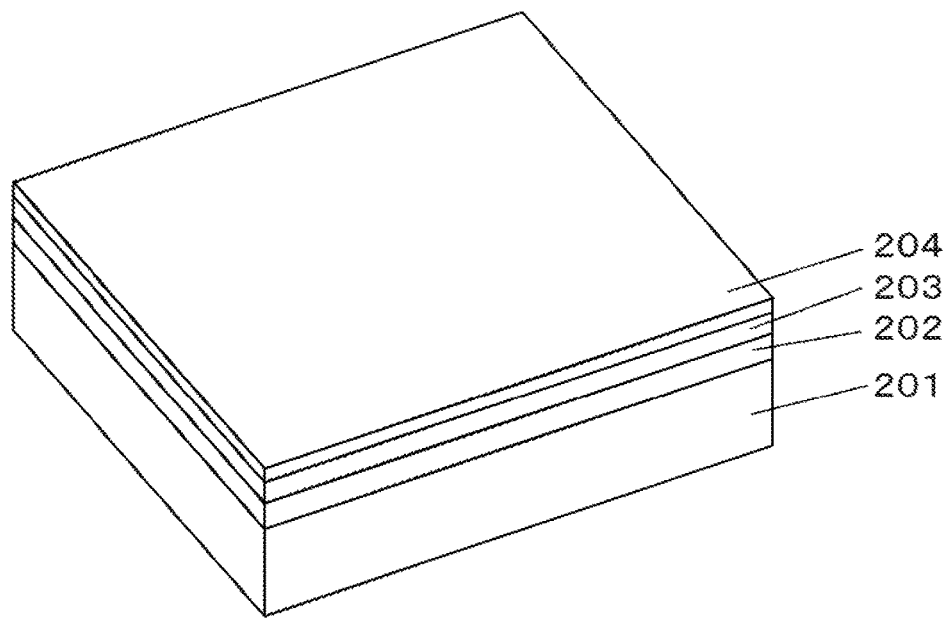
FIGS. 28A and 28B are schematic perspective diagrams for explaining a method of manufacturing an optical element in a second specific example of the embodiment.

As illustrated in FIG. 28A, first, a quantum well active layer 202 and a p-type doped InP cladding layer 203 having a thickness of about 150 nm are sequentially crystal-grown on the surface of an n-type doped InP substrate 201 by using, for example, the metalorganic vapor phase epitaxy method (MOVPE method). Then, a $SiO_2$ film 204 is deposited to a thickness of about 400 nm by using the normal chemical vapor deposition method (CVD method).

In this case, the quantum well active layer 202 includes undoped GaInAsP quantum well layers having a thickness of about 5.1 nm and a compressive strain amount of about 1.0%, and undoped GaInAsP barrier layers having a composition wavelength of about 1.20 µm and a thickness of about 10 nm. The number of layers of the quantum well is six, and the emission wavelength of the quantum well is about 1550 nm.

Moreover, the quantum well layers and the barrier layers are sandwiched by undoped GaInAsP—SCH layers having a wavelength of about 1.15 µm and a thickness of about 50 nm.

Figure 28B:
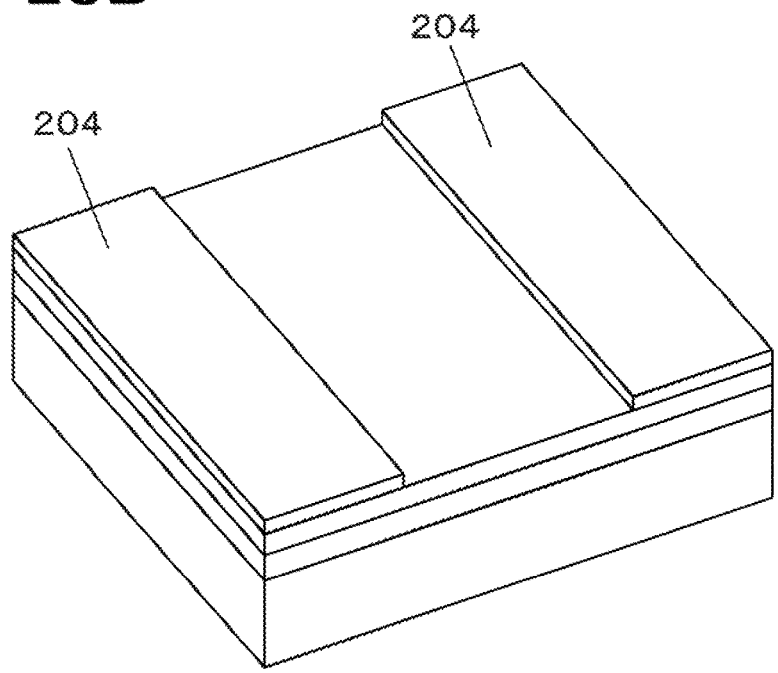

Next, the $SiO_2$ film 204 is processed to cover only a portion to be formed into an active region of a semiconductor optical amplifier, by using photolithography, and an etching mask is formed as illustrated in FIG. 28B.

Figure 29A:
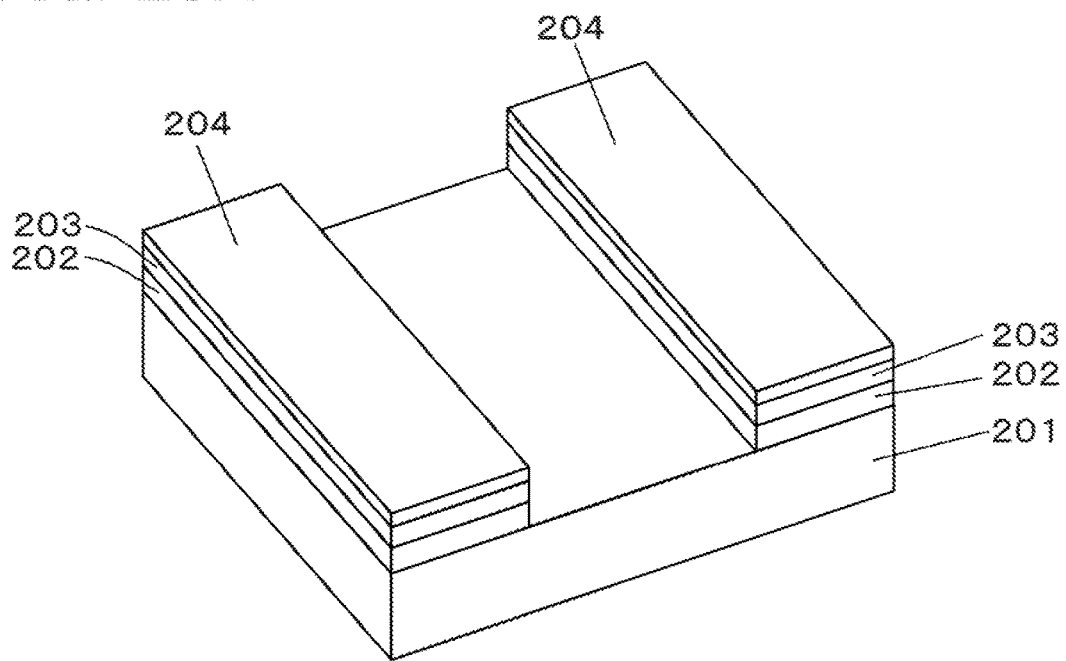
FIGS. 29A and 29B are schematic perspective diagrams for explaining the method of manufacturing the optical element in the second specific example of the embodiment.

Thereafter, the semiconductor surface is etched to the surface of InP substrate 201 by etching as illustrated in FIG. 29A.

Figure 29B:
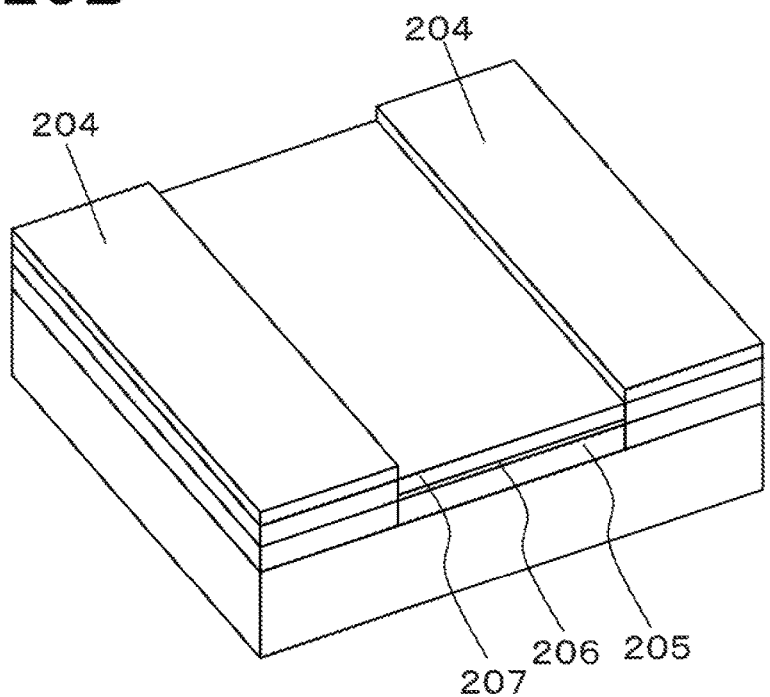

Then, as illustrated in FIG. 29B, an undoped GaInAsP layer 205 having a composition wavelength of about 1.26 µm and a thickness of about 200 nm, an undoped InP layer 206 having a thickness of about 30 nm, and an undoped GaInAsP layer 207 having a composition wavelength of about 1.26 µm and a thickness of about 100 nm are sequentially grown by, for example, the MOVPE method.

In this case, no layers 205, 206, 207 are grown on the $SiO_2$ mask 204 due to the selective growth effect, and the layers 205, 206, 207 are grown only on the portion where the $SiO_2$ film 204 is removed by etching.

Figure 30A:
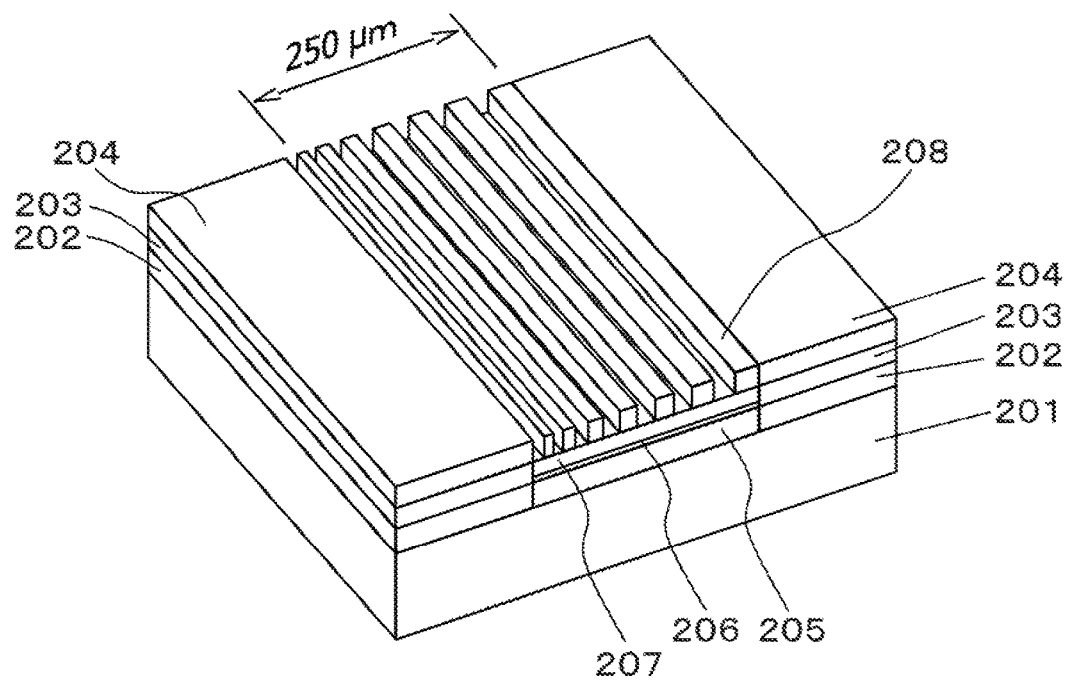
FIGS. 30A and 30B are schematic perspective diagrams for explaining the method of manufacturing the optical element in the second specific example of the embodiment.

Next, the $SiO_2$ mask 204 is peeled off, then an electron beam resist (ZEP520A manufactured by ZEON corporation) is applied onto the surface, and a diffraction grating formation mask (resist mask; electron beam resist mask) 208 is formed as illustrated in FIG. 30A by the electron beam exposure method.

In the diffraction grating formation mask 208, the length of the region of the distributed reflector (DBR mirror) is about 250 µm.

Moreover, the diffraction grating region is divided into 46 segments, and the length, the diffraction grating structure such as first order, second order, or pair, the duty ratio of the diffraction grating, the coupling coefficient, and the period in each of the segments is varied as depicted in the following table.

TABLE 2

| SEGMENT NUMBER | SEGMENT LENGTH (µm) | DIFFRACTION GRATING STRUCTURE TYPE | DUTY RATIO, ETC. | COUPLING COEFFICIENT (cm$^{-1}$) | DIFFRACTION GRATING PERIOD (nm) |
|---|---|---|---|---|---|
| 1 | 4.671 | SECOND-ORDER DIFFRACTION GRATING | DUTY RATIO 50.1% | 0.4 | 467.113 |
| 2 | 4.679 | SECOND-ORDER DIFFRACTION GRATING | DUTY RATIO 50.2% | 0.9 | 467.880 |
| 3 | 4.686 | SECOND-ORDER DIFFRACTION GRATING | DUTY RATIO 50.3% | 2.0 | 468.648 |
| 4 | 4.694 | SECOND-ORDER DIFFRACTION GRATING | DUTY RATIO 50.7% | 4.5 | 469.419 |
| 5 | 4.702 | SECOND-ORDER DIFFRACTION GRATING | DUTY RATIO 51.6% | 9.8 | 470.191 |
| 6 | 4.710 | SECOND-ORDER DIFFRACTION GRATING | DUTY RATIO 53.5% | 20.8 | 470.966 |
| 7 | 4.717 | SECOND-ORDER DIFFRACTION GRATING | DUTY RATIO 57% | 42.0 | 471.742 |
| 8 | 4.725 | SECOND-ORDER DIFFRACTION GRATING | DUTY RATIO 61.9% | 77.5 | 472.520 |
| 9 | 4.733 | SECOND-ORDER DIFFRACTION GRATING | DUTY RATIO 73.9% | 125.0 | 473.300 |
| 10 | 4.741 | PAIR DIFFRACTION GRATING | DISTANCE BETWEEN CENTERS = 147.93 nm | 172.5 | 237.041 |
| 11 | 4.749 | PAIR DIFFRACTION GRATING | DISTANCE BETWEEN CENTERS = 173.6 nm | 208.0 | 237.433 |
| 12 | 4.757 | PAIR DIFFRACTION GRATING | DISTANCE BETWEEN CENTERS = 193.53 nm | 229.2 | 237.826 |
| 13 | 4.764 | PAIR DIFFRACTION GRATING | DISTANCE BETWEEN CENTERS = 208.01 nm | 240.2 | 238.220 |
| 14 | 4.772 | PAIR DIFFRACTION GRATING | DISTANCE BETWEEN CENTERS = 218.18 nm | 245.5 | 238.615 |
| 15 | 4.780 | FIRST-ORDER DIFFRACTION GRATING | DUTY RATIO 52.9% | 248.0 | 239.010 |
| 16 | 4.788 | FIRST-ORDER DIFFRACTION GRATING | DUTY RATIO 51.6% | 249.1 | 239.407 |
| 17 | 4.796 | FIRST-ORDER DIFFRACTION GRATING | DUTY RATIO 51% | 249.6 | 239.805 |
| 18 | 4.804 | FIRST-ORDER DIFFRACTION GRATING | DUTY RATIO 50.7% | 249.8 | 240.204 |
| 19 | 4.812 | FIRST-ORDER DIFFRACTION GRATING | DUTY RATIO 50.6% | 249.9 | 240.604 |
| 20 | 4.820 | FIRST-ORDER DIFFRACTION GRATING | DUTY RATIO 50.5% | 250.0 | 241.005 |
| 21 | 4.836 | FIRST-ORDER DIFFRACTION GRATING | DUTY RATIO 50.5% | 250.0 | 241.406 |
| 22 | 4.836 | FIRST-ORDER DIFFRACTION GRATING | DUTY RATIO 50.5% | 250.0 | 241.809 |
| 23 | 4.844 | FIRST-ORDER DIFFRACTION GRATING | DUTY RATIO 50.5% | 250.0 | 242.213 |
| 24 | 4.852 | FIRST-ORDER DIFFRACTION GRATING | DUTY RATIO 50.5% | 250.0 | 242.618 |
| 25 | 4.860 | FIRST-ORDER DIFFRACTION GRATING | DUTY RATIO 50.5% | 250.0 | 243.024 |
| 26 | 4.869 | FIRST-ORDER DIFFRACTION GRATING | DUTY RATIO 50.5% | 250.0 | 243.431 |
| 27 | 4.877 | FIRST-ORDER DIFFRACTION GRATING | DUTY RATIO 50.6% | 249.9 | 243.839 |
| 28 | 4.885 | FIRST-ORDER DIFFRACTION GRATING | DUTY RATIO 50.7% | 249.8 | 244.248 |
| 29 | 4.893 | FIRST-ORDER DIFFRACTION GRATING | DUTY RATIO 51% | 249.6 | 244.658 |

TABLE 2-continued

| SEGMENT NUMBER | SEGMENT LENGTH (μm) | DIFFRACTION GRATING STRUCTURE TYPE | DUTY RATIO, ETC. | COUPLING COEFFICIENT (cm⁻¹) | DIFFRACTION GRATING PERIOD (nm) |
|---|---|---|---|---|---|
| 30 | 4.901 | FIRST-ORDER DIFFRACTION GRATING | DUTY RATIO 51.6% | 249.1 | 245.069 |
| 31 | 4.910 | FIRST-ORDER DIFFRACTION GRATING | DUTY RATIO 52.9% | 248.0 | 245.481 |
| 32 | 4.918 | PAIR DIFFRACTION GRATING | DISTANCE BETWEEN CENTERS = 224.84 nm | 245.5 | 245.894 |
| 33 | 4.926 | PAIR DIFFRACTION GRATING | DISTANCE BETWEEN CENTERS = 215.07 nm | 240.2 | 246.308 |
| 34 | 4.934 | PAIR DIFFRACTION GRATING | DISTANCE BETWEEN CENTERS = 200.77 nm | 229.2 | 246.723 |
| 35 | 4.943 | PAIR DIFFRACTION GRATING | DISTANCE BETWEEN CENTERS = 180.7 nm | 208.0 | 247.140 |
| 36 | 4.951 | PAIR DIFFRACTION GRATING | DISTANCE BETWEEN CENTERS = 154.49 nm | 172.5 | 247.557 |
| 37 | 4.960 | SECOND-ORDER DIFFRACTION GRATING | DUTY RATIO 73.9% | 125.0 | 495.950 |
| 38 | 4.968 | SECOND-ORDER DIFFRACTION GRATING | DUTY RATIO 61.9% | 77.5 | 496.789 |
| 39 | 4.976 | SECOND-ORDER DIFFRACTION GRATING | DUTY RATIO 57% | 42.0 | 497.630 |
| 40 | 4.985 | SECOND-ORDER DIFFRACTION GRATING | DUTY RATIO 53.5% | 20.8 | 498.473 |
| 41 | 4.993 | SECOND-ORDER DIFFRACTION GRATING | DUTY RATIO 51.6% | 9.8 | 499.319 |
| 42 | 5.002 | SECOND-ORDER DIFFRACTION GRATING | DUTY RATIO 50.7% | 4.5 | 500.166 |
| 43 | 5.010 | SECOND-ORDER DIFFRACTION GRATING | DUTY RATIO 50.3% | 2.0 | 501.016 |
| 44 | 5.019 | SECOND-ORDER DIFFRACTION GRATING | DUTY RATIO 50.2% | 0.9 | 501.867 |
| 45 | 5.027 | SECOND-ORDER DIFFRACTION GRATING | DUTY RATIO 50.1% | 0.4 | 502.721 |
| 46 | 5.036 | SECOND-ORDER DIFFRACTION GRATING | DUTY RATIO 50% | 0.2 | 503.577 |

Figure 30B:
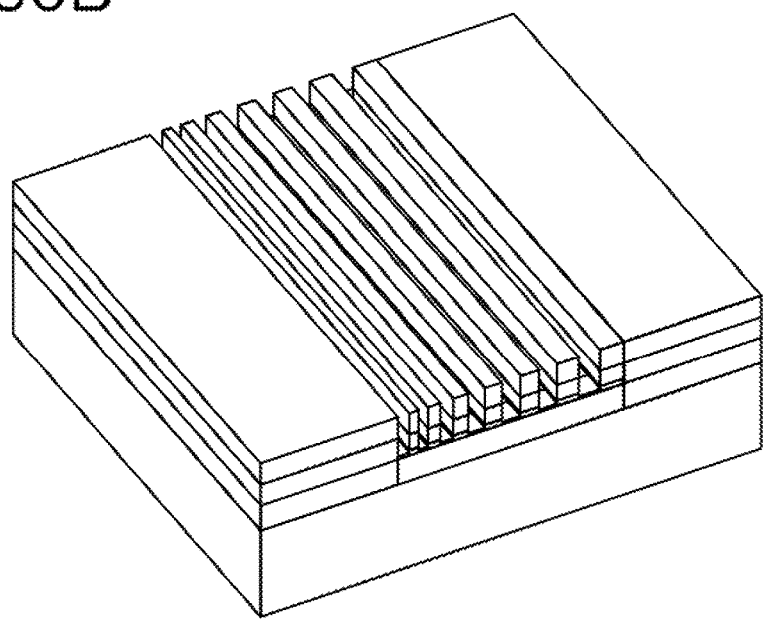

For example, the reactive ion etching with the ethane-hydrogen mixed gas is performed while using the diffraction grating formation mask 208, such that the GaInAsP layer 207 is penetrated and the InP layer 206 is etched to the middle thereof to a depth of about 15 nm as illustrated in FIG. 30B, and a diffraction grating pattern is thus transferred.

The upper limit of the coupling coefficient (at the duty ratio of about 50% in the first-order diffraction grating) in this structure is about 250 cm⁻¹.

Moreover, the reflection spectrum of this DBR is the reflection spectrum illustrated in FIG. 20.

Figure 31A:
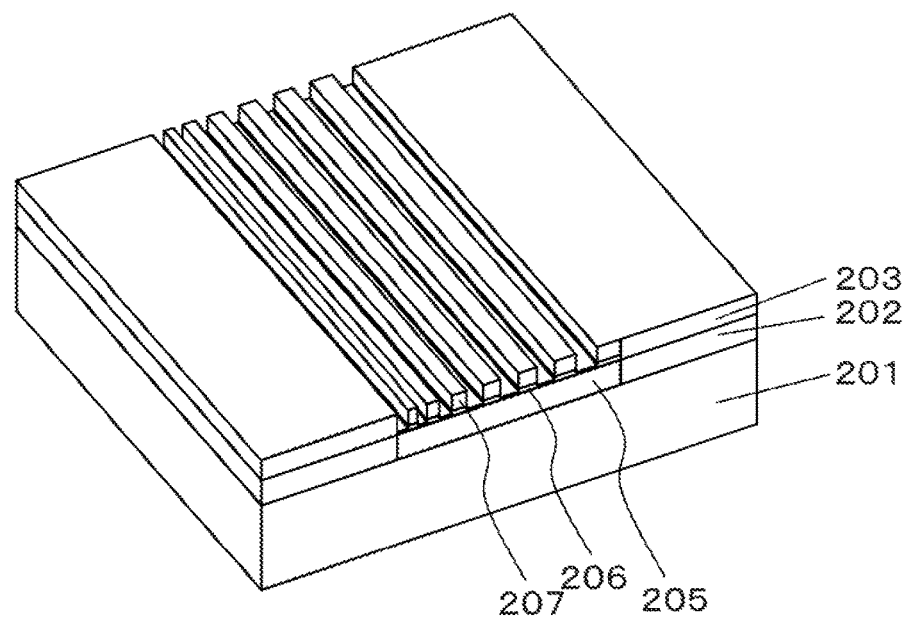
FIGS. 31A and 31B are schematic perspective diagrams for explaining the method of manufacturing the optical element in the second specific example of the embodiment.
Figure 31B:
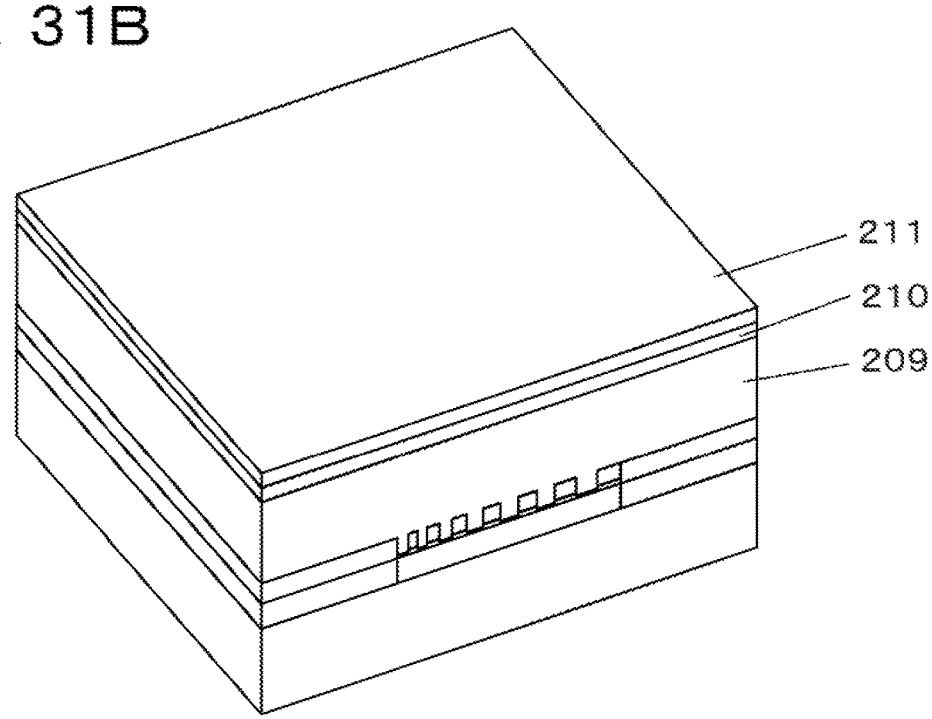

Next, as illustrated in FIG. 31A, the SiO₂ film 204 and the electron beam resist mask 208 are peeled off, then, as illustrated in FIG. 31B, a p-type InP cladding layer 209 doped with Zn and having a thickness of about 2.0 μm and a p-type GaInAs contact layer 210 doped with Zn and having a thickness of about 300 nm are sequentially stacked on the entire surface of the semiconductor crystal wafer by using, for example, the MOVPE method, and a SiO₂ film 211 is deposited to a thickness of about 400 nm by using the normal chemical vapor deposition method (CVD method).

Figure 32A:
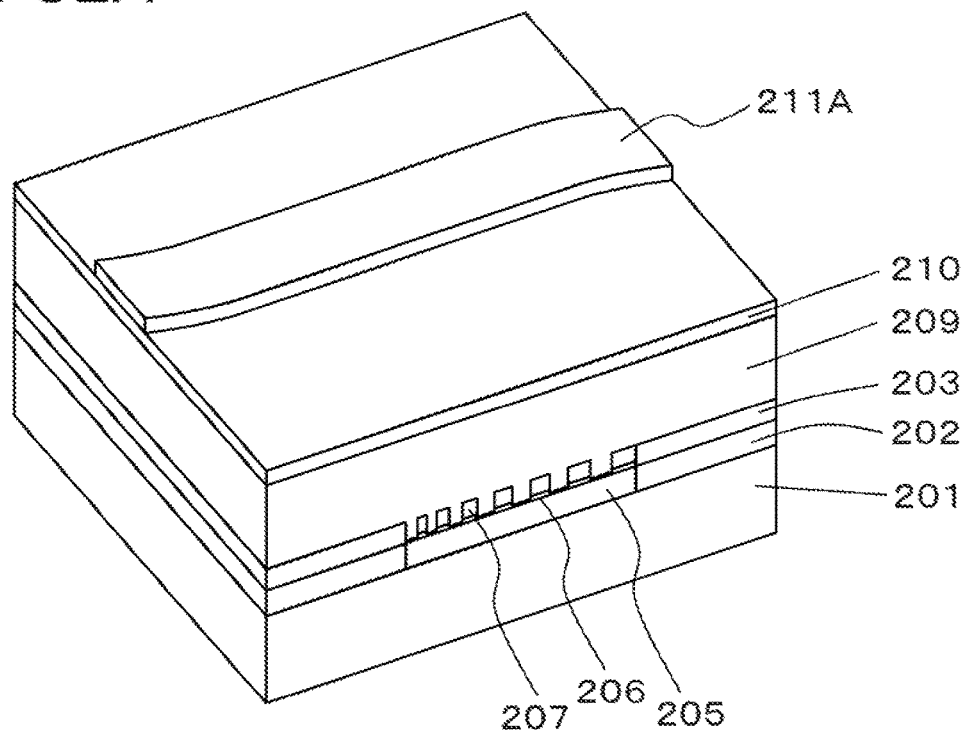
FIGS. 32A and 32B are schematic perspective diagrams for explaining the method of manufacturing the optical element in the second specific example of the embodiment.

Next, as illustrated in FIG. 32A, a waveguide etching mask 211A is formed by, for example, photolithography.

In this case, the width of the mask 211A is set such that the waveguide eventually has a width of about 1.5 μm.

Moreover, the mask 211A is formed such that portions of the waveguide on the SOA sides at both ends of the element are gradually curved toward output edges and eventually tilted by 7° with respect to the normal directions of the edges.

Figure 32B:
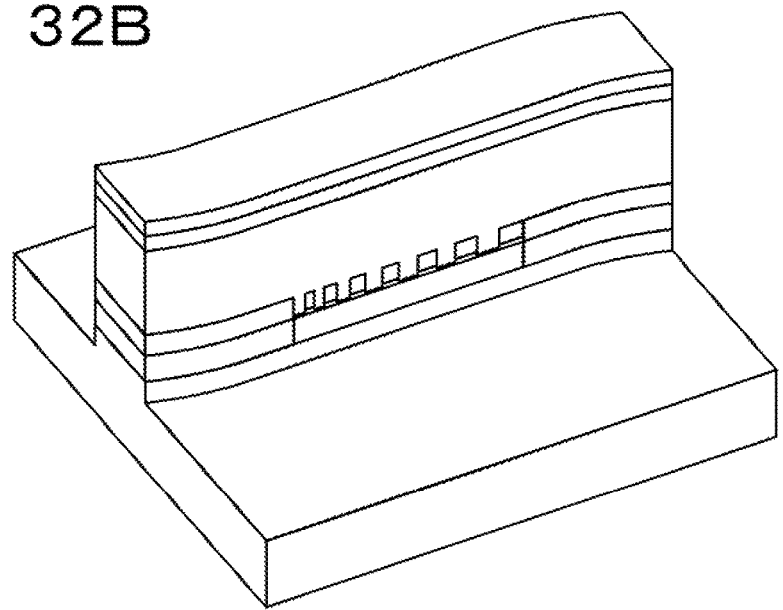

Thereafter, as illustrated in FIG. 32B, the semiconductor surface is etched by using, for example, the dry etching method and processed into a mesa stripe shape such that the InP substrate 201 is etched to a depth of about 0.7 μm.

Figure 33A:
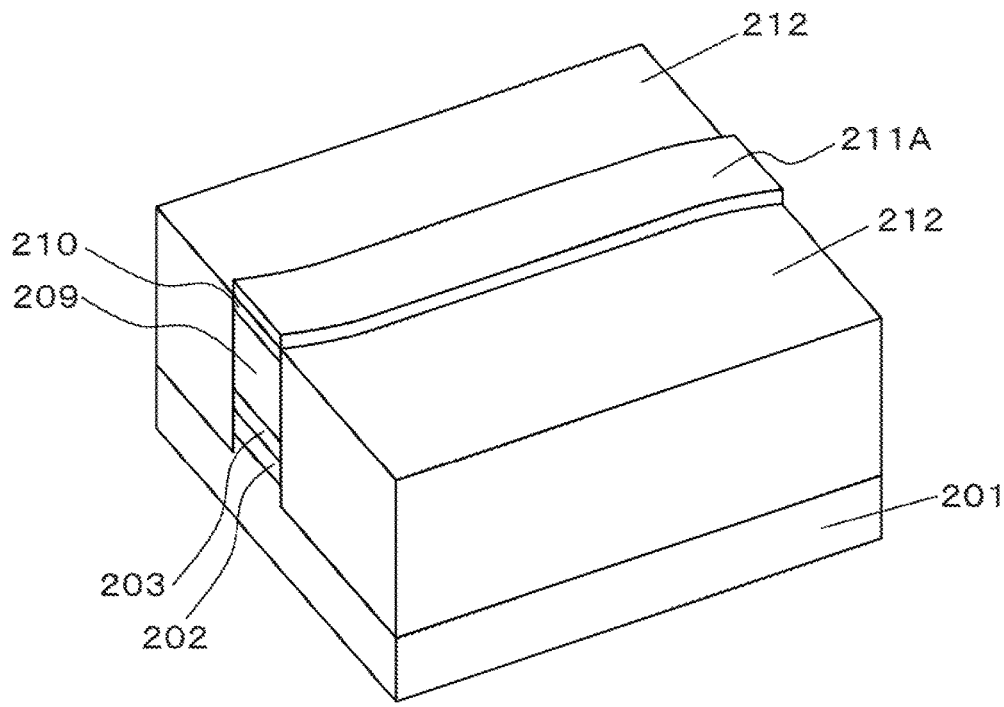
FIGS. 33A and 33B are schematic perspective diagrams for explaining the method of manufacturing the optical element in the second specific example of the embodiment.

As illustrated in FIG. 33A, a current blocking layer 212 made of Fe-doped semi-insulating InP is grown on both sides of the mesa stripe by using, for example, the MOVPE method.

Figure 33B:
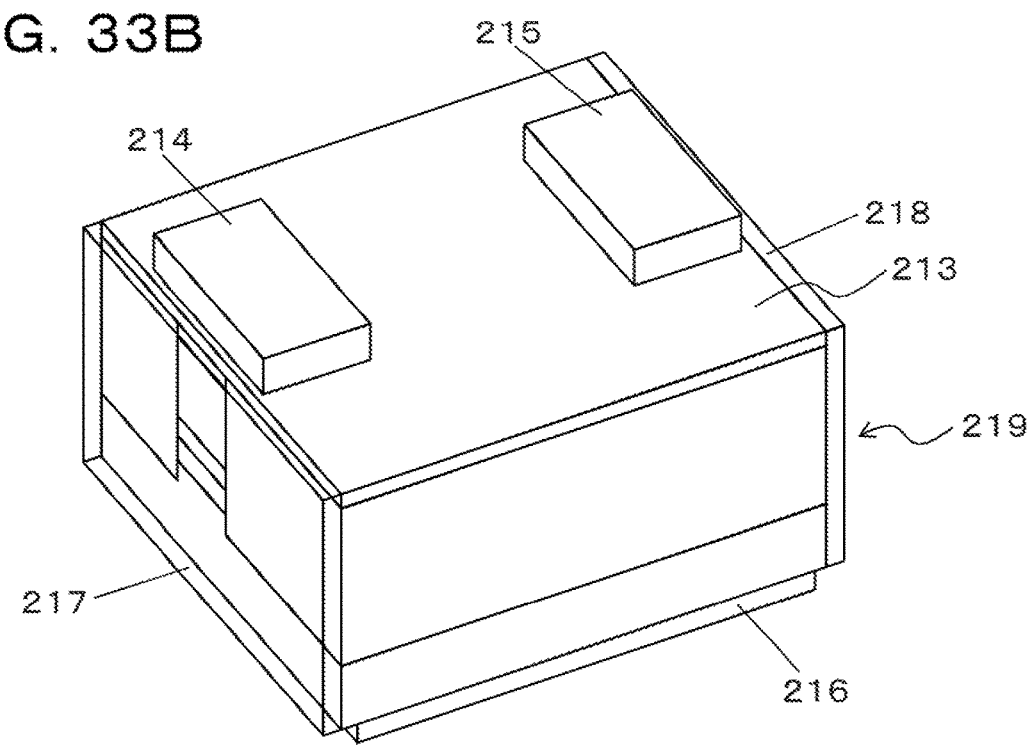

Thereafter, the etching mask 211A is removed with, for example, hydrofluoric acid and then, as illustrated in FIG. 33B, a passivation film 213 made of SiN is formed.

Next, the SiN layer 213 is removed by using normal photolithography and etching such that a window is opened in the SiN layer 213 only in two portions to be the semiconductor optical amplifiers, and then p-side electrodes 214, 215 and an n-side electrode 216 of the semiconductor optical amplifiers are formed.

Next, anti-reflection coatings 217, 218 are formed on both edges of the element, and a gain SOA element (optical element) 219 integrated with the DBR and the booster SOA is thereby finished.

Figure 34:
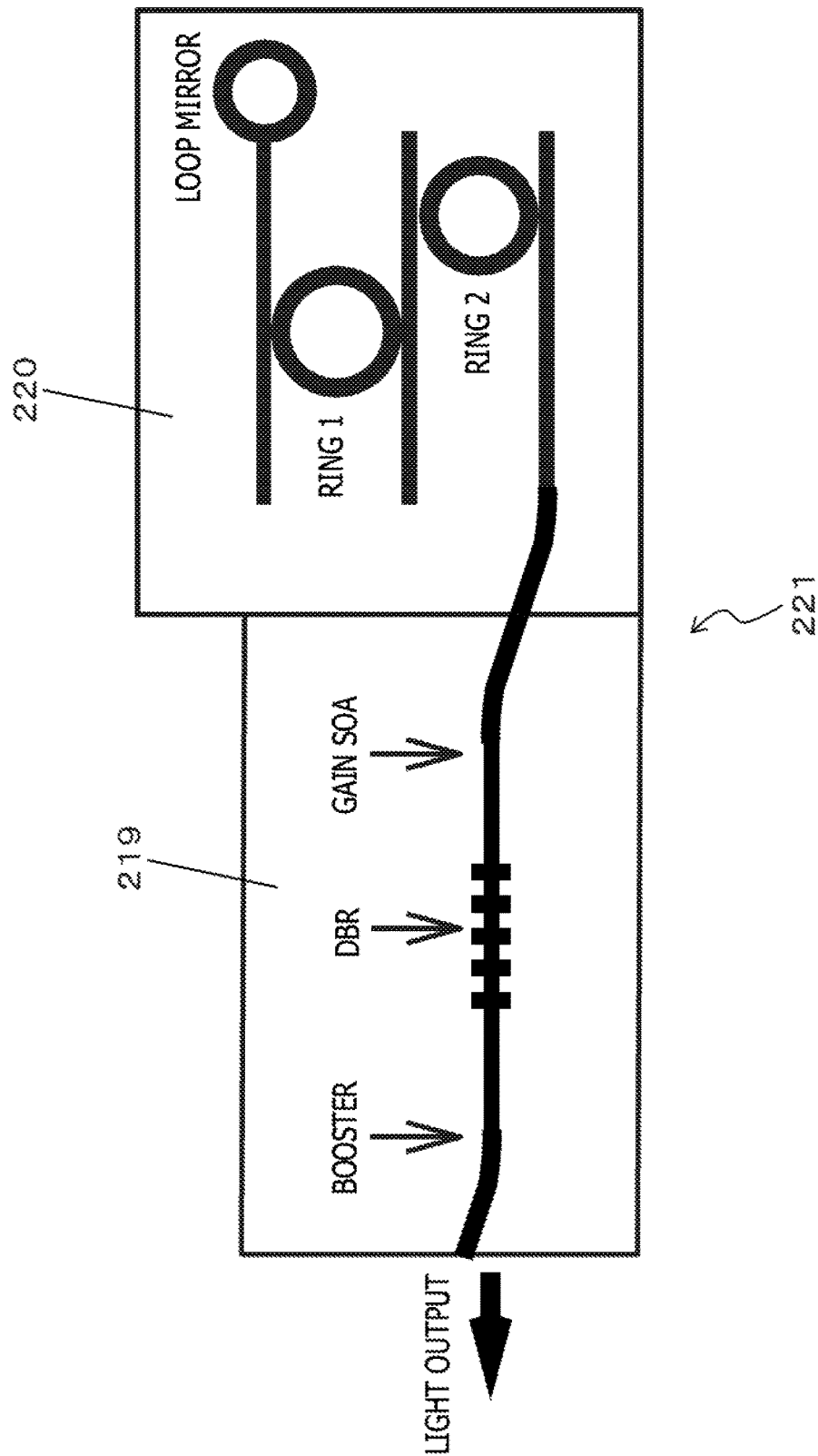
FIG. 34 is a schematic diagram for explaining a configuration of an optical module in the second specific example of the embodiment.

Moreover, as illustrated in FIG. 34, the element 219 and a wavelength filtering element 220 having two ring resonators (ring 1 and ring 2) and a loop mirror which are formed on a silicon substrate may be combined to obtain a wavelength tunable laser light source (optical module) 221.

By using the wavelength tunable laser light source 221, it is possible to obtain laser oscillation light having characteristics including the optical power of about 13 dBm and the spectrum line width of about 100 kHz, in the wavelength tunable band from about 1520 nm to about 1570 nm in the C band.

Next, an optical element and an optical module in a third specific example are described with reference to FIGS. 35A to 41.

Figure 35A:
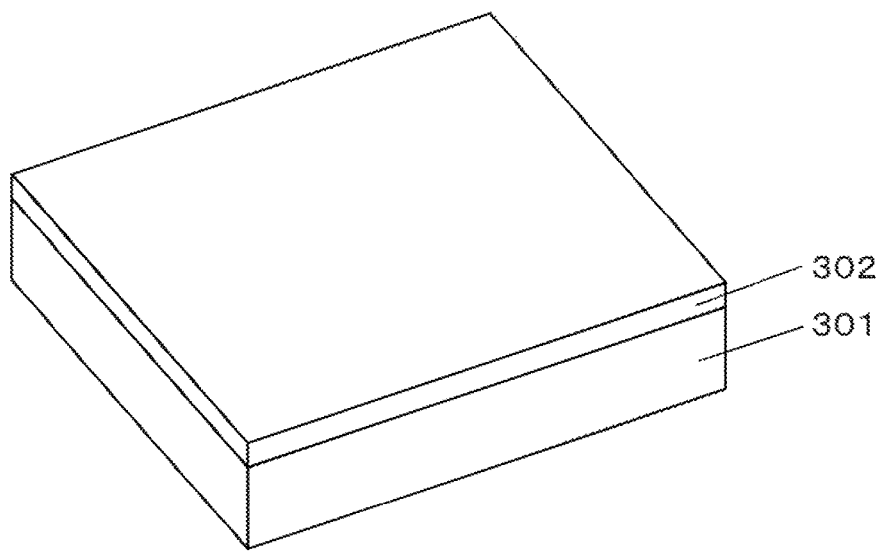
FIGS. 35A and 35B are schematic perspective diagrams for explaining a method of manufacturing an optical element in a third specific example of the embodiment.
Figure 35B:
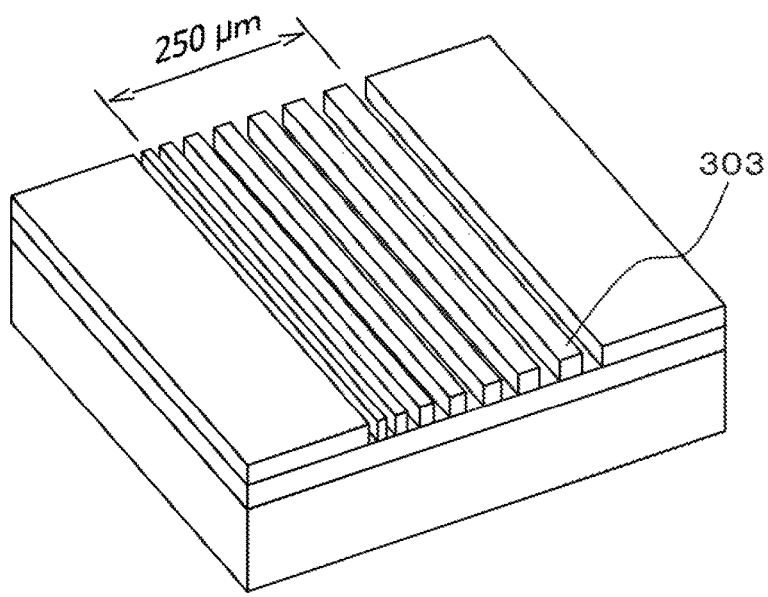

As illustrated in FIG. 35A, first, an undoped GaInAsP layer 302 having a composition wavelength of about 1.15 μm and a thickness of about 100 nm is grown on the surface of an n-type doped InP substrate 301 by using, for example, the metalorganic vapor phase epitaxy method (MOVPE method) and, as illustrated in FIG. 35B, an electron beam resist (ZEP520 manufactured by ZEON corporation) is applied onto the surface.

Next, a diffraction grating formation mask 303 is formed as illustrated in FIG. 35B by, for example, the electron beam exposure method.

In the diffraction grating formation mask 303, the length of the region of the distributed reflector (DBR mirror) is about 250 μm.

Moreover, the diffraction grating region is divided into 46 segments, and the length, the diffraction grating structure such as first order, second order, or pair, the duty ratio of the diffraction grating, the coupling coefficient, and the period in each of the segments is varied as depicted in the following table.

TABLE 3

| SEGMENT NUMBER | SEGMENT LENGTH (μm) | DIFFRACTION GRATING STRUCTURE TYPE | DUTY RATIO, ETC. | COUPLING COEFFICIENT (cm$^{-1}$) | DIFFRACTION GRATING PERIOD (nm) |
|---|---|---|---|---|---|
| 1 | 4.671 | SECOND-ORDER DIFFRACTION GRATING | DUTY RATIO 50.1% | 0.3 | 392.000 |
| 2 | 4.679 | SECOND-ORDER DIFFRACTION GRATING | DUTY RATIO 50.2% | 0.7 | 392.444 |
| 3 | 4.686 | SECOND-ORDER DIFFRACTION GRATING | DUTY RATIO 50.3% | 1.6 | 392.889 |
| 4 | 4.694 | SECOND-ORDER DIFFRACTION GRATING | DUTY RATIO 50.7% | 3.6 | 393.333 |
| 5 | 4.702 | SECOND-ORDER DIFFRACTION GRATING | DUTY RATIO 51.6% | 7.8 | 393.778 |
| 6 | 4.710 | SECOND-ORDER DIFFRACTION GRATING | DUTY RATIO 53.5% | 16.6 | 394.222 |
| 7 | 4.717 | SECOND-ORDER DIFFRACTION GRATING | DUTY RATIO 57% | 33.6 | 394.667 |
| 8 | 4.725 | SECOND-ORDER DIFFRACTION GRATING | DUTY RATIO 61.9% | 62.0 | 395.111 |
| 9 | 4.733 | SECOND-ORDER DIFFRACTION GRATING | DUTY RATIO 73.9% | 100.0 | 395.556 |
| 10 | 4.741 | PAIR DIFFRACTION GRATING | DISTANCE BETWEEN CENTERS = 123.56 nm | 138.0 | 198.000 |
| 11 | 4.749 | PAIR DIFFRACTION GRATING | DISTANCE BETWEEN CENTERS = 144.93 nm | 166.4 | 198.222 |
| 12 | 4.757 | PAIR DIFFRACTION GRATING | DISTANCE BETWEEN CENTERS = 161.49 nm | 183.4 | 198.444 |
| 13 | 4.764 | PAIR DIFFRACTION GRATING | DISTANCE BETWEEN CENTERS = 173.47 nm | 192.2 | 198.667 |
| 14 | 4.772 | PAIR DIFFRACTION GRATING | DISTANCE BETWEEN CENTERS = 181.86 nm | 196.4 | 198.889 |
| 15 | 4.780 | FIRST-ORDER DIFFRACTION GRATING | DUTY RATIO 52.9% | 198.4 | 199.111 |
| 16 | 4.788 | FIRST-ORDER DIFFRACTION GRATING | DUTY RATIO 51.6% | 199.3 | 199.333 |
| 17 | 4.796 | FIRST-ORDER DIFFRACTION GRATING | DUTY RATIO 51% | 199.7 | 199.556 |
| 18 | 4.804 | FIRST-ORDER DIFFRACTION GRATING | DUTY RATIO 50.7% | 199.9 | 199.778 |
| 19 | 4.812 | FIRST-ORDER DIFFRACTION GRATING | DUTY RATIO 50.6% | 199.9 | 200.000 |
| 20 | 4.820 | FIRST-ORDER DIFFRACTION GRATING | DUTY RATIO 50.5% | 200.0 | 200.222 |
| 21 | 4.836 | FIRST-ORDER DIFFRACTION GRATING | DUTY RATIO 50.5% | 200.0 | 200.444 |
| 22 | 4.836 | FIRST-ORDER DIFFRACTION GRATING | DUTY RATIO 50.5% | 200.0 | 200.667 |
| 23 | 4.844 | FIRST-ORDER DIFFRACTION GRATING | DUTY RATIO 50.5% | 200.0 | 200.889 |
| 24 | 4.852 | FIRST-ORDER DIFFRACTION GRATING | DUTY RATIO 50.5% | 200.0 | 201.111 |
| 25 | 4.860 | FIRST-ORDER DIFFRACTION GRATING | DUTY RATIO 50.5% | 200.0 | 201.333 |
| 26 | 4.869 | FIRST-ORDER DIFFRACTION GRATING | DUTY RATIO 50.5% | 200.0 | 201.556 |
| 27 | 4.877 | FIRST-ORDER DIFFRACTION GRATING | DUTY RATIO 50.6% | 199.9 | 201.778 |
| 28 | 4.885 | FIRST-ORDER DIFFRACTION GRATING | DUTY RATIO 50.7% | 199.9 | 202.000 |
| 29 | 4.893 | FIRST-ORDER DIFFRACTION GRATING | DUTY RATIO 51% | 199.7 | 202.222 |
| 30 | 4.901 | FIRST-ORDER DIFFRACTION GRATING | DUTY RATIO 51.6% | 199.3 | 202.444 |
| 31 | 4.910 | FIRST-ORDER DIFFRACTION GRATING | DUTY RATIO 52.9% | 198.4 | 202.667 |
| 32 | 4.918 | PAIR DIFFRACTION GRATING | DISTANCE BETWEEN CENTERS = 185.51 nm | 196.4 | 202.889 |
| 33 | 4.926 | PAIR DIFFRACTION GRATING | DISTANCE BETWEEN CENTERS = 177.35 nm | 192.2 | 203.111 |
| 34 | 4.934 | PAIR DIFFRACTION GRATING | DISTANCE BETWEEN CENTERS = 165.46 nm | 183.4 | 203.333 |
| 35 | 4.943 | PAIR DIFFRACTION GRATING | DISTANCE BETWEEN CENTERS = 148.83 nm | 166.4 | 203.556 |
| 36 | 4.951 | PAIR DIFFRACTION GRATING | DISTANCE BETWEEN CENTERS = 127.17 nm | 138.0 | 203.778 |
| 37 | 4.960 | SECOND-ORDER DIFFRACTION GRATING | DUTY RATIO 73.9% | 100.0 | 408.000 |
| 38 | 4.968 | SECOND-ORDER DIFFRACTION GRATING | DUTY RATIO 61.9% | 62.0 | 408.444 |
| 39 | 4.976 | SECOND-ORDER DIFFRACTION GRATING | DUTY RATIO 57% | 33.6 | 408.889 |
| 40 | 4.985 | SECOND-ORDER DIFFRACTION GRATING | DUTY RATIO 53.5% | 16.6 | 409.333 |
| 41 | 4.993 | SECOND-ORDER DIFFRACTION GRATING | DUTY RATIO 51.6% | 7.8 | 409.778 |
| 42 | 5.002 | SECOND-ORDER DIFFRACTION GRATING | DUTY RATIO 50.7% | 3.6 | 410.222 |
| 43 | 5.010 | SECOND-ORDER DIFFRACTION GRATING | DUTY RATIO 50.3% | 1.6 | 410.667 |
| 44 | 5.019 | SECOND-ORDER DIFFRACTION GRATING | DUTY RATIO 50.2% | 0.7 | 411.111 |
| 45 | 5.027 | SECOND-ORDER DIFFRACTION GRATING | DUTY RATIO 50.1% | 0.3 | 411.556 |
| 46 | 5.036 | SECOND-ORDER DIFFRACTION GRATING | DUTY RATIO 50% | 0.1 | 412.000 |

Figure 36A:
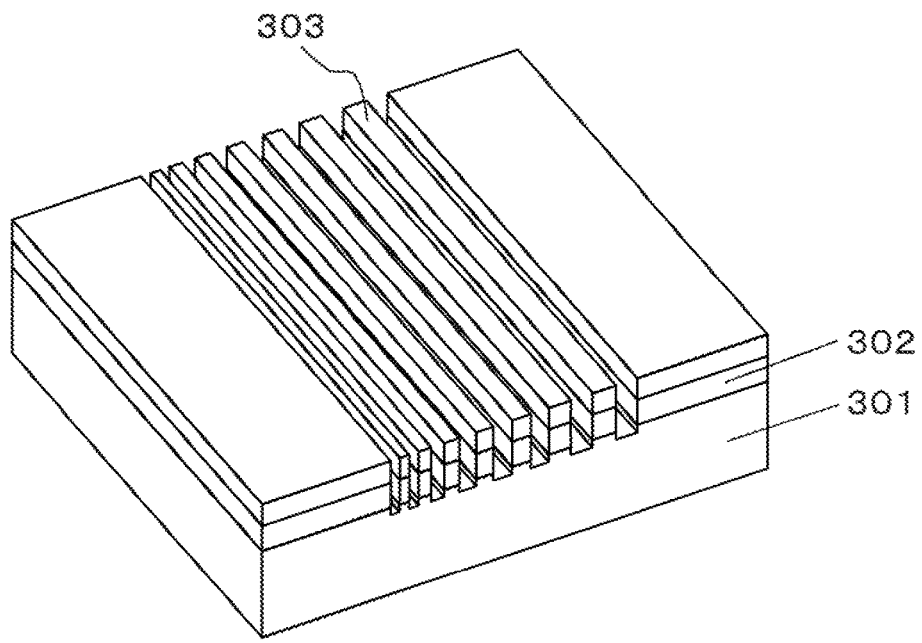
FIGS. 36A and 36B are schematic perspective diagrams for explaining the method of manufacturing the optical element in the third specific example of the embodiment.

For example, the reactive ion etching with the ethane-hydrogen mixed gas is performed while using the diffraction grating formation mask, such that the GaInAsP layer 302 is penetrated and the InP layer 301 is etched from the surface to a depth of about 15 nm as illustrated in FIG. 36A, and a diffraction grating pattern is thus transferred.

Figure 36B:
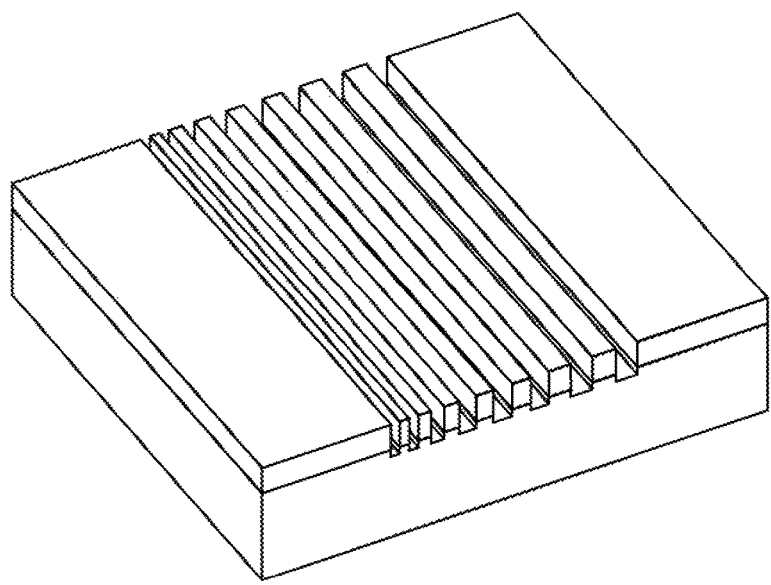
Figure 37A:
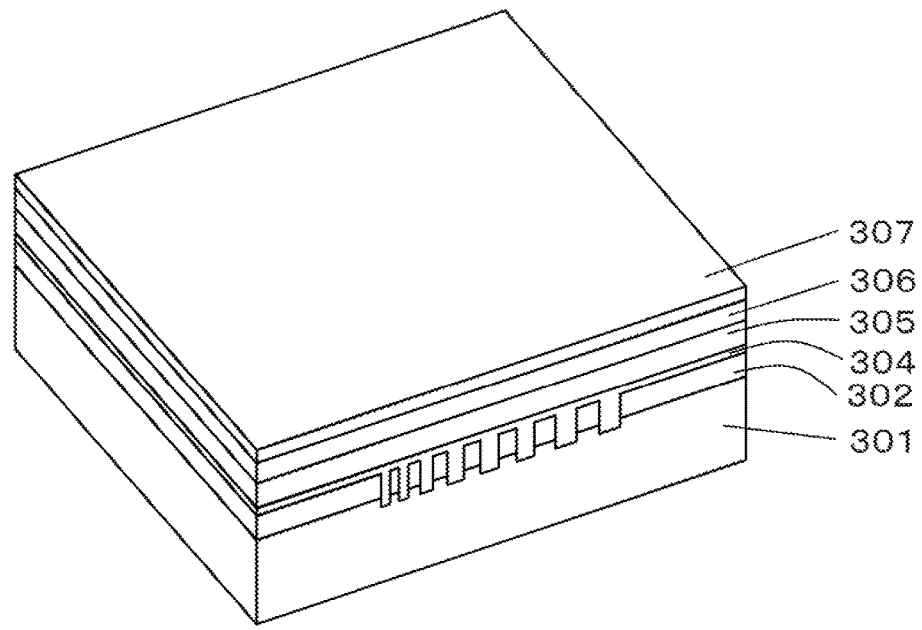
FIGS. 37A and 37B are schematic perspective diagrams for explaining the method of manufacturing the optical element in the third specific example of the embodiment.

Then, as illustrated in FIG. 36B, the diffraction grating formation mask 303 is removed. Thereafter, as illustrated in FIG. 37A, an n-type doped InP layer 304 is grown by using, for example, the MOVPE method to embed the diffraction grating and then is further grown to have a thickness of about 50 nm in a portion without the diffraction grating. Subsequently, an optical guide layer 305 and a p-type doped InP cladding layer 306 having a thickness of about 150 nm are sequentially crystal-grown and then a SiO$_2$ film 307 is deposited to a thickness of about 400 nm by using the normal chemical vapor deposition method (CVD method).

The upper limit of the coupling coefficient (at the duty ratio of about 50% in the first-order diffraction grating) in this structure is about 200 cm$^{-1}$.

Figure 40:
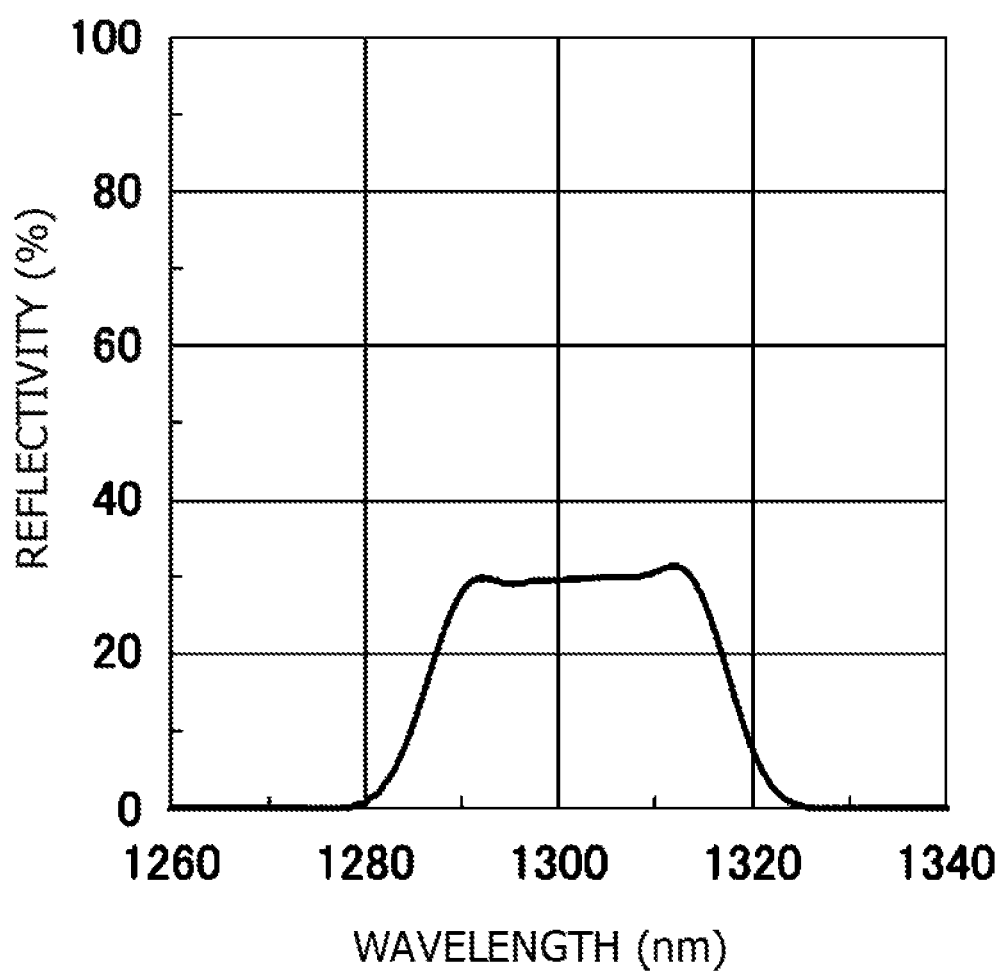
FIG. 40 is a diagram illustrating a reflection characteristic of a DBR mirror included in the optical element in the third specific example of the embodiment.

Moreover, the reflection spectrum of this DBR is the reflection spectrum illustrated in FIG. 40.

In this example, the optical guide layer 305 includes an undoped AlGaInAs layer having a thickness of about 200 nm, and has a composition wavelength of about 1150 nm.

Figure 37B:
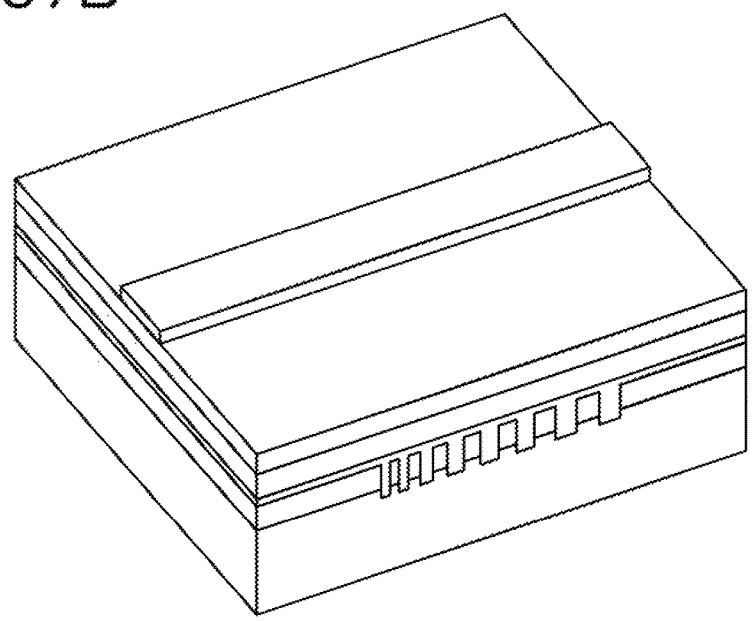

Next, as illustrated in FIG. 37B, the SiO$_2$ film 307 is processed by using, for example, photolithography such that a portion to be a semiconductor waveguide region eventually has a width of about 1.3 μm, and an etching mask is thus formed.

Figure 38A:
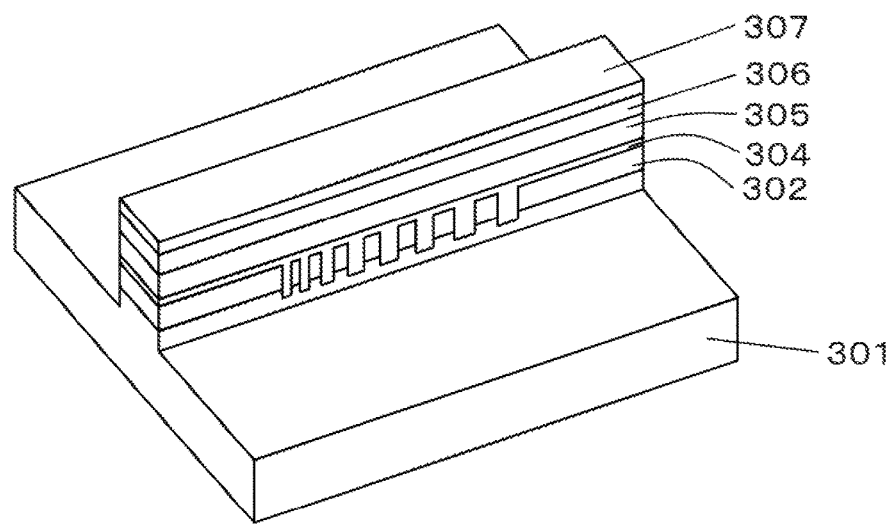
FIGS. 38A and 38B are schematic perspective diagrams for explaining the method of manufacturing the optical element in the third specific example of the embodiment.

Thereafter, as illustrated in FIG. 38A, the semiconductor surface is etched by using, for example, the dry etching method and processed into a mesa stripe shape such that the InP substrate 301 is etched to a depth of about 0.7 µm.

Figure 38B:
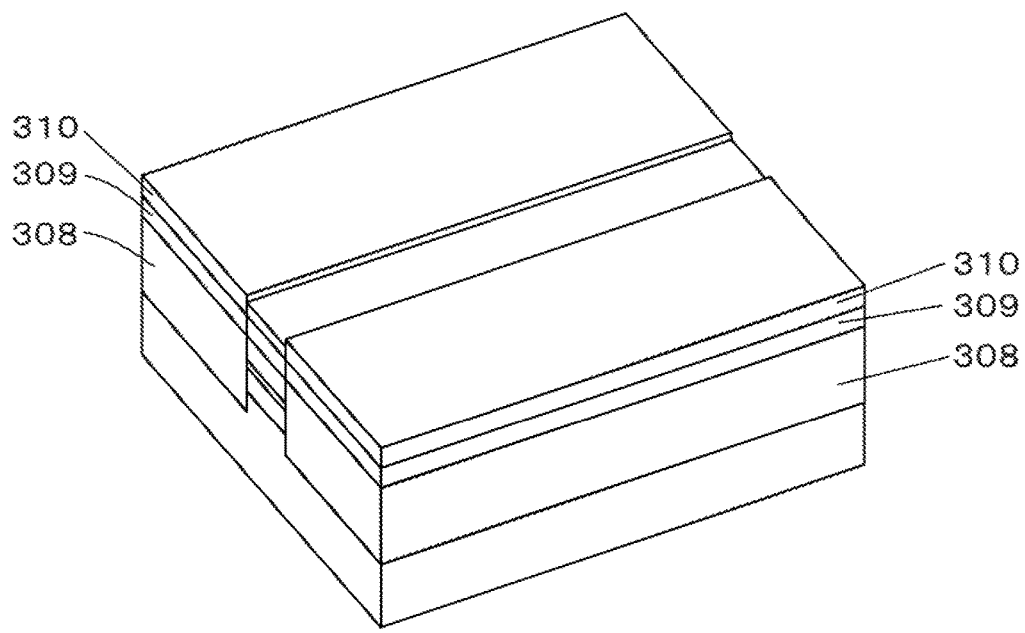

As illustrated in FIG. 38B, a pnpn thyristor structure current blocking layer including a p-type doped InP layer 308, an n-type doped InP layer 309, and a p-type doped InP layer 310 which form a current block layer together with the InP substrate 301 is grown on both sides of the mesa stripe by using, for example, the MOVPE method.

Figure 39A:
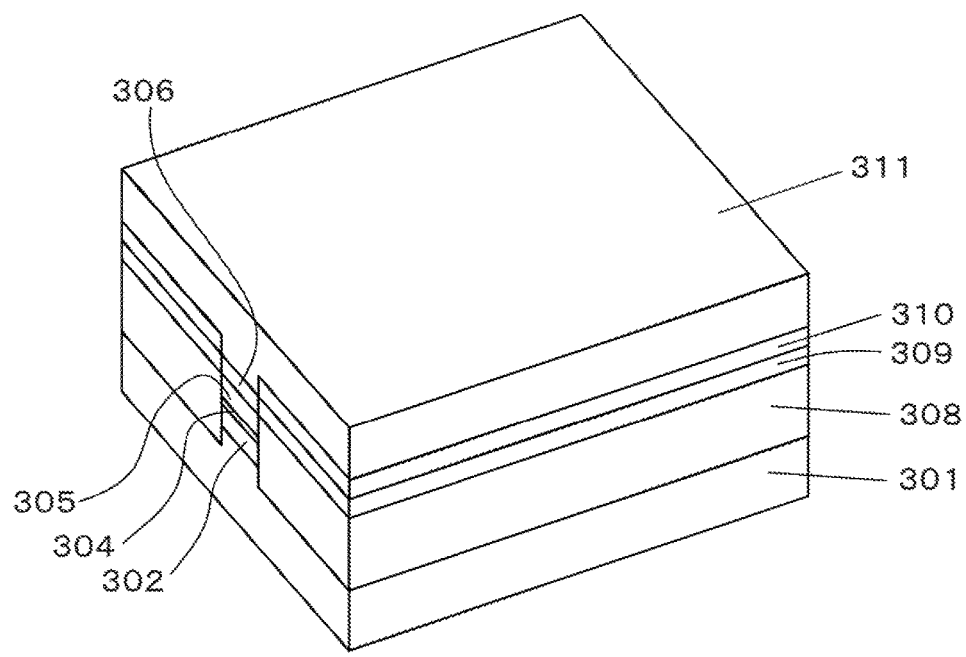
FIGS. 39A and 39B are schematic perspective diagrams for explaining the method of manufacturing the optical element in the third specific example of the embodiment.

Thereafter, the etching mask 307 is removed with, for example, hydrofluoric acid and then, as illustrated in FIG. 39A, a p-type doped InP cladding layer 311 having a thickness of about 2.5 µm is grown on the entire surface by using, for example, the MOVPE method.

Figure 39B:
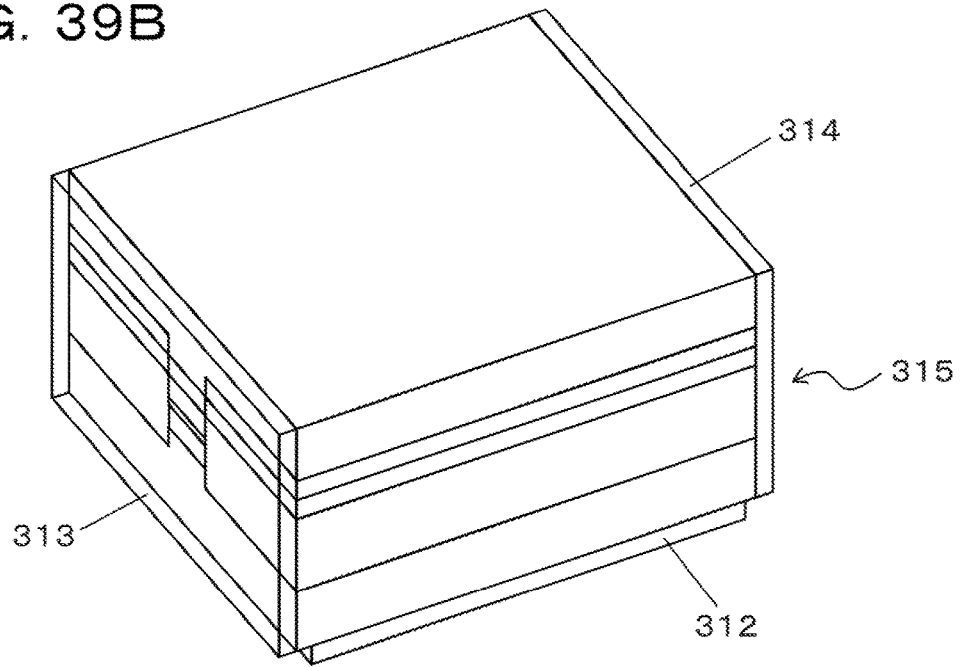

Next, as illustrated in FIG. 39B, a temporary electrode 312 for bonding to a platform is formed. Then, anti-reflection coatings 313, 314 are formed on both edges of the element, and a wavelength selection element 315 is thereby finished.

Figure 41:
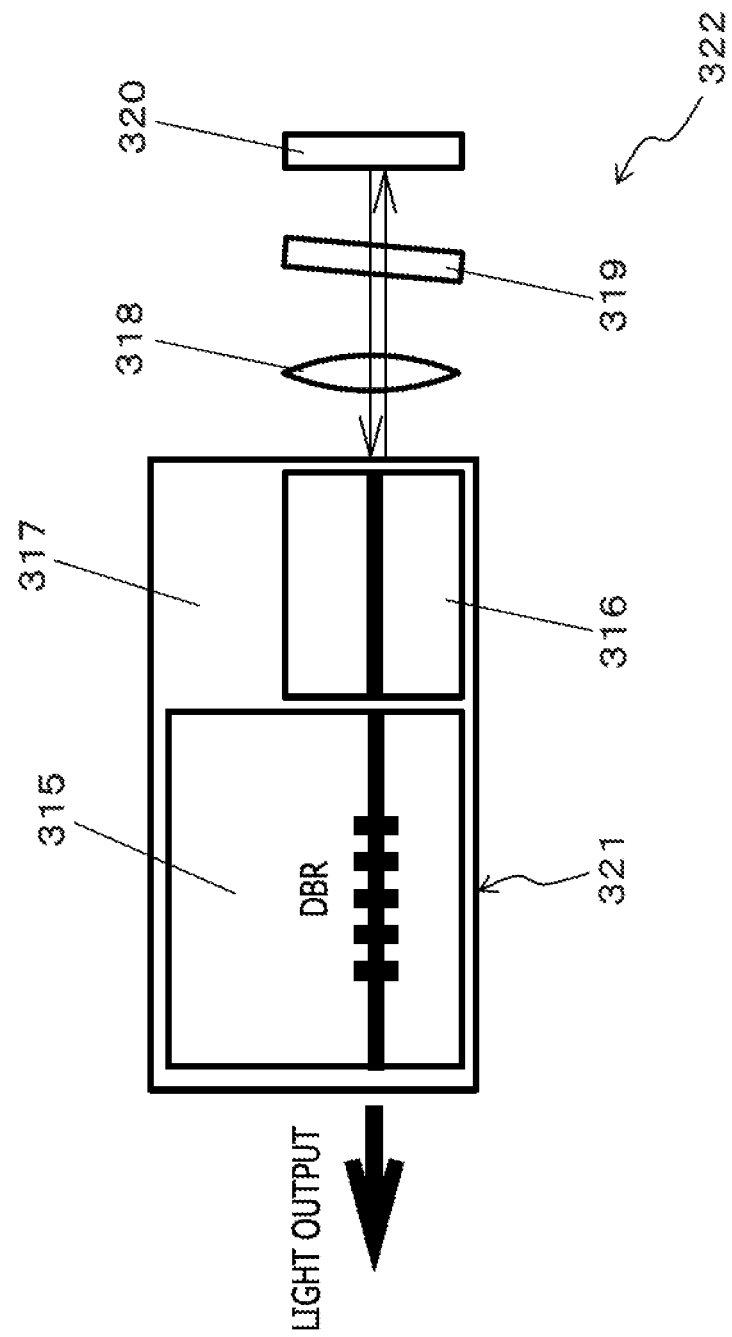
FIG. 41 is a schematic diagram for explaining a configuration of an optical module in the third specific example of the embodiment.

Moreover, as illustrated in FIG. 41, an optical element 321 in which the element 315 and a quantum dot SOA 316 having both edges subjected to anti-reflection coating are hybrid-packaged on a Si platform 317 may be combined with a lens 318, an etalon 319 having peaks at intervals of, for example, 800 GHz, and a total reflection mirror 320 to obtain a multi-wavelength simultaneous oscillation laser light source 322.

By using the multi-wavelength simultaneous oscillation laser light source 322, it is possible to obtain laser oscillation light of four wavelengths used in LAN-WDM.

Accordingly, the optical elements and the optical modules in the embodiment have such effects that it is possible to easily form the diffraction grating forming the distributed Bragg reflector 1 and obtain the reflection characteristic as designed.

Note that, the aforementioned first specific example of the embodiment is a specific example which uses no pair diffraction gratings and in which the fabrication of the optical element and the optical module is easier than the case of using the pair diffraction grating as in the second specific example. However, when the occurrence of the effective phase shift due to variation in the duty ratio and discontinuity of the duty ratio adversely affects the flatness of the spectrum and this becomes a problem, it is preferable to employ a structure using the pair diffraction gratings as in the second specific example in which the variation in the duty ratio and the discontinuity of the duty ratio are suppressed.

Moreover, in the aforementioned first specific example, the second specific example, and the third specific example of the embodiment, a waveguide structure in which the output end of the waveguide of the wavelength filter element or the wavelength selection element is orthogonal to the edge may be used. Moreover, a waveguide structure in which the waveguide is bent in the middle and then extended obliquely may be used.

Furthermore, in order to improve optical coupling with other elements, a spot-size converter in which the width and thickness of the waveguide are gradually varied may be integrated with an edge portion of the waveguide.

Moreover, although the GaInAsP based semiconductor material is used for the active region of the semiconductor optical amplifier in the aforementioned first specific example and the second specific example of the embodiment, an AlGaInAs based semiconductor material may be used.

Furthermore, the active layer may be formed of a bulk type or quantum dot type semiconductor, instead of the quantum well type semiconductor, and it is possible to obtain similar effects also in this case.

Moreover, although the AlGaInAs based semiconductor material is used in the aforementioned third specific example of the embodiment, a GaInAsP based semiconductor material may be used.

Furthermore, although the structure without the active region is employed in the third specific example, a structure with the active region, that is, a structure in which the active region is integrated may be employed as in the first specific example and the second specific example.

Moreover, although the aforementioned first specific example, the second specific example, and the third specific example of the embodiment are all fabricated on the InP substrate, these examples may be fabricated on another substrate such as a GaAs substrate, for example.

Furthermore, for example, when the optical amplifying function is unnecessary, the materials forming the element are not limited to compound semiconductors, and the element may be formed of organic and inorganic substances. The present disclosure is generally applicable to devices in which a diffraction grating is loaded near a waveguide.

Moreover, in the aforementioned specific examples of the embodiment, the element is formed on the substrate having the n-type conductivity. However, it is possible to use a substrate having a p-type conductivity and use a structure formed with the opposite conductivity to that in the aforementioned specific examples of the embodiment. It is possible to obtain similar effects also in this case.

Furthermore, it is apparent that the similar effects are obtained by fabricating the element on a semi-insulating substrate, for example, by performing fabrication by a method of adhering the element onto a silicon substrate.

Moreover, in the aforementioned first specific example and the second specific example of the embodiment, the embedding structure is the current blocking structure having the current blocking embedding structure using the semi-insulating material. However, the current blocking structure having the pnpn thyristor structure as in the aforementioned third specific example of the embodiment may be applied to the embedding structure.

Furthermore, the current blocking structure having the current blocking embedding structure using the semi-insulating material may be used as the embedding structure in the aforementioned third specific example of the embodiment.

Moreover, although an embedded waveguide structure is described in the aforementioned specific examples of the embodiment, the present disclosure is applicable to a laser with a different waveguide structure such as a ridge type waveguide.

Furthermore, regarding the structure of the diffraction grating, although the embedded diffraction grating structure is described in the aforementioned specific examples of the embodiment, the present disclosure is also applicable to a surface diffraction grating structure.

Moreover, although the diffraction grating is loaded on the opposite side of the waveguide layer to the substrate in the aforementioned first specific example and the second specific example, the diffraction grating structure may be loaded on the substrate side of the waveguide layer as in the aforementioned third specific example of the embodiment, and it is possible to obtain similar effects also in this case.

Furthermore, although the diffraction grating structure is loaded on the substrate side of the waveguide layer in the aforementioned third specific example of the embodiment, the diffraction grating structure may loaded on the opposite side of the waveguide layer to the substrate as in the aforementioned first specific example and the second specific example of the embodiment, and it is possible to obtain similar effects also in this case.

Moreover, in the aforementioned specific examples of the embodiment, description is given by using the example of the case where the region is divided into segments and the diffraction grating period is varied stepwise. However, the diffraction grating period may be gradually (continuously) varied, and it is possible to obtain similar effects also in this case. Moreover, the number of divided segments is not limited to 46 and may be changed depending on the usage and design.

Furthermore, the application ranges of the first-order diffraction grating, the pair diffraction gratings, and the second-order diffraction gratings are not limited to those described in the aforementioned specific examples of the embodiment, and there is a degree of freedom depending on the usage and design.

Figure 42:
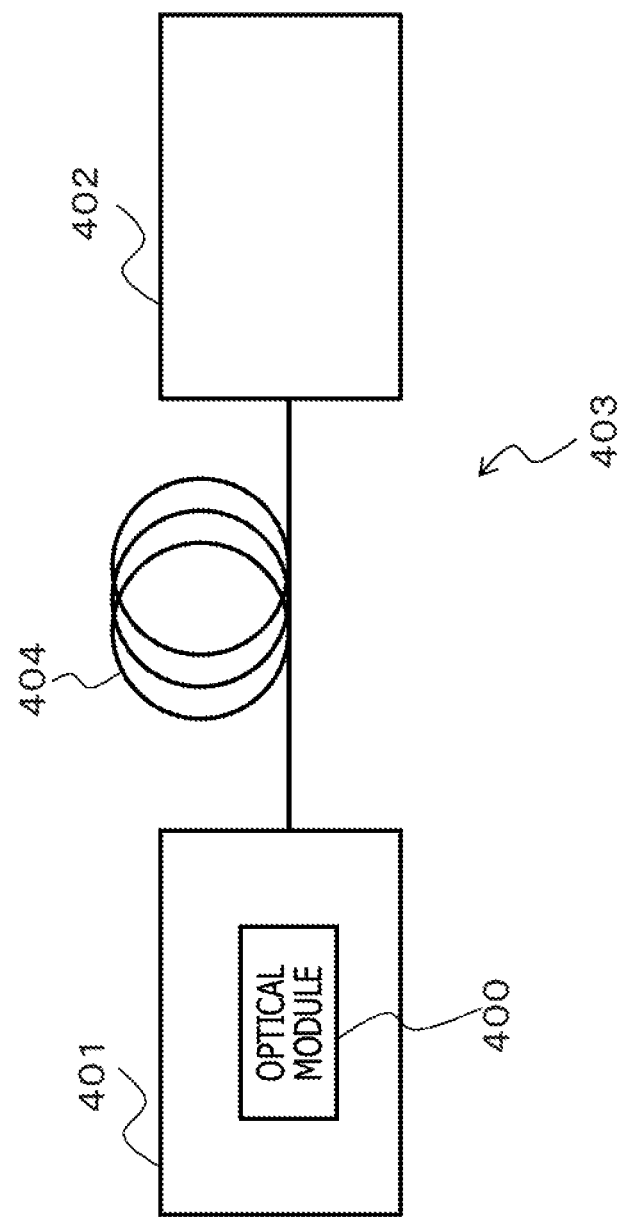
FIG. 42 is a schematic diagram for explaining a configuration of an optical transmission system in the embodiment.

Moreover, as illustrated in FIG. 42, for example, it is possible to form a transmission device 401 for optical communication which includes an optical module 400 configured as in any of the aforementioned embodiment and the specific examples.

Furthermore, it is possible to form an optical transmission system 403 by combining the transmission device 401 configured as described above with a reception device 402. Specifically, it is possible to achieve the optical communication system 403 including the aforementioned transmission device 401 and the reception device 402 connected to the transmission device 401 via an optical transmission passage (for example, an optical fiber transmission passage) 404.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An optical element comprising:
a distributed Bragg reflector, wherein the distributed Bragg reflector includes
first diffraction gratings formed in a center portion of the distributed Bragg reflector and have a first-order period and to have a duty ratio at which a coupling coefficient takes a maximum value,
pair diffraction gratings formed in both end portions of the first diffraction gratings and have the first-order period, and
second diffraction gratings formed in both end regions of the distributed Bragg reflector and have a second-order period having a coupling coefficient smaller than the coupling coefficient of the first diffraction gratings, wherein a distance between adjacent two of paired diffraction gratings among the pair diffraction gratings are varied such that a coupling coefficient decreases in directions from the first diffraction gratings toward the second diffraction gratings.

2. The optical element according to claim 1, wherein the coupling coefficient in the second diffraction gratings is equal to or less than 50% of a maximum value of the coupling coefficient in the first diffraction gratings.

3. The optical element according to claim 1, wherein the first diffraction gratings are designed such that the coupling coefficient decreases in directions from a center toward the both end portions, and
the second diffraction gratings are designed such that the coupling coefficient decreases in both the end regions in directions away from the center portion.

4. The optical element according to claim 3, wherein the first diffraction gratings are designed such that the coupling coefficient decreases from a maximum value to 50% of the maximum value, and
the second diffraction gratings are designed such that the coupling coefficient decreases from 50% of the maximum value of the coupling coefficient in the first diffraction gratings to zero.

5. The optical element according to claim 4, wherein the first diffraction gratings are diffraction gratings of the first-order period in which a duty ratio is varied from 50% to 75% such that the coupling coefficient decreases from the maximum value to 50% of the maximum value, and
the second diffraction gratings are diffraction gratings of the second-order period in which a duty ratio is varied from 75% to 50% such that the coupling coefficient decreases from 50% of the maximum value of the coupling coefficient in the first diffraction grating to zero.

6. The optical element according to claim 1, wherein the periods in the first diffraction gratings and the second diffraction gratings are varied to become longer or to become shorter in a light propagation direction.

7. The optical element according to claim 6, wherein the periods in the first diffraction gratings and the second diffraction gratings are continuously varied.

8. The optical element according to claim 6, wherein the periods in the first diffraction gratings and the second diffraction gratings are varied stepwise.

9. An optical module comprising:
an optical element including a distributed Bragg reflector, wherein the distributed Bragg reflector includes
first diffraction gratings formed in a center portion of the distributed Bragg reflector and have a first-order period and to have a duty ratio at which a coupling coefficient takes a maximum value,
pair diffraction gratings formed in both end portions of the first diffraction gratings and have the first-order period, and
second diffraction gratings formed in both end regions of the distributed Bragg reflector and have a second-order period having a coupling coefficient smaller than the coupling coefficient of the first diffraction gratings, wherein a distance between adjacent two of paired diffraction gratings among the pair diffraction gratings are varied such that a coupling coefficient decreases in directions from the first diffraction gratings toward the second diffraction gratings.

10. An optical transmission system, comprising:
a transmission device; and
a reception device connected to the transmission device via an optical transmission path, wherein the transmission device includes an optical module,
the optical module includes an optical element having a distributed Braggs reflector, and the distributed Bragg reflector includes
- first diffraction gratings formed in a center portion of the distributed Bragg reflector and have a first-order period and to have a duty ratio at which a coupling coefficient takes a maximum value,
- pair diffraction gratings formed in both end portions of the first diffraction gratings and have the first-order period, and
- second diffraction gratings formed in both end regions of the distributed Bragg reflector and have a second-order period having a coupling coefficient smaller than the coupling coefficient of the first diffraction gratings, wherein a distance between adjacent two of paired diffraction gratings among the pair diffraction gratings are varied such that a coupling coefficient decreases in directions from the first diffraction gratings toward the second diffraction gratings.

\* \* \* \* \*